(12) United States Patent
Sugioka et al.

(10) Patent No.: US 7,723,407 B2
(45) Date of Patent: May 25, 2010

(54) RESIN COMPOSITION, METHOD OF ITS COMPOSITION, AND CURED FORMULATION

(75) Inventors: Takuo Sugioka, Suita (JP); Yasunori Tsujino, Takatsuki (JP)

(73) Assignee: Nippon Shokubai Co., Ltd., Osaka-shi (JP)

( * ) Notice: Subject to any disclaimer, the term of this patent is extended or adjusted under 35 U.S.C. 154(b) by 237 days.

(21) Appl. No.: 11/197,587

(22) Filed: Aug. 5, 2005

(65) Prior Publication Data

US 2006/0029811 A1    Feb. 9, 2006

(30) Foreign Application Priority Data

Aug. 6, 2004    (JP)    ............................. 2004-231254
Mar. 17, 2005    (JP)    ............................. 2005-077734

(51) Int. Cl.
*H01L 21/00* (2006.01)
*C08L 63/00* (2006.01)
*B32B 27/38* (2006.01)

(52) U.S. Cl. ........................ 523/443; 428/413; 523/440; 523/442; 438/127

(58) Field of Classification Search .................. 428/413; 438/127; 523/440, 442, 443
See application file for complete search history.

(56) References Cited

U.S. PATENT DOCUMENTS 3,906,055 A    9/1975    Fishman et al.

(Continued)

FOREIGN PATENT DOCUMENTS

EP    1086972    3/2001

JP    06056418    3/1994

(Continued)

OTHER PUBLICATIONS

Pham, Ha Q. and Marks, Maurice J. "Epoxy Resins" Encyclopedia of Polymer Science and Technology. Article online posting date: Jul. 15, 2004.*

(Continued)

*Primary Examiner*—Mark Eashoo
*Assistant Examiner*—Megan McCulley
(74) *Attorney, Agent, or Firm*—Connolly Bove Lodge & Hutz LLP

(57) ABSTRACT

It is an object of the present invention to provide a resin composition which can form cured formulations having various excellent properties such as an insulating property, thermal shock resistance, moldability/formability and strength, and exhibit an excellent appearance in which transparency is enhanced, a resin composition whose cured thin film has excellent flame retardancy, good mechanical property and heat resistance, a dispersing element containing an inorganic microfine particle which can give a flame retardancy to a resin, to which the inorganic microfine particle is added, and can reduce a hygroscopic property to the extent possible, a method for producing the same and a cured formulation obtained by using the resin composition. The present invention relates to a resin composition comprising a compound having at least one of a glycidyl group and/or an epoxy group and an inorganic microfine particle, a resin composition comprising three components of a phenolic compound, a compound having at least one of a glycidyl group and/or an epoxy group and an inorganic microfine particle, a flame retardant resin composition comprising a polyhydric phenol and an inorganic microfine particle, and a dispersing element containing an inorganic microfine particle obtained by a hydrolysis condensation reaction of alkoxide and/or metal carboxylate in a dispersion medium.

17 Claims, 2 Drawing Sheets

U.S. PATENT DOCUMENTS

| | | | |
|---|---|---|---|
| 4,865,649 A | 9/1989 | Kashiwagi et al. | |
| 5,834,551 A | 11/1998 | Haraguchi et al. | |
| 6,005,060 A | 12/1999 | Murata et al. | |
| 6,124,393 A * | 9/2000 | Haraguchi et al. | 524/492 |
| 6,441,106 B1 | 8/2002 | Goda et al. | |
| 6,716,521 B1 | 4/2004 | Morimoto et al. | |
| 2002/0020327 A1 | 2/2002 | Hayashi et al. | |
| 2002/0051931 A1* | 5/2002 | Mori et al. | 430/270.1 |
| 2003/0017365 A1* | 1/2003 | Doushita et al. | 428/694 BA |
| 2003/0158301 A1 | 8/2003 | Harashina et al. | |
| 2004/0046632 A1* | 3/2004 | Kumano et al. | 336/233 |
| 2005/0107497 A1 | 5/2005 | Akaho et al. | |
| 2005/0121652 A1 | 6/2005 | Inokami | |
| 2005/0165151 A1 | 7/2005 | Fujiwara et al. | |

FOREIGN PATENT DOCUMENTS

| | | |
|---|---|---|
| JP | 8-100107 A | 4/1996 |
| JP | 8-199045 A | 8/1996 |
| JP | 8-253557 A | 10/1996 |
| JP | 8-259782 A | 10/1996 |
| JP | 9-207271 A | 8/1997 |
| JP | 9-208839 A | 8/1997 |
| JP | 09216938 | 8/1997 |
| JP | 10-298405 A | 11/1998 |
| JP | 11-323110 | 11/1999 |
| JP | 2975349 B1 | 11/1999 |
| JP | 2000-319633 A | 11/2000 |
| JP | 2001-288244 A | 10/2001 |
| JP | 2002-40663 A | 2/2002 |
| JP | 2002-294026 | 10/2002 |
| JP | 2003-344328 A | 12/2003 |
| JP | 2004-43765 A | 2/2004 |
| JP | 2004-051935 A | 2/2004 |
| JP | 2004-169004 A | 6/2004 |
| JP | 2004-269853 A | 9/2004 |
| JP | 2004-277645 A | 10/2004 |
| JP | 2005-226044 | 8/2005 |
| TW | 448195 | 8/2001 |
| TW | 474967 | 2/2002 |
| TW | 490472 | 6/2002 |
| TW | 539692 | 7/2003 |
| TW | 200302246 | 8/2003 |
| TW | 572926 | 1/2004 |
| WO | WO-0119902 | 3/2001 |
| WO | WO-03/099934 A1 | 12/2003 |

OTHER PUBLICATIONS

Takahashi et al. "Heat Resistant Epoxy-Silicon Hybrid Materials for Printed Wiring Boards." *Electronic Circuits World Convention*. Paper No. JPCA 04, pp. T2-T7.

Extended Search Report for a Counterpart European Patent Application No. 09177928.0, Dated Mar. 10, 2010.

* cited by examiner

RESIN COMPOSITION, METHOD OF ITS COMPOSITION, AND CURED FORMULATION

TECHNICAL FIELD

The present invention relates to a resin composition, a method for producing the same and a cured formulation. More specifically, the present invention relates to a resin composition which is useful as a material for mechanical components, electric and electronic devices, automobile components, construction/building, molding/forming and coatings and adhesives, a resin composition excellent in flame retardant, and curable flame retardant resin composition, a method for producing the same and a cured formulation formed by using such a resin composition.

BACKGROUND ART

Thermosetting resin compositions are industrially useful as materials for, for example, mechanical components, electric and electronic devices, automobile components, construction/building and molding/forming, and further widely used also as materials for coatings and adhesives. In such thermosetting resin compositions, technologies of making the resin composition contain an inorganic substance in order to reduce a coefficient of expansion or to control an appearance have been widely studied, and for example, by matching a refractive index of the resin composition with that of the inorganic substance, the appearances of the resin composition and the cured formulation thereof are controlled and transparency is exhibited. Particularly in recent years, it is desired to increase the content of inorganic components in order to inhibit degradation of appearance during irradiation of light, but if the content of the inorganic components is increased, the transparency is impaired. Therefore, an attempt has been made to achieve compatibility between ensuring of the transparency and inhibition of the deterioration in appearance during irradiation of light by controlling a particle size distribution of the inorganic components in nanoorder.

With respect to a thermosetting resin composition containing an inorganic material, there is disclosed a metal oxide-epoxy resin composite in which metal oxide derived from metal alkoxide is finely dispersed in a size of 0.005 to 5 µm in a cured formulation of epoxy resin (for example, referring to Japanese Kokai Publication Hei-08-100107 (p. 2)). As a method for producing this composite, there is described a method for synthesizing the composite in situ by adding metal alkoxide and/or a partial hydrolysis condensation product thereof and water and/or an organic solvent to a solution formed by partially reacting an epoxy resin with an amine curing agent in advance.

And, with respect to a resin composition, there is disclosed an epoxy resin composition in which (a) an epoxy resin, (b) an epoxy resin curing agent, (c) a silane compound having one or more epoxy group or a group to perform an addition reaction with an epoxy group, and an alkoxy group bonded to two or more silicon atoms, and (d) a silane compound polycondensation catalyst are blended as essentially component (for example, referring to Japanese Kokai Publication Hei-10-298405 (p. 2)).

In such a resin composition, since inorganic matter exists as a particle precursor in preparing the resin composition, and it is necessary to allow a reaction of the particle precursor to proceed in molding/forming, the inorganic matter does not necessarily exist as a particle in a shaped article and it can form an interpenetrating polymer network with an organic component. There are occasions when a by-product is produced in molding/forming in some cases. Thus, in order to exploit the full potential of a thermal property or a mechanical property, it was necessary to control molding/forming conditions strictly and there was a room for improvement.

And, with respect to a resin composition, there is disclosed a thermosetting resin composition, which contains an epoxy resin (a), a reactant (b) of an organic silicon compound having a functional group capable of reacting directly or through medium of a curing agent with an epoxy group and an alkoxy group, tetraalkoxysilane and water, and a curing agent (c) (for example, referring to Japanese Kokai Publication 2001-288244 (p. 2-p. 4)). In these resin compositions, it is described to use a compound containing tin as a catalyst. Furthermore, with respect to a method for producing an epoxy resin composition, there is disclosed a method comprising adding alkoxysilane and water of pH 3 to 6 to an epoxy resin dissolved in an organic solvent, hydrolyzing an alkoxy group of alkoxysilane to a silanol group in presence of an acid catalyst and then removing the solvent, and filling particles obtained by subsequent heat treatment (for example, referring to Japanese Kokai Publication Hei-8-199045 (p. 2)).

Since these tin catalyst and acid catalyst will remain as impurities in the composition after preparing a resin composition, electric properties may be deteriorated when a shaped article absorbs moisture, and there was a room for improvement.

And, there is disclosed a solder resist composition containing alkoxy group-containing silane modified phenol, an epoxy resin and a solvent (for example, referring to Japanese Kokai Publication 2002-40663. However, when this composition is cured, a silane portion have to be condensated in curing the composition or prior to curing and methanol produced in this condensation have to be removed, therefore if the composition is used as a molding/forming material with thickness, foaming occurs and molding defect may arise. Accordingly, since the composition can be used only in film/thin layer form, there was a room for contrivance to be suitable for more uses.

And, there is disclosed a technique of mixing nano-silica dispersed in an epoxy resin and a phenol resin (for example, referring to Akio Takahashi, 5. et al. "Heat Resistant Epoxy-Silicon Hybrid Materials for Printed Wiring Boards", ELECTRONIC CIRCUITS WORLD CONVENTION 9), paper No. JPCA04). In this documents, there is described a composition in which the content of a silica contained in an epoxy resin is 13.4% by weight, but it is estimated that in the whole cured formulation, this content of silica becomes a half of 13.4%. And, since as shown in Table 3, the coefficient of thermal expansion of the cured formulation is 43 at 50 to 100° C. and 162 at 200 to 250° C., the ratio of the coefficient of thermal expansion at 200 to 250° C. to the coefficient of thermal expansion at 50 to 100° C. is about 4. Therefore, in this technique, there was a room for contrivance to obtain a resin composition which can form a cured formulation having further excellent insulating property and thermal shock resistance and exhibiting a more excellent appearance.

On the other hand, when a cured formulation is obtained by using a polyhydric phenol as a phenol resin, the cured formulation has excellent properties, such as mechanical property and heat resistance. Therefore, the polyhydric phenol is used, for example, as an epoxy resin obtained by subjecting the polyhydric phenol to a glycidyl etherification, curing agent for an epoxy resin as well as a material for shape or a raw material for adhesive, coating material or the like, and the polyhydric phenol is very useful material. Among others, widely known is uses effectively utilizing an excellent electrical insulating property of the polyhydric phenol, such as a complex material of the printed circuit board and the like, a material for encapsulating semiconductor, a material for shape or adhesive and the like in electronic materials, such as an adhesive for IC package.

When the polyhydric phenol is used for electronic materials, the polyhydric phenol excellent in flame retardancy is particularly needed. As the polyhydric phenol having excellent flame retardant, for example, a bromine-containing epoxy resin and the like has been conventionally used. Recently, technologies for giving the flame retardancy without using halogen compounds have been developed. For example, an epoxy resin having excellent flame retardant, even though it is free from halogen, is obtained by adding nitrogen-containing phenol resin as a curing agent and further containing phosphate esters, or red phosphate as a flame retardant (referring to, for example, Japanese Kokai Publication Hei 08-253557, Japanese Patent No. 2975349, and Japanese Kokai Publication Hei 09-207271). However, there was a room for contrivance to obtain a flame retardant resin composition and a cured body thereof having no halogen and phosphate and having the flame retardancy, excellent properties of cured formulation, such as mechanical property and moisture resistance in various field.

The present inventors have studied on obtaining a hybrid and nano-composite resin by using silica, as a new flame retardant technology, in which neither halogen nor phosphate is used, and have found that a silica microfine particle having a specific structure may exhibit more excellent flame retardancy-providing performance than silica synthesized by the conventional methods (for example, referring to Japanese Kokai Publication 2003-344328). And the present inventors have succeeded in hybridizing a hydrolysis condensate of alkoxide and/or metal carboxylate as well as the silica obtained by the method, by mixing the hydrolysis condensation product to a polyhydricphenol bonding to each other with an organic skeleton having two or more carbon atoms therebetween, and have found that when the hybrid resin is used for a curing agent for epoxy resins, practically useful flame retardancy may be ensured without further addition of a flame retardant (that is, free from halogen and phosphate), and the present inventors have applied regarding these techniques (Japanese Patent No. 2002-151271).

Adding silica and the like to a resin composition as a filling agent is being examined in order not to give a flame retardancy but to improve various physical properties of a shaped body (cured body). For example, disclosed is a technology, in which strength, elasticity, and extension are improved by dispersing microparticles of a metal oxide (an average diameter is 0.01 to 5 μm), which is a hydrolysis polycondensation product of alkoxide, into a thermosetting resin without exhibiting macro phase separation (for example, referring to Japanese Kokai Publication Hei 08-259782). And disclosed is a thermosetting resin composition obtained by finely dispersing a silica and organopolysiloxane (0.005 μm to 0.01 μm), in which physical properties, such as shock resistance, heat resistance, flexural strength, and elasticity are improved (for example, referring to Japanese Kokai Publication Hei 09-208839). Furthermore, disclosed is a technique in which spherical amorphous silica microparticles having an average spherical diameter of 8 to 65 nm produced by a DC arc plasma process is preferably used as a silica filler for epoxy resin sealing material (For example, Japanese Kokai Publication 2000-319633).

SUMMARY OF THE INVENTION

In view of the above state of the art, it is an object of the present invention to provide a resin composition whose cured formulations exhibit various excellent properties such as an insulating property, thermal shock resistance, moldability/formability, mechanical strength and an excellent appearance in which transparency is enhanced. It is also an object of the present invention to provide a resin composition whose cured film exhibits excellent flame retardancy, good mechanical properties, heat resistance and lower humid absorption. Additional object of the present invention is to provide a manufacturing method of the resin formulation and the resulting cured formulation.

The present inventors have made various investigations concerning thermosetting resin compositions, consequently have found that a resin composition comprising a compound having a glycidyl group and/or an epoxy group and an inorganic microfine particle are useful as materials for, for example, mechanical components, electric and electronic devices, automobile components, construction/building and molding/forming. And they have found that hydrolyzing/condensing metal alkoxide and/or metal carboxylate in presence of the compound having a glycidyl group and/or an epoxy group enables the inorganic microfine particle to disperse homogeneously and finely in the resin and, a resin composition having an adequately reduced coefficient of thermal expansion and enhanced transparency can be produced, and found that such a resin composition can form a cured formulation which has excellent heat resistance, and has enhanced strength and elasticity, and a low dielectric characteristic. And, they have found that by using an organic metal compound containing one or more element selected from the group consisting of Zn, B, Al, Ga, In, Ge, Pb, P, Sb and Bi as a catalyst in a hydrolysis condensation reaction, the above-mentioned effects can be more sufficiently exhibited and the above problems can be finely resolved.

And, they have found that a resin composition having an excellent effect described the above are formed when the content of Si and the content of one or more element selected from the group consisting of Zn, B, Al, Ga, In, Ge, Pb, P, Sb and Bi among metal components constituting the inorganic microfine particle are specified. A particle size distribution of the inorganic microfine particle is also specified in the resin composition.

The present inventors have noted that a resin composition comprising three components of a phenolic compound, a compound containing at least one of a glycidyl group and/or an epoxy group, and an inorganic microfine particle, has enhanced strength and elasticity, heat resistance and a low dielectric characteristic, which is capable of utilizing various application and is useful in various areas, and they found that in the resin composition, when a ratio of a coefficient of thermal expansion, $\alpha_2$, in a temperature range of glass transition temperature Tg or more to a coefficient of thermal expansion, $\alpha_1$, in a temperature range of Tg or less ($\alpha_2/\alpha_1$) in a cured formulation of the resin composition is specified, the cured formulation has particularly excellent insulating property and thermal shock resistance and the above problems can be finely resolved. And, they have found that when a producing method comprising the step of mixing a phenolic compound containing inorganic microfine particles and a compound containing at least one of a glycidyl group and/or an epoxy group, containing inorganic microfine particles, is employed as a method for producing such a resin composition, the coefficient of thermal expansion is significantly reduced and it becomes possible to obtain the cured formulation having particularly excellent insulating property and thermal shock resistance and exhibiting a more excellent appearance, since the content of the inorganic microfine particle in the whole resin composition can be greatly increased and a peculiar property resulting from the inorganic microfine particle can be more sufficiently exhibited.

The present inventors have studied on obtaining a hybrid and nano-composite resin by using silica, as a new flame retardant technology, in which neither halogen nor phosphate is used, and have found that when the nanocomposite resin is used as a thin film, dispersibility of the silica in a polyhydric phenol needs to be more improved. That is, when forming a three-dimension cured body, organic/inorganic interface spreads in three dimensions, but organic/inorganic interface only spread in two dimensions in case of a thin film. Therefore, when an interaction of a organic molecule (polyhydric phenol) and an inorganic molecule (silica) is low, especially organic molecules gather with organic molecules, and inorganic molecules tend to gather with inorganic molecules, which causes inadequate dispersion of the silica in the polyhydric phenol.

The present inventors have found that a combination of a polyhydric phenol and an inorganic microfine particle having a specific structure can permit production of a resin composition which can produce a cured body having excellent properties, such as flame retardancy, mechanical property, and heat resistance. These findings have now led to completion of the present invention. They also have found that such a flame retardant resin composition, a curable flame retardant resin composition and a cured body containing the resin composition have extremely excellent flame retardancy, even if they are free from halogen and phosphate, and mechanical property and heat resistance are rather improved than deteriorating them. They further have found that when inorganic microfine particle has a specific structure, the inorganic microfine particle exhibits a high dispersibility in the polyhydric phenol, and the resin composition exhibits excellent flame retardancy even in the form of a thin film and is capable of producing a cured body having an excellent mechanical property and heat resistance.

They further have found the determination of a specific range about a radius of inertia and a distribution thereof of the inorganic microfine particle produced by a hydrolysis condensation product of alkoxide and/or metal carboxylate are set as a specific range, which results a dispersing element containing the inorganic microfine particle with best dispersion to obtain a resin shaped body having excellent properties, such as flame retardancy and heat resistance, and moisture absorption resistance. These findings have now led to completion of the present invention.

That is, the present invention relates to a resin composition comprising a compound having at least one of a glycidyl group and/or an epoxy group and an inorganic microfine particle, the inorganic microfine particle containing 50 to 99.9 mol % of Si and 50 to 0.1 mol % of one or more element selected from the group consisting of Zn, B, Al, Ga, In, Ge, Pb, P, Sb and Bi, as constituent metal components, and as a particle size distribution, the inorganic microfine particle containing 50 to 80% by volume of particles having a particle size of 0.5 nm or more and less than 10 nm and 50 to 20% by volume of particles having a particle size of 10 nm or more and less than 100 nm, a compound being solid at 25° C. being used in case of containing an aromatic moiety having at least one of a glycidyl group and/or an epoxy group, and a compound being solid or liquid at 25° C. being used in case of not containing an aromatic moiety. Furthermore, hereinafter, the above-mentioned resin composition comprising a compound having at least one of a glycidyl group and/or an epoxy group and an inorganic microfine particle is also referred to as "a resin composition comprising two components".

The present invention also relates to a resin composition comprising three components of a phenolic compound, a compound having at least one of a glycidyl group and/or an epoxy group and an inorganic microfine particle, the resin composition being a resin composition in which a ratio of a coefficient of thermal expansion, $\alpha_2$, in a temperature range of glass transition temperature Tg or more to a coefficient of thermal expansion, $\alpha_1$, in a temperature range of Tg or less ($\alpha_2/\alpha_1$) in a cured formulation of the resin composition is 2.0 or less. In addition, hereinafter, the above resin composition comprising three components of a phenolic compound, a compound containing at least one of a glycidyl group and/or an epoxy group and an inorganic microfine particle, is also referred to as "a resin composition comprising three components".

DETAILED DESCRIPTION OF THE PREFERRED EMBODIMENTS

Figure 1:
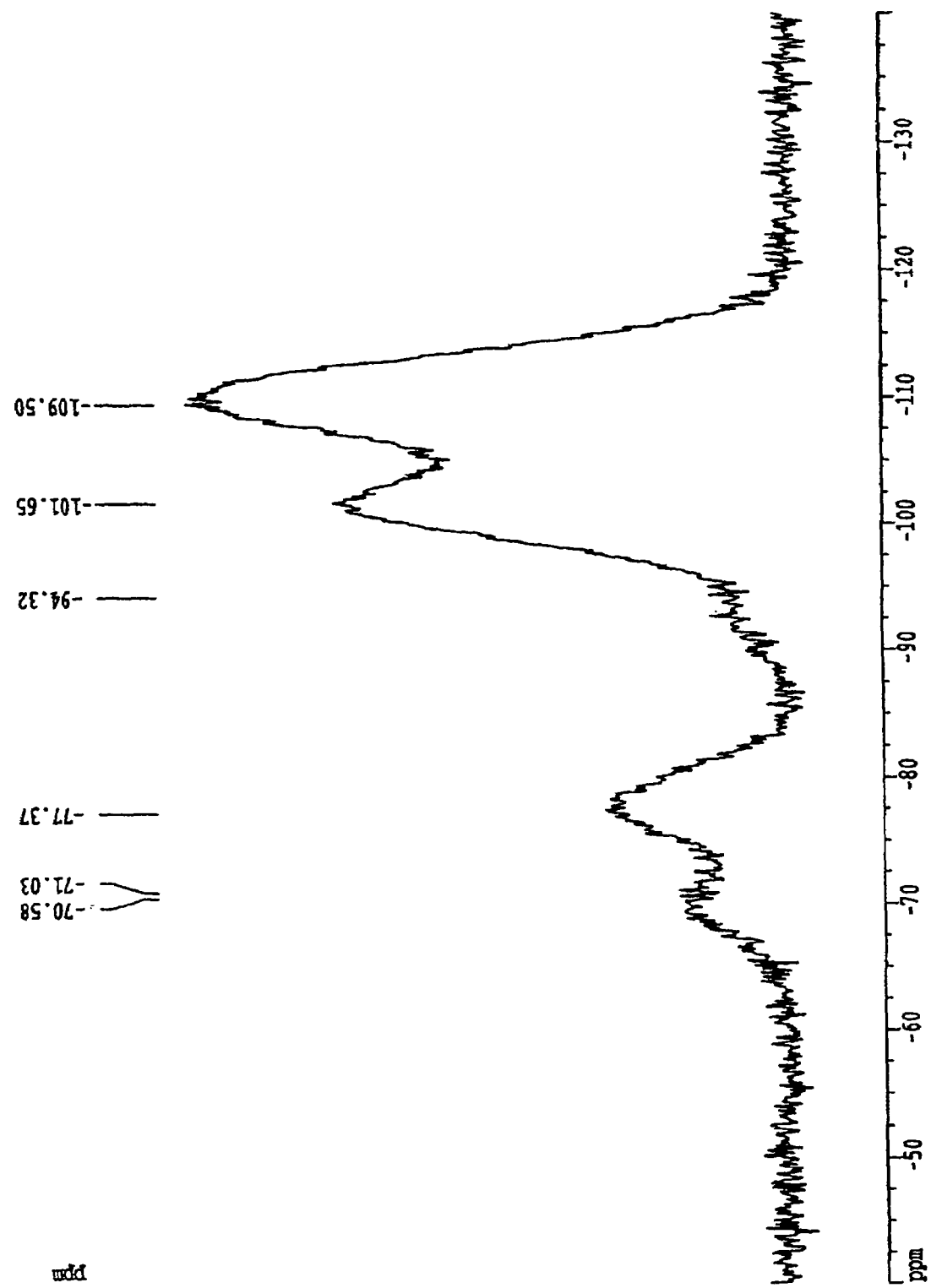
FIG. 1 shows a $^{29}$Si-DD/MAS-NMR spectrum of an inorganic microfine particle contained in a flame retardant resin composition F.

Hereinafter, the present invention will be described in detail.

A resin composition comprising two components of the present invention is a resin composition comprising a compound having at least one of a glycidyl group and/or an epoxy group (hereinafter, also referred to as "a glycidyl group- and/or an epoxy group-containing compound"), and an inorganic microfine particle.

In the above resin composition, a compound being solid at 25° C. is used in case of containing an aromatic moiety as a glycidyl group- and/or an epoxy group-containing compound and a compound being solid or liquid at 25° C. is used in case of not containing an aromatic moiety. The case of containing an aromatic moiety as a glycidyl group- and/or an epoxy group-containing compound includes a case of containing a compound having a glycidyl group and/or an epoxy group and an aromatic ring. Being solid at 25° C. means that the glycidyl group- and/or an epoxy group-containing compound can be in the form of solid at 25° C.

In the above inorganic microfine particle, the content of silicon (Si), which is a constituent metal component, is 50 to 99.9 mol %. When the content of silicon is less than 50 mol % or more than 99.9 mol %, gelation during a hydrolysis condensation reaction may be caused. A lower limit of the content of silicon is preferably 60 mol % and more preferably 70 mol %. An upper limit is preferably 99.5 mol % and more preferably 99 mol %.

And, the content of one or more element selected from the group consisting of Zn, B, Al, Ga, In, Ge, Pb, P, Sb and Bi is 50 to 0.1 mol %. When the above content is less than 0.1 mol % or more than 50 mol %, physical properties such as heat resistance may not be sufficiently improved. A lower limit of the content is preferably 0.1 mol % and more preferably 0.5 mol %. An upper limit is preferably 30 mol % and more preferably 20 mol %.

The amount of the above constituent metal component in the inorganic microfine particle can be measured, for example, by subjecting a cured plate of the resin composition to X-ray photoelectron spectrometry (XPS) analysis.

The above inorganic microfine particle contains 50 to 80% by volume of particles having a particle size of 0.5 nm or more and less than 10 nm and 50 to 20% by volume of particles having a particle size of 10 nm or more and less than 100 nm. As the above particle size distributions, when taking the amount of the whole inorganic microfine particle as 100% by weight (% by mass or mass %), and the portion of particles having a particle size of 0.5 nm or more and less than 10 nm is less than 50% by volume, the coefficient of thermal expansion may not be sufficiently reduced. When this portion is more than 80% by volume, the glass transition temperature of the cured formulation of the resin composition may become low. A lower limit of the portion is preferably 55% by volume and more preferably 60% by volume. An upper limit is preferably 78% by volume and more preferably 75% by volume.

And, also when the portion of particles having a particle size of 10 nm or more and less than 100 nm is less than 20% by volume or more than 50% by volume, the coefficient of thermal expansion may not be sufficiently reduced, or the glass transition temperature may not be sufficiently raised. A lower limit of the portion is preferably 23% by volume and more preferably 25% by volume. An upper limit is preferably 45% by volume and more preferably 40% by volume.

By controlling the particle size distributions within the above limits, it becomes possible to inhibit bleeding in curing the resin composition or failures of a cured formulation.

The above particle size distribution can be determined, for example, by subjecting a cured plate of the resin composition to a small angle X-ray scattering analysis and preparing a Guinier plot from a scattering profile obtained by this measurement by a Fankuchen method to determine a radius of inertia and assuming that a geometry of a particle is a sphere.

The content of the above inorganic microfine particle preferably has a lower limit of 3% by weight taking the amount of the resin composition as 100% by weight. The lower limit is more preferably 10% by weight and furthermore preferably 15% by weight. An upper limit of the content is preferably 80% by weight, more preferably 70% by weight and furthermore preferably 60% by weight.

And, the content of the glycidyl group- and/or an epoxy group-containing compound preferably has a lower limit of 40% by weight taking the amount of the resin composition as 100% by weight. The lower limit is more preferably 50% by weight. An upper limit of the content is preferably 95% by weight, more preferably 90% by weight and furthermore preferably 85% by weight.

The thermally softening temperature of the above resin composition preferably has a lower limit of 45° C. The lower limit is more preferably 70° C. An upper limit of the softening point is preferably 200° C. and more preferably 150° C.

And, the melting point of the above resin composition preferably has a lower limit of 80° C. The lower limit is more preferably 100° C. An upper limit is preferably 300° C. and more preferably 250° C.

The present invention also relates to a resin composition comprising three components of a phenolic compound, a compound having at least one of a glycidyl group and/or an epoxy group and an inorganic microfine particle, the resin composition being a resin composition (the resin composition comprising three components) in which a ratio of a coefficient of thermal expansion, $\alpha_2$, in a temperature range of glass transition temperature Tg or more to a coefficient of thermal expansion, $\alpha_1$, in a temperature range of Tg or less ($\alpha_2/\alpha_1$) in a cured formulation of the resin composition is 2.0 or less.

The above resin composition comprising three components comprises three components of a phenolic compound, a compound having at least one of a glycidyl group and/or an epoxy group and an inorganic microfine particle. In addition, the resin composition may comprise one or more compounds as the phenolic compound, as the compound having at least one of a glycidyl group and/or as an epoxy group and an inorganic microfine particle, and may also comprise other components in addition to three components, but the total amount of these three components is preferably 5% by weight or more taking the amount of the whole resin composition as 100% by weight. The total amount is more preferably 10% by weight or more.

In the above resin composition comprising three components, each content of three components described above is not particularly limited and may be appropriately set in accordance with various properties described below, but it is preferable to adjust each components so that the content of the inorganic microfine particle contained in the cured formulation of the resin composition has a lower limit of 5% by weight and an upper limit of 45% by weight with respect to 100% by weight of the whole cured formulation. When the content of the inorganic microfine particle is less than 5% by weight, the cured formulation may not become a cured formulation having excellent various properties such as insulating property and thermal shock resistance, and when it is more than 45% by weight, the transparency of the cured formulation may not be improved. More preferably, the lower limit is 10% by weight and the upper limit is 40% by weight, and furthermore preferably, the lower limit is 15% by weight and the upper limit is 35% by weight. Furthermore, in order to be the content of the inorganic microfine particle in the cured formulation within the above-mentioned range, it is preferable to adjust the content of the inorganic microfine particle having a lower limit of 1% by weight and an upper limit of 45% by weight with respect to 100% by weight of the resin composition. More preferably, the lower limit is 2% by weight and the upper limit is 40% by weight, and furthermore preferably, the lower limit is 5% by weight and the upper limit is 35% by weight. By setting the contents of the inorganic microfine particle within such a range in the resin composition, a cured formulation having a particularly excellent insulating property, thermal shock resistance and transparency may be obtained.

The weight ratio (phenolic compound/glycidyl group- and/or epoxy group-containing compound/inorganic microfine particle) of the phenolic compound, the glycidyl group- and/or the epoxy group-containing compound and the inorganic microfine particle contained in the above resin composition comprising three components is preferably, for example, 10 to 50/10 to 50/2 to 40.

In the above resin composition comprising three components, it is proper that a ratio of a coefficient of thermal expansion, $\alpha_2$, in a temperature range of glass transition temperature Tg or more to a coefficient of thermal expansion, $\alpha_1$, in a temperature range of Tg or less ($\alpha_2/\alpha_1$) in a cured formulation of the resin composition is 2.0 or less, and when the ratio is higher than 2.0, the insulating property, the thermal shock resistance and the moldability/formability may not become sufficient and there is a possibility that the cured formulation cannot be suitably applied to various areas. The ratio is preferably 1.9 or less, and more preferably 1.8 or less.

In addition, as the above cured formulation, a cured formulation obtained by curing the above resin composition containing three components by a curing method described below may be used and a cured formulation obtained by curing a resin composition containing other components in addition to the above three components may also be used.

The above glass transition temperature (Tg) refers to a glass transition temperature of a cured formulation of a resin composition and, for example, it can be determined by drawing tangent lines to a "temperature-change in dimension" curve obtained by a TMA (thermomechanical analysis) method at linear portions of the curve around the glass transition temperature and taking a point of intersection of the tangent lines as a glass transition temperature.

The above coefficient of thermal expansion, $\alpha_1$, in a temperature range of Tg or less means an average coefficient of thermal expansion in the range of from Tg–80° C. to Tg–30° C. with respect to Tg value obtain by the TMA method as described above and the above coefficient of thermal expansion, $\alpha_2$, in a temperature range of Tg or more means an average coefficient of thermal expansion in the range of from Tg+30° C. to Tg+80° C.

The above coefficient of thermal expansion can be determined, for example, by the following method.

(Conditions of Preparing Sample for Evaluation)

A resin composition is kneaded and defoamed under reduced pressure at 110° C., and then it is charged into a mold having a thickness of 1 mm and cured at 110° C. for three hours and further at 150° C. for three hours in an oven to obtain a resin plate having a thickness of 1 mm.

(Measuring Method of Coefficient of Thermal Expansion)

A square piece in a size of 5 mm×5 mm is cut off from the resin plate obtained, and measured by a thermomechanical analysis (TMA) apparatus (compression process). Glass transition temperature (Tg) and coefficient of thermal expansion ($\alpha_1$, $\alpha_2$) are determined by the manner described above from a temperature-deformation (change in dimension) curve obtained. Furthermore, as a measuring apparatus, "TMA-50" manufactured by Shimadzu Corp. is used and measurement are conducted under the conditions that a load is 1 g, a rate of temperature up is 5° C./minute and a measuring range is 20 to 250° C.

In the resin composition comprising three components of the present invention, the phenolic compound is not particularly limited and a compound usually used may be used. Specifically, there are given compounds having at least one phenolic hydroxyl group such as phenol, o-cresol, m-cresol, p-cresol, o-ethylphenol, p-ethylphenol, mixed cresol, p-hydroxyethylphenol, p-n-propylphenol, o-isopropylphenol, p-isopropylphenol, mixed isopropylphenol, o-sec-butylphenol, m-tert-butylphenol, p-tert-butylphenol, 2-allylphenol, pentylphenol, p-octylphenol, p-nonylphenol, 2,3-dimethylphenol, 2,4-dimethylphenol, 2,6-dimethylphenol, 3,4-dimethylphenol, 2,4-di-sec-butylphenol, 3,5-dimethylphenol, 2,6-di-sec-butylphenol, 2,6-di-tert-butylphenol, 3-methyl-4-isopropylphenol, 3-methyl-5-isopropylphenol, 3-methyl-6-isopropylphenol, 2-tert-butyl-4-methylphenol, 3-methyl-6-tert-butylphenol and 2-tert-butyl-4-ethylphenol; and compounds having two or more phenolic hydroxyl groups such as catechol, resorcinol, biphenol, bisphenol A, bisphenol S, bisphenol F, phenylphenol, α-naphthol and β-naphthol. Among others, phenol, o-cresol, m-cresol, or p-cresol, catechol, phenyl phenol, β-naphthol and the like are preferable, and they may be used singly or in combination of two or more of them.

The above phenolic compound may have a structure in which two or more aromatic skeletons respectively having at least one phenolic hydroxyl group, are bonded to each other with an organic skeleton having two or more carbon atoms therebetween, and the compound having such a structure is one of the preferable embodiment of the present invention. Such a structure of the phenolic compound allows the cured formulation to have the improved flame retardancy and the improved insulating property of the cured formulation resulting from a structural feature, and the cured formulation is suitable for more uses.

In the above phenolic compound, the aromatic skeleton represents an aromatic ring having at least one phenolic hydroxyl group. This aromatic skeleton is a site having a structure of type such as a phenol type, and a phenol type, a hydroquinone type, a naphthol type, an anthracenol type, a bisphenol type and a biphenol type are suitable. Among others, the phenol type is preferred. And, a site having a structure of type such as a phenol type may be appropriately substituted with an alkyl group, an alkylene group, an aralkyl group, a phenyl group or a phenylene group.

In the above phenolic compound, the organic skeleton refers to a site which bonds two aromatic ring skeletons respectively constituting a phenolic compound with each other and has a carbon atom. And, the organic skeleton having two or more carbon atoms preferably has a ring structure. The ring structure represents a structure having a ring of an aliphatic ring, an aromatic ring or the like, and as the ring, a cyclopentane ring, a cyclohexane ring, a benzene ring, a naphthalene ring and an anthracene ring are preferred. The above organic skeleton preferably has a ring structure and/or an aromatic ring containing a nitrogen atom such as a triazine ring, a phosphazene ring and the like. The organic skeleton preferably has a triazine ring and/or an aromatic ring particularly. The above phenolic compound may have an aromatic skeleton and an organic skeleton other than the above-mentioned skeletons, and may simultaneously have a structure in which two aromatic skeletons respectively having at least one phenolic hydroxyl group are bonded to each other with an organic skeleton (methylene) having one carbon atom therebetween.

As for the above phenolic compound, when having a ring structure containing a nitrogen atom as an organic skeleton, a content of the nitrogen atom preferably has a lower limit of 1% by weight and an upper limit of 50% by weight. When this content is out of this range, there is a possibility that properties of cured formulation such as flame retardant property and heat resistance may not be more improved. More preferably, the lower limit is 3% by weight and the upper limit is 30% by weight, and furthermore preferably, the lower limit is 5% by weight and the upper limit is 20% by weight.

In addition, the content of the nitrogen atom refers to a weight ratio (mass ratio) of the nitrogen atom composing the phenolic compound in the case where the amount of the phenolic compound is taken as 100% by weight.

It is preferable that the above phenolic compound is produced from a reaction material comprising a compound to form the aromatic skeleton having at least one phenolic hydroxyl group (hereinafter, also referred to as "a compound to form an aromatic skeleton") and a compound to form the organic skeleton having two or more carbon atoms (hereinafter, also referred to as "a compound to form an organic skeleton").

The above reaction material means a mixture comprising a compound to form the aromatic skeleton and a compound to form the organic skeleton, and comprising another compound to be used if necessary and comprising a solvent to be used if necessary in order to perform the reaction. Furthermore, the compound to form an aromatic skeleton and the compound to form the organic skeleton may be used singly or in combination of two or more of them.

As the above compound to form the aromatic skeleton, a compound, in which one or more phenolic hydroxyl groups are bonded to an aromatic ring, may be used, and one or more substituents except phenolic hydroxyl group may be bonded to an aromatic ring. Specifically, there are given a compound having at least one phenolic hydroxyl group described above or a compound having two or more phenolic hydroxyl groups.

As the above-mentioned a compound to form the organic skeleton, there are suitably used (1) aromatic moieties having any of an α-hydroxyalkyl group, an α-alkoxyalkyl group and an α-acetoxyalkyl group, (2) compounds having an unsaturated bond, (3) compounds having a carbonyl group such as aldehydes and ketones, (4) compounds having two or more of these specific active groups or active sites and (5) compounds having any of an amino group, a hydroxyalkylamino group and a di(hydroxyalkyl)amino group.

As the above (1) aromatic moieties, there are suitably used p-xylylene glycol, p-xylylene glycol dimethyl ether, p-diacetoxymethylbenzene, m-xylylene glycol, m-xylylene glycol dimethyl ether, m-diacetoxymethylbenzene, p-dihydroxyisopropylbenzene, p-dimethoxyisopropylbenzene, p-diacetoxyisopropylbenzene, trihydroxymethylbenzene, trihydroxyisopropylbenzene, trimethoxymethylbenzene, trimethoxyisopropylbenzene, 4,4'-hydroxymethylbiphenyl, 4,4'-methoxymethylbiphenyl, 4,4'-acetoxymethylbiphenyl, 3,3'-hydroxymethylbiphenyl, 3,3'-methoxymethylbiphenyl, 3,3'-acetoxymethylbiphenyl, 4,4'-hydroxyisopropylbiphenyl, 4,4'-methoxyisopropylbiphenyl, 4,4'-acetoxyisopropylbiphenyl, 3,3'-hydroxyisopropylbiphenyl, 3,3'-methoxyisopropylbiphenyl, 3,3'-acetoxyisopropylbiphenyl, 2,5-hydroxymethylnaphthalene, 2,5-methoxymethylnaphthalene, 2,5-acetoxymethylnaphthalene, 2,6-hydroxymethylnaphthalene, 2,6-methoxymethylnaphthalene, 2,6-acetoxymethylnaphthalene, 2,5-hydroxyisopropylnaphthalene, 2,5-methoxyisopropylnaphthalene, 2,5-acetoxyisopropylnaphthalene, 2,6-hydroxyisopropylnaphthalene, 2,6-methoxyisopropylnaphthalene and 2,6-acetoxyisopropylnaphthalene.

As the above (2) compounds having an unsaturated bond, there are suitably used divinylbenzene, diisopropenylbenzene, trivinylbenzene, triisopropenylbenzene, dicyclopentadiene, norbornene and terpenes.

As the above (3) compounds having a carbonyl group, various aldehydes and ketones, having 15 or less carbon atoms, are suitable, and benzaldehyde, octanal, cyclohexanone, acetophenone, hydroxybenzaldehyde, hydroxyacetophenone, crotonaldehyde, cinnamaldehyde, glyoxal, glutaraldehyde, terephthalaldehyde, cyclohexane dialdehyde, tricyclodecane dialdehyde, norbornane dialdehyde and sbel aldehyde are preferred.

In the above (4) compounds having two or more of specific active groups or active sites, as a compound having a carbonyl group and an unsaturated bond, there are suitably used isopropenylbenzaldehyde, isopropenylacetophenone, citronellal, citral and perillaldehyde. And, as a compound having an α-hydroxyalkyl group or an α-alkoxyalkyl group and an unsaturated bond, there are suitably used dihydroxy methylstyrene, dihydroxymethyl α-methylstyrene, dimethoxy methylstyrene, dimethoxymethyl α-methylstyrene, hydroxymethyldivinylbenzene, hydroxymethyldiisopropylbenzene, methoxymethyldivinylbenzene and methoxymethyldiisopropylbenzene.

As the above (5) compounds having any of an amino group, a hydroxyalkylamino group and a di(hydroxyalkyl)amino group, there are suitably used triazines, such as melamine, dihydroxymethylmelamine, trihydroxymethylmelamine, acetoguanamine, dihydroxymethylacetoguanamine, tetrahydroxymethylacetoguanamine, benzoguanamine, dihydroxymethylbenzoguanamine, tetrahydroxymethylbenzoguanamine; ureas and derivatives thereof, such as urea, (dihydroxymethyl)urea, (tetrahydroxymethyl)urea; amines, such as ethylenediamine, dihydroxymethylethylene diamine, tetrahydroxymethylethylene diamine, hexaethylenediamine, dihydroxymethylhexaethylene diamine, tetrahydroxymethylhexaethylene diamine, p-xylylene diamine, p-dihydroxymethylaminobenzene, m-xylylene diamine, m-dihydroxymethylaminobenzene; anilines, such as 4,4'-oxydianiline, 4,4'-oxydihydroxymethylaniline, 4,4'-methylenedianiline and 4,4'-methylenedihydroxymethylaniline. Among them, compounds having a triazine skeleton such as melamine, benzoguanamine, acetoguanamine and the like are preferred.

The above reaction material preferably contains the compound to form an aromatic skeleton (hereinafter, also referred to as "a raw material A") and at least any one of the compounds to form an organic skeleton (hereinafter, also referred to as "a raw material B") from (1) to (5) described above. The above reaction material more preferably contains the raw material A, at least any one of the compounds to form an organic skeleton (hereinafter, also referred to as "a raw material B1") selected from (1) to (4) described above and the compound to form an organic skeleton (hereinafter, also referred to as "a raw material B2") of the above (5). As a reaction order of the reaction material in this case, the raw material A, the raw material B1 and the raw material B2 are mixed previously before initiating a reaction, and it is preferred to react the raw material B2 before a reaction of the raw material A and the raw material B1 is completed, and for example, it is preferred that the raw material A, the raw material B1 and the raw material B2 are simultaneously reacted with one another or that the raw material A is reacted with the raw material B2 at the first stage and then reacted with the raw material B1 at the second stage. Thereby, the flame retardant property may be more surely improved and the reaction material becomes suitably applicable to molding/forming materials of electronic materials, adhesives and coating materials. More preferably, the raw material A is reacted with the raw material B2 at the first stage and then reacted with the raw material B1 at the second stage.

The molar ratio between the raw material A and the raw material B to be blended, which are used in producing the above phenolic compound, preferably has a lower limit of 1/1 and an upper limit of 10/1. When the amount of the raw material A is less than a molar ratio of 1/1, gelation is caused during producing a resin composition, and when the amount of the raw material A is more than a molar ratio of 10/1, properties of cured formulation, such as flame retardant property may be hard to exhibit. More preferably, the lower limit is 1.3/1 and the upper limit is 8/1, since it becomes possible that the resin composition exhibits high strength at elevated temperature. Furthermore preferably, the lower limit is 1.8/1 and 5/1.

Preferably, the above phenolic compound is formed by reacting the above reaction material in presence of a catalyst. The catalyst which can be employed for producing the phenolic compound may be one capable of reacting the above reaction material.

In the case where reacting the raw material B1 in presence of the above catalyst, as an acid catalyst, there are suitably used inorganic acids such as hydrochloric acid, sulfuric acid, phosphoric acid, organic sulfonic acids p-toluenesulfonic acid and methanesulfonic acid, ultra strong acids such as boron trifluoride or a complex thereof, trifluoromethanesulfonic acid and heteropolyacid, and solid acid catalysts such as activated clay, synthetic zeolite, sulfonic acid type ion-exchange resin and perfluoroalkane sulfonic acid type ion-exchange resin.

The amount of the above catalyst used in the case where the raw material B1 is reacted is appropriately set in accordance with the acid strength of each catalyst, and it preferably has a lower limit of 0.001 parts by weight and an upper limit of 100 parts by weight taking the amount of the raw material B1 as 100 parts by weight. As the catalyst which becomes homogeneous in this range, trifluoromethanesulfonic acid, methanesulfonic acid and boron trifluoride are preferred, and the use amount of these compounds preferably have a lower limit of 0.001 parts by weight and an upper limit of 5 parts by weight, respectively. The use amount of heterogeneous ion-exchange resin or activated clay preferably have a lower limit of 1 parts by weight and an upper limit of 100 parts by weight In the case where the raw material B2 is reacted in presence of the above catalyst, as a basic catalyst, there are suitably used hydroxides and oxides of alkaline metal or alkaline earth metal such as sodium hydroxide, potassium hydroxide and barium hydroxide, ammonium, primary/secondary/tertiary-amine, hexamethylenetetramine and sodium carbonate. As an acid catalyst, there are suitably used inorganic acids such as hydrochloric acid, sulfuric acid and sulfonic acid, organic acids such as oxalic acid and acetic acid, Lewis acid and divalent metal salts such as zinc acetate. And, when the resin composition of the present invention is used as an epoxy resin curing agent for electric/electronic material, it is not preferred that inorganic substances such as metal remain as a catalyst residue and therefore it is preferred to use the amines as a basic catalyst and the organic acids as an acid catalyst.

Furthermore, it is preferred to remove impurities such as salts by carrying out neutralization and washing with water, if necessary, after the reaction of the raw material B2. In addition, when the amines are employed as the catalysts, it is preferable not to carry out the removal treatment of impurities such as neutralization and washing with water.

The above phenolic compound is obtained by condensation of an aromatic ring in the raw material A and a substituent in the raw material B, but carboxylic acid, alcohol and water are produced as a by-product together with the phenolic compound during this condensation. These carboxylic acid, alcohol and water thus produced as a by-product can be easily removed from a reaction product without complicated process by distilling off under reduced pressure during or after a reaction or performing azeotropic distillation with a solvent. In addition, the reaction product refers to a mixture containing all of substances obtained by conducting the reaction as mentioned above and it contains a catalyst if necessary used, a solvent described below in addition to the phenolic compound, carboxylic acid, alcohol and water produced as a by-product.

In the reaction conditions in the above production of the phenolic compound, the reaction temperature is preferably set at a temperature at which carboxylic acid, alcohol and water produced as by-products are evaporated and distilled off, and the reaction temperature preferably has, for example, a lower limit of 100° C. and an upper limit of 240° C. More preferably, the lower limit is 110° C. and the upper limit is 180° C., and furthermore preferably, the lower limit is 130° C. and the upper limit is 160° C. Thus, in the production of the phenolic compound, carboxylic acid and the like are produced as by-products, but these compounds can be easily removed from the reaction product. And, the reaction time depends on a raw material, the type and the quantity of a catalyst used and a reaction temperature, but it is preferred to continue the reaction until the reaction of the raw material A and the raw material B is substantially completed, that is, until carboxylic acid, alcohol and water are not generated, and the reaction time preferably has a lower limit of 30 minutes and an upper limit of 24 hours. More preferably, the lower limit is 1 hour and the upper limit is 12 hours.

As for the reaction method in the above production of the phenolic compound, the reaction may be carried out in presence of a solvent, and as for the solvent, an organic solvent, which is inactive to the reaction of the raw material A and the raw material B, is preferably used, and alcohols, such as methanol, ethanol; ketones, such as acetone, methyl ethyl ketone, methyl isobutyl ketone; arenes, such as toluene, xylene, monochlorobenzene and dichlorobenzene; ethyl acetate; ethyleneglycol monomethyl ether; N,N-dimethylformamide may be used. By using such a solvent, it is possible to homogeneously dissolve the raw material in the solvent. And, in the case where the raw material B1 is reacted, it is preferred to carry out the reaction without a solvent.

In the above production of the phenolic compound, when the by-products such as carboxylic acid, alcohol and water, and the solvent are removed from the reaction product, it is preferable to distill off by distilling at the above-mentioned temperature under reduced pressure of 0.1 to 10 kPa. In this case, since unreacted phenols also may be distilled off, it is preferred to conduct the removal of the by-products and the solvent after the reaction is substantially completed.

When various aldehydes are used as the (3) compound of the above-mentioned raw material B, a phenol resin, so called, is obtained. When phenols and aldehydes are reacted in presence of an acid catalyst by a publicly known method, novolac type phenol resin is obtained, and when in presence of an alkaline catalyst by a publicly known method, resol type phenol resin is obtained. These phenol resins may be also used. A "triazin ring-containing polyhydric phenol" obtained by reaction of aldehydes of the raw material B ((3) compound) and triazines of the raw material C with the raw material A is excellent in flame retardancy and preferably used as a component of a resin composition.

In the resin composition comprising two components and the resin composition comprising three components of the present invention (hereinafter, referred to as only "the resin composition of the present invention"), as a glycidyl group- and/or an epoxy group-containing compound, there are given, for example, epi-bis type glycidyl ether epoxy resins obtained by a condensation reaction of bisphenols such as bisphenol A, bisphenol F, bisphenol S and epihalohydrin (epichlorohydrin and the like); high molecular weight epi-bis type glycidyl ether epoxy resins obtained by an addition reaction of bisphenols such as bisphenol A, bisphenol F and bisphenol S to epi-bis type glycidyl ether epoxy resins obtained by a condensation reaction of bisphenols such as bisphenol A, bisphenol F and bisphenol S and epihalohydrin; novolac aralkyl type glycidyl ether epoxy resins obtained by a condensation reaction of epihalohydrin and polyhydric phenols obtained by a condensation reaction of phenols, such as phenol, cresol, xylenol, naphthol, resorcin, catechol, bisphenol A, bisphenol F and bisphenol S, with formaldehyde, acetaldehyde, propionaldehyde, benzaldehyde, hydroxybenzaldehyde, salicylaldehyde, dicyclopentadiene, terpene, coumarin, p-xylene glycol dimethyl ether, dichloro-p-xylylene or bishydroxymethylbiphenyl; aromatic crystalline epoxy resins obtained by a condensation reaction of epihalohydrin and tetramethylbiphenol, tetramethyl bisphenol F, hydrochinone or naphthalenediol, and high molecular weight resin of the above-mentioned aromatic crystalline epoxy resins obtained by an addition reaction of the above bisphenols, tetramethylbiphenol, tetramethyl bisphenol F, hydrochinone or naphthalenediol to the above aromatic crystalline epoxy resins; aliphatic glycidyl ether epoxy resins obtained by a condensation reaction of epihalohydrin and alicyclic glycols formed by hydrogenating aromatic skeletons such as the above bisphenols, tetramethylbiphenol, tetramethyl bisphenol F, hydrochinone or naphthalenediol, or monosaccharides/polysaccharides such as ethylene glycol, diethylene glycol, triethylene glycol, tetraethylene glycol, PEG600, propylene glycol, dipropylene glycol, tripropylene glycol, propylglycol, propylene glycol, PPG, glycerol, diglycerol, tetraglycerol, polyglycerol, trimethylolpropane and polymer thereof, pentaerythritol and polymer thereof, glucose, fructose, lactose and maltose; epoxy resins having an epoxycyclohexane skeleton such as (3,4-epoxycyclohexane)methyl3',4'-epoxycyclohexylcarboxylate; glycidyl ester epoxy resins obtained by a condensation reaction of tetrahydrophthalic acid, hexahydrophthalic acid, benzoic acid and epihalohydrin; glycidyl ether epoxy resins obtained by a condensation reaction of hydrogenerated bisphenol or glycols and epihalohydrin; tertiary amine-containing glycidyl ether epoxy resins being solid at room temperature, which is obtained by a condensation reaction of hydantoin, cyanuric acid, melamine or benzoguanamine and epihalohydrin; aromatic polycyclic epoxy resin, such as bisphenyl epoxy resin, and naphthalene epoxy resin. A compound having an epoxy group in the molecule by a addition reaction of these epoxy resins and polybasic acids and/or bisphenols may be used (hereinafter also referred to as "epoxy resin" including this compound). These resins may be used singly or in combination of two or more of them. Among others, there are more suitably used the above aliphatic glycidyl ether epoxy resin and the above epoxy resin having an epoxycyclohexane skeleton in the case of being aimed at suppressing the degradation of appearance in irradiating light.

The above glycidyl group- and/or the epoxy group-containing compound can be used suitably as an essential component for the resin composition of the present invention, but the resin composition comprising three components is not particularly limited as long as it contains at least a glycidyl group and/or an epoxy group and it may be a solid compound or a liquid compound. Accordingly, in the above glycidyl group- and/or the epoxy group-containing compound, a substance obtained by a condensation reaction of epihalohydrin and phenols obtained by a condensation reaction of phenols with formaldehyde or the like may be used as the above novolac aralkyl type glycidyl ether epoxy resin, and a substance being liquid at room temperature may also be used as the tertiary amine-containing glycidyl ether epoxy resin.

In the resin composition of the present invention, the inorganic microfine particle may be a microfine particle composed of inorganic compounds such as metals or metal compounds and is not particularly limited. The inorganic microfine particle is preferably a hydrolysis condensation product of alkoxide compounds (preferably metal alkoxide) and/or carboxylate compounds (preferably metal carboxylate) among others and more preferably a hydrolysis condensation product produced by a sol-gel method. It is furthermore preferably a hydrolysis condensation product of alkoxide compounds by a sol-gel method. The hydrolysis condensation product refers to a compound obtained by further condensing a substance obtained by a hydrolysis reaction.

A hydrolysis reaction and a condensation reaction of alkoxide compounds and carboxylate compounds are expressed by the following reaction formulas;

$$M(OR^1)_a + aH_2O \text{ (hydrolysis)} \rightarrow M(OH)_a + aR^1OH$$

$$M(OH)_a \rightarrow M(OH)_bO_c \rightarrow MO_{2/c} \text{ (condensation product)}$$

wherein M represents a metallic element, $R^1$ represents an alkyl compound or an acyl group, and a, b and c represent optional numerals.

As the above-mentioned alkoxide compound and carboxylate compound, there are suitably employed a compound expressed by the following formula (1);

$$M(OR^2)_n \quad (1)$$

wherein M represents a metallic element, $R^2$ represents an alkyl compound or an acyl group, and n represents an integer of 1 to 7, and/or a compound expressed by the following formula (2);

$$(R^3)_m M(OR^2)_p \quad (2)$$

wherein M and $R^2$ represent the same ones as in formula (1), $R^3$ represents an organic group, and m and p each represents an integer of 1 to 6. $R^2$ and $R^3$ may be same or different from each other.

As an alkyl group of $R^2$ in the above formulas (1) and (2), an alkyl group having 1 to 5 carbon atoms is suitable, and methyl group, ethyl group, n-propyl group, i-propyl group, n-butyl group, i-butyl group, sec-butyl group, tert-butyl group and n-pentyl group are preferred. And, as an acyl group of $R^2$, an acyl group having 1 to 4 carbon atoms is suitable, and acetyl group, propionyl group and butynyl group are preferred.

As an organic group of $R^3$ in the above formula (2), an organic group having 1 to 8 carbon atoms is suitable, and preferred are alkyl groups such as methyl group, n-propyl group, i-propyl group, n-butyl group, i-butyl group, sec-butyl group, tert-butyl group, n-pentyl group, n-hexyl group, n-heptyl group and n-octyl group; fluorinated alkyl groups such as 3-fluoropropyl group; mercapto group-containing alkyl groups such as 2-mercaptopropyl group; amino group-containing alkyl groups such as 2-aminoethyl group, 2-dimethylaminoethyl group, 3-aminopropyl group 3-dimethylaminopropyl group; aryl groups such as phenyl group, methylphenyl group, ethylphenyl group, methoxyphenyl group, ethoxyphenyl group, fluorophenyl group; aralkyl groups such as benzil group; epoxy group-containing organic groups such as 2-glycidoxyethyl group, 3-glycidoxypropyl group and 2-(3,4-epoxycyclohexyl)ethyl group; and unsaturated group-containing organic groups such as vinyl group and 3-(meth)acryloxypropyl group; acetyl acetonate groups.

The metallic element M in the above formulas (1) and (2) may be any metal in a periodic table as long as it may have a structure of compounds shown in the above formulas (1) and (2), but at least one of metallic elements selected from the Group III B (Group 13) elements such as B, Al, Ga, In and Tl; Group IV B (Group 14) such as C, Si, Ge, Sn and Pb; Ti, Zr, Zn, Ca, Na, Li, Te, Mg, Ni, Cr, Ba, Ta, Mo, Tb and Cs are suitable. Among others, Al, In, Zn or Si is preferred. Si is more preferred.

As the above-mentioned alkoxide compound or carboxylate compound in the case where the above metallic element is silicon (Si), there are suitably used tetraalkoxysilanes such as tetramethoxysilane, tetraethoxysilane, tetra-n-propoxysilane, tetra-i-propoxysilane, tetra-n-butoxysilane, tetra-i-butoxysilane, tetra-sec-butoxysilane and tetra-t-butoxysilane;

trialkoxysilanes such as methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, (3,3,3-trifluoropropyl)trimethoxysilane, (3,3,3-trifluoropropyl)triethoxysilane, 3-mercaptopropyltrimethoxysilane, 3-aminopropyltrimethoxysilane, N-phenyl-3-aminopropyltrimethoxysilane, 3-aminopropyltriethoxysilane, phenyltrimethoxysilane, phenyltriethoxysilane, benzyltrimethoxysilane, benzyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, 3-(meth)acryloxy propyl trimethoxysilane and 3-(meth)acryloxy propyl triethoxysilane; dialkoxysilanes such as dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, diphenyldimethoxysilane and diphenyldiethoxysilane; tetraacyloxysilanes such as tetraacetyloxysilane and tetrapropionyloxysilane; triacyloxysilanes such as methyltriacetyloxysilane and ethyltriacetyloxysilane; diacyloxysilanes such as dimethyldiacetyloxysilane and diethyldiacetyloxysilane; and zinc compounds such as zinc acetate. Among them, tetramethoxysilane, tetraethoxysilane, methyltrimethoxysilane, methyltriethoxysilane, dimethyldimethoxysilane and dimethyldiethoxysilane are preferred. As the alkoxide compound, substances containing silicon alkoxides are preferred as mentioned above.

As the alkoxide compound in the case where the above metallic element is other than silicon (Si), there are suitably used a monometal alkoxides such as $LiOCH_3$, $NaOCH_3$, $Cu(OCH_3)_2$, $Ca(OCH_3)_2$, $Sr(OC_2H_5)_2$, $Ba(OC_2H_5)_2$, $Zn(OC_2H_5)_2$, $B(OCH_3)_3$, $Al(OCH_3)_3$, $Al(OC_2H_5)_3$, $Al(iso-OC_3H_7)_3$, $Al(OC_4H_9)_3$, $Ga(OC_2H_5)_3$, $Y(OC_4H_9)^3$, $Ge(OC_2H_5)^4$, $Pb(OC_4H_9)_4$, $P(OCH_3)_3$, $Sb(OC_2H_5)_3$, $VO(OC_2H_5)_3$, $Ta(OC_3H_7)_5$, $W(OC_2H_5)_6$, $La(OC_3H_7)_3$, $Nd(OC_2H_5)_3$, $Ti(OCH_3)_4$, $Ti(OC_2H_5)_4$, $Ti(iso-OC_3H_7)_4$, $Ti(OC_4H_9)_4$, $Zr(OCH_3)_4$, $Zr(OC_2H_5)_4$, $Zr(OC_3H_7)_4$ and $Zr(OC_4H_9)_4$; and composite metal alkoxides such as $La[Al(iso-OC_3H_7)_4]_3$, $Mg[Al(iso-OC_3H_7)_4]_2$, $Mg[Al(sec-OC_4H_9)_4]_2$, $Ni[Al(iso-OC_3H_7)_4]_2$, $(C_3H_7O)_2Zr[Al(OC_3H_7)_4]_2$ and $Ba[Zr(OC_2H_5)_9]_2$.

The use ratio of compounds represented by the above formulas (1) and (2), when taking the total amount of the compounds represented by the formulas (1) and (2) as 100% by weight, the ratio of the compound represented by the formula (1) is preferably 80% by weight or more in the above resin composition comprising two components in consideration of the affinity of the inorganic microfine particle obtained with components composing the resin composition. This ratio is more preferably 90% by weight or more. And, in the above resin composition comprising three components, the ratio of the compound represented by the formula (1) is preferably 40% by weight or more. This ratio is more preferably 50% by weight or more.

In the above resin composition comprising two components, the use amount of the above-mentioned metal alkoxide and/or metal carboxylate preferably has a lower limit of 20% by weight with respect to 100% by weight of the glycidyl group- and/or the epoxy group-containing compound. This lower limit is more preferably 40% by weight and furthermore preferably 60% by weight. An upper limit of the use amount is preferably 200% by weight, more preferably 180% by weight and furthermore preferably 160% by weight.

In the above hydrolysis condensation reaction, one or two or more of metal chelate compounds may be used in order to accelerate the reaction. In the above-mentioned formula (2), the carboxylate, in which $R^3$ is an acetyl acetonate group, can be regarded as a metal chelate compound.

As the above metal chelate compound, there are suitably used, for example, one or more of compounds selected from the group consisting of $Zr(OR^4)_q(R^5COCHCOR^6)_{4-q}$, $Ti(OR^4)_r(R^5COCHCOR^6)_{4-r}$, and $Al(OR^4)_s(R^5COCHCOR^6)_{4-s}$ and partial hydrolysis product thereof.

$R^4$ and $R^5$ in the above metal chelate compound each represents an organic group having 1 to 6 carbon atoms, $R^6$ represents an organic group having 1 to 6 carbon atoms or an alkoxyl group having 1 to 16 carbon atoms, and q and r are integers of 0 to 3 and s is an integer of 0 to 2. $R^4$ to $R^6$ may be same or different from each other. As the organic group having 1 to 6 carbon atoms in $R^4$ and $R^5$, there are suitably used methyl group, ethyl group, n-propyl group, i-propyl group, n-butyl group, i-butyl group, sec-butyl group, tert-butyl group, n-pentyl group, n-hexyl group and phenyl group. As the alkoxyl group having 1 to 16 carbon atoms in $R^6$, there are suitably used methoxy group, ethoxy group, n-propoxy group, i-propoxy group, n-butoxy group, i-butoxy group, sec-butoxy group and tert-butoxy group.

As the above metal chelate compound, there are suitably used zirconium chelate compounds such as tri-n-butoxyethyl acetoacetate zirconium, di-n-butoxy.bis(ethylacetoacetate) zirconium, tetrakis(n-propylacetoacetate)zirconium, tetrakis(acetylacetonate)zirconium tetralkis (acetylacetate) zirconium; titanium chelate compounds such as di-i-propoxy bis(ethylacetoacetate) titanium, di-i-propoxy bis(acetylacetate) titanium, di-i-propoxy bis (acetylacetonate) titanium; and aluminum chelate compounds such as di-i-propoxy ethylacetoacetate aluminum, di-i-propoxy acetylacetonate aluminum, i-propoxy bis(ethylacetoacetate) aluminum, i-propoxy bis(acetylacetonate) aluminum, tris(ethylacetoacetate) aluminum, tris(acetylacetonate) aluminum, mono-acetylacetonate bis(ethylacetoacetate) aluminum, and the like. Among them, tri-n-butoxy ethyl acetoacetate zirconium, di-i-propoxy bis(acetylacetonate) titanium, di-i-propoxy ethylacetoacetate aluminum, and tris(ethylacetoacetate) aluminum are preferred.

The use amount of the above metal chelate compound is preferably 30 parts by weight or less with respect to 100 parts by weight of the compound represented by the above formula (1) and/or the compound represented by the above formula (2). When the use amount is more than 30 parts by weight, a surface appearance of a shaped article may not be sufficient. This amount is more preferably 20 parts by weight or less, and furthermore preferably 10 parts by weight or less.

The above alkoxide compound, carboxylate compound and inorganic microfine particle, which is a hydrolysis condensation product thereof, may be blended with one or two or more of colloidal silica and/or colloidal alumina for the purpose of enhancing a stiffness of a resin composition obtained.

The above colloidal silica is a dispersion formed by dispersing purified silicic anhydride in water and/or a hydrophilic organic solvent and its average particle diameter is 5 to 100 nm and preferably 10 to 50 nm and the concentration of solid content is on the order of 10 to 40% by weight. As the colloidal silica, there are suitably used SNOWTEX, Isopropanol SILICASOL, Methanol SILICASOL (all of them trade name, produced by Nissan Chemical Industries, Ltd.), CATALOID, OSCAL (all of them trade name, produced by Catalysts & Chemicals Industries Co., Ltd.), Ludex (trade name, produced by E.I. du Pont de Nemours & Company), Sayton (trade name, produced by US MONSANTO Company) and Nalcoag (trade name, produce by US Nalco Chemical Co.)

The above colloidal alumina is alumina sol in which water is used as a dispersing medium and pH is 2 to 6, or alumina sol in which a hydrophilic organic solvent is used as a dispersing medium, and its average particle diameter is 5 to 200 nm and preferably 10 to 100 nm and the concentration of solid content is on the order of 5 to 30% by weight. As alumina, synthesized alumina, boehmite and pseudo-boehmite are suitable. As colloidal alumina, ALUMINASOL-100, ALUMINASOL-200, ALUMINASOL-520, (all of them trade name, produced by Nissan Chemical Industries, Ltd.) are suitable.

The blending amount of the above colloidal silica and/or colloidal alumina is preferably 60 parts by weight or less expressed in terms of solid content respect to 100 parts by weight of the solid content of the inorganic microfine particle obtained from the alkoxide compound and the carboxylate compound. When the blending amount is more than 60 parts by weight, a surface appearance of a shaped article may not become excellent. This blending amount is more preferably 40 parts by weight or less.

The above inorganic microfine particle may also contain a hydrolysis condensation product of a hydrolytic metal salt. As the hydrolytic metal salt, there are suitably used copper salts such as $Cu(NO_3)_2$, $CuCl_2$, $CuSO_4$; titanium salts such as $TiCl_4$, $TiCl_2$, $TiSO_4$; yttrium salts such as $Y(NO_3)_3$, $YCl_3$; zirconium salts such $ZrSO_4$, $ZrCl_2$, $Zr(NO_3)_2$; chromium salts such as $Cr(NO_3)_3$, $CrCl_3$; aluminum salts such as $Al(NO_3)_3$, $Al_2(SO_4)_3$, etc.; and nickel salts such as $Ni(NO_3)_2$, $NiCl_2$, and one or two or more of these compounds may be used. A hydrolysis condensation product of such a hydrolytic metal salt may be one component composing the hydrolysis condensation product of the alkoxide compound and/or the carboxylate compound or may be a substance composing a mixture as a particle.

The inorganic microfine particle containing in the resin composition comprising three components of the present invention is preferably a silicon oxide microfine particle. The silicon oxide microfine particle refers to a microfine particle having a skeleton containing at least a silicon atom (Si) and an oxygen atom (O) and, for example, mullite ($3Al_2O_3 \cdot 2SiO_2$), talc ($3MgO \cdot 4SiO_2 \cdot H_2O$), barium silicate ($BaO \cdot 8SiO_2$), cordierite ($2MgO \cdot 2Al_2O_3/5SiO_2$) and the like are suitably used.

In such a silicon oxide microfine particle, the content of Si, which is a constituent metal component, preferably has a lower limit of 50 mol % with respect to 100 mol % of the total amount of the constituent metal component. When the content of Si is less than 50 mol %, physical properties of cured formulation such as heat resistance may not be sufficiently improved. The more preferable lower limit is 60 mol % and furthermore preferably 70 mol %. And, an upper limit is preferably 99.5 mol % and more preferably 99 mol %.

And, the above silicon oxide microfine particle may contains other metallic atoms as a constituent metal component, and for example, and other metallic is preferably at least one element selected from the group consisting of Zn, B, Al, Ga, In, Ge, Pb, P, Sb and Bi. The content of these metallic elements suitably has an upper limit of 50 mol % with respect to 100 mol % of the total amount of the constituent metal component. When the content is more than 50 mol %, physical properties such as heat resistance may not be sufficiently improved. The more preferable upper limit is 30 mol % and furthermore preferably 20 mol %. And, a lower limit is preferably 0.1 mol % and more preferably 0.5 mol %.

The amount of the constituent metal component in the above silicon oxide microfine particle can be measured, for example, by subjecting a cured plate of the resin composition to X-ray photoelectron spectrometry (XPS) analysis.

As for the particle size distributions of the inorganic microfine particle contained in the resin composition comprising three components, it is preferred that taking the amount of the whole inorganic microfine particle as 100% by weight, the inorganic microfine particle contains 25 to 65% by volume of particles having a particle size of 0.5 nm or more and less than 10 nm and 35 to 75% by volume of particles having a particle size of 10 nm or more and less than 100 nm. When the portion of particles having a particle size of 0.5 nm or more and less than 10 nm is less than 25% by volume, the coefficient of thermal expansion may not be sufficiently reduced, and when it is more than 65% by volume, the glass transition temperature of the cured formulation of the resin composition may not be sufficiently improved. More preferably, the lower limit is 30% by volume and the upper limit is 63% by volume, and furthermore preferably, the lower limit is 40% by volume and the upper limit is 61% by volume.

And, also when the portion of particles having a particle size of 10 nm or more and less than 100 nm is less than 35% by volume or more than 75% by volume, the coefficient of thermal expansion may not be sufficiently reduced or the glass transition temperature may not be sufficiently raised. More preferably, the portion has a lower limit of 37% by volume and an upper limit of 70% by volume, and furthermore preferably, a lower limit of 30% by volume and an upper limit of 60% by volume. By controlling the particle size distributions within the above range, it becomes possible to inhibit bleeding in curing the resin composition or failures of a cured formulation.

The above particle size distribution can be determined, for example, by subjecting a cured plate of the resin composition to a small-angle X-ray scattering analysis and preparing a Guinier plot from a scattering profile obtained by the measurement by a Fankuchen method to calculate a radius of inertia and assuming that a geometry of a particle is a sphere. Specifically, it can be determined according to the following method.

(Measurement of Radius of Inertia of Inorganic Microfine Particle)

A square piece in a size of 5 cm×5 cm is cut off from the resin plate which is obtained in (Conditions of preparing sample for evaluation) in the measurement method of a coefficient of thermal expansion described above and the piece is subjected to a small-angle X-ray scattering method. A small-angle X-ray scattering spectrum was measured using the X-ray diffractometer "RINT-2400", manufactured by Rigaku Corp. Incident X-ray is converted to monochrome through a multilayer mirror monochrometer and further passed through 3 slits, and then it is irradiated to the resin piece and scattered X-rays are detected with a scintillation counter installed at a camera length of 250 mm through a vacuum path. Detailed conditions of measurement are as follows.

A Guinier plot is prepared from a scattering profile obtained by a Fankuchen method to calculate a radius of inertia and a particle size distribution is determined assuming that a geometry of a particle is a sphere.

(Detailed Conditions)

X-ray used: $CuK\alpha$

Tube voltage, tube current: 40 kV, 200 mA

Operation method: Transmission method ($2\theta$ separate operation)

Scanning angle covered $2\theta$

Increment of a step: 0.1 to 5.0 degree, 0.01 degree

Measuring time: 30 minutes

As a particularly suitable embodiment of the above inorganic microfine particle, the inorganic microfine particle is a silicon oxide microfine particle and contains 50 to 100 mol % of Si and 50 to 0 mol % of at least one element selected from the group consisting of Zn, B, Al, Ga, In, Ge, Pb, P, Sb and Bi, as a constituent metal component, and as a particle size distribution, the inorganic microfine particle contains 25 to 65% by volume of particles having a particle size of 0.5 nm or more and less than 10 nm and 35 to 75% by volume of particles having a particle size of 10 nm or more and less than 100 nm.

The above inorganic microfine particles contained in the resin composition comprising three components is an independent spherical particle and/or a flocculated substance, and an average particle diameter of the flocculated substance is preferably 100 μm or less. When the average particle diameter is more than 100 μm, the above inorganic microfine particle is not uniformly dispersed in the resin composition, and the strength property may not become sufficient. The average particle diameter is more preferably 5 μm or less, and furthermore preferably 2 μm or less.

In addition, "an independent spherical particle" refers to a primary particle consisting of the inorganic microfine particle, and "a flocculated substance" refers to a secondary particle newly formed by flocculation of the primary particle.

When the inorganic microfine particle used for the resin composition of the present invention is measured for a peak appearing in a range of −120 to −40 ppm by $^{29}$Si-DD/MAS-NMR measurement, and a peak area derived from a structure having a 4 silicon atoms-bonding $SiO_4$ atomic group is defined as $A_{Q4}$, a peak area derived from a structure having a 3 silicon atoms-bonding $SiO_4$ atomic group as $A_{Q3}$, a peak area derived from a structure having a 3 silicon atoms-bonding R—$SiO_3$ atomic group as $A_{T3}$ (R being an organic group not containing oxygen atom at a position adjacent to silicon atom), a peak area derived from a structure having a 2 silicon atoms-bonding R—$SiO_3$ atomic group (R being an organic group not containing oxygen atom at a position adjacent to silicon atom) as $A_{T2}$, the inorganic microfine particle preferably has a structure having $A_{Q3}/A_{Q4}$ of 0.01 to 1.0, $A_{T2}/A_{T3}$ of 0.01 to 1.0, and $(A_{T2}+A_{T3})/(A_{Q3}+A_{Q4})$ of 0.01 to 2.0. Thus, one of the preferable embodiments in the present invention is also a flame retardant resin composition comprising a polyhydric phenol and an inorganic microfine particle, the inorganic microfine particle having a structure that satisfies $A_{Q3}/A_{Q4}$ of 0.01 to 1.0, $A_{T2}/A_{T3}$ of 0.01 to 1.0, and $(A_{T2}+A_{T3})/(A_{Q3}+A_{Q4})$ of 0.01 to 2.0, when the inorganic microfine particle being measured for a peak appearing in the range of −120 to −40 ppm by $^{29}$Si-DD/MAS-NMR measurement, and a peak area derived from a structure having a 4 silicon atoms-bonding $SiO_4$ atomic group being defined as $A_{Q4}$, a peak area derived from a structure having a 3 silicon atoms-bonding $SiO_4$ atomic group as $A_{Q3}$, a peak area derived from a structure having a 3 silicon atoms-bonding R—$SiO_3$ atomic group (R being an organic group not containing oxygen atom at a position adjacent to silicon atom) as $A_{T3}$, a peak area derived from a structure having a 2 silicon atoms-bonding R—$SiO_3$ atomic group (R being an organic group not containing oxygen atom at a position adjacent to silicon atom) as $A_{T2}$.

It is preferable that the above-mentioned inorganic microfine particle is obtained by carrying out a hydrolysis condensation reaction of 50 to 99% by weight of tetraalkoxysilane and 1 to 50% by weight of trialkoxysilane and/or dialkoxysilane. It is preferable that the above-mentioned polyhydric phenol has a structure in which two or more aromatic skeletons respectively having at least one phenol hydroxyl group are bonded to each other with an organic group having two or more carbon atoms therebetween.

The above-mentioned $A_{Q3}/A_{Q4}$, $A_{T2}/A_{T3}$, and $(A_{T2}+A_{T3})/(A_{Q3}+A_{Q4})$ each means an integrated intensity ratio. The ratio is calculated from an integrated area (integrated intensity value) of each peak by separating, based on a waveform separation, each peak measured by the $^{29}$Si-DD/MAS-NMR measurement method. The $^{29}$Si-DD/MAS-NMR measuring method used herein is one of the solid NMR measuring methods used for measurement of silicon atoms. This method is carried out by applying a pulse to an observation nucleus one time, to cause $^{1}$H decoupling only during incorporation of a signal. In this measuring method, a quantitative signal can be detected, since increase of signal intensity derived from a nuclear Overhauser effect does not occur. Conditions of the $^{29}$Si-DD/MAS-NMR measurement may be as follows, and for example, an irradiation pulse may be appropriately adjusted according to a relaxation time of a measurement nucleus. In addition, numbers of integrating times and sample rotations may also be appropriately adjusted according to a diameter of a sample rotor used at the time of measurement.

Example of a condition in $^{29}$Si-DD/MAS-NMR measurement Nuclear magnetic resonance apparatus: "AVANCE 400" manufactured by BRUKER Corp.
Probe used: 4 mm MAS probe
Measurement nucleus: $^{29}$Si (observation nucleus resonance frequency: 79.487 MHz)
Measurement mode: The DD-MAS (dipoler decoupling/magic angle spinning) method
Irradiation pulse angle: 10-60 degree pulse
Pulse repeat time: 60 seconds or more
Number of scans: 200-10000 times
Spinning rate: 3-15 kHz
Observation temperature: 300K
External reference material: sodium 3-(trimethylsilyl) propane 1-sulfonate: the chemical shift value of 1.534 ppm In the above-mentioned integrated intensity ratio, $A_{Q4}$ represents a peak area derived from a structure (a silica component having this structure is defined as $Q^4$ silica component) having a 4 silicon atoms-bonding $SiO_4$ atomic group, $A_{Q3}$ represents a peak area derived from a structure (a silica component having this structure is defined as $Q^3$ silica component) having a 3 silicon atoms-bonding $SiO_4$ atomic group, $A_{T3}$ represents a peak area derived from a structure (a silica component having this structure is defined as $T^3$ silica component) having a 3 silicon atoms-bonding R—$SiO_3$ atomic group (R being an organic group not containing oxygen atom at a position adjacent to silicon atom), and $A_{T2}$ represents a peak area derived from a structure (a silica component having this structure is defined as $T^2$ silica component) having a 2 silicon atoms-bonding R—$SiO_2$ atomic group (R being an organic group not containing oxygen atom at a position adjacent to silicon atom).

In the above-mentioned measurement condition, a peak showing existence of $Q^4$ silica component has a peak top in the range of −120 to −105 ppm, a peak showing existence of $Q^3$ silica component has a peak top in the range of −105 to −90 ppm. Each peak showing existence of $T^3$ silica component and $T^2$ silica component varies in peak top depending on the form of R group. For example, when R is an organic group of an unsaturated hydrocarbon skeleton, the peak showing existence of $T^3$ silica component has a peak top in the range of −80 to −70 ppm, and the peak showing existence of $T^2$ silica component has a peak top in the range of −75 to −60 ppm. When the R group is an organic group of a saturated hydrocarbon skeleton, the peak showing existence of $T^3$ silica component has a peak top in the range of −70 to −60 ppm, and the peak showing existence of $T^2$ silica component has a peak top in the range of −60 to −50 ppm. Peaks of $Q^4$ silica component, $Q^3$ silica component, $T^3$ silica component, and $T^2$ silica component are specified based on the above data. Then, integrated intensity values $A_{Q3}$, $A_{Q4}$, $A_{T3}$, and $A_{T2}$ are determined, and $A_{Q3}/A_{Q4}$, $A_{T2}/A_{T3}$, and $(A_{T2}+A_{T3})/(A_{Q3}+A_{Q4})$ are calculated.

It is thought that the exhibition of flame retardancy-providing performance of silica is caused by the following factors. That is, $H_2O$ generated by dehydration condensation of a silanol group (–Si—OH), which exists in silica, under high temperature and finely dispersed silica in cured bodies or the like prevent inflammable gas occurring at the time of firing or oxygen in air from propagating. Thereby, flame expansion is suppressed. The integrated intensity ratios $A_{Q3}/A_{Q4}$ and $A_{T2}/A_{T3}$ are regarded as scales of concentration of the silanol group in silica, size of a microfine particle, and also dispersibility, each integrated intensity ratio are preferably 0.01 to 1.0. When the integrated intensity ratio is less than 0.01, effect of flame retardent-providing performance by inorganic microfine particles may be insufficient, and improvement effect in flame retardancy and thermal properties may be insufficiently exhibited in a curing body obtained. On the other hand, when the integrated intensity is more than 1.0, moisture resistance and electrical properties of a cured body are unpreferably reduced. The integrated intensity ratio preferably has a lower limit of 0.03, and an upper limit of 0.8.

An organic group represented as R (mentioned below) existing in the surface or inside of the inorganic microfine particle enhances dispersibility of the inorganic microfine particles in the resin composition, but since the organic group eliminates from silica at high temperature, organic compounds generated by elimination of the organic group burns when a cured body is in a combustion state in air. As a result, much heat generates, to accelerate burning of a cured body. Accordingly, an amount of such a separatable organic group R is preferably set in a certain range. The amount of this organic group R can be estimated by an equation of $(A_{T2}+A_{T3})/(A_{Q3}+A_{Q4})$. When this value is 0.01 to 2.0, high dispersibility is ensured in the composition or the cured body, and neither flame retardancy nor thermal properties is reduced. More preferably, $(A_{T2}+A_{T3})/(A_{Q3}+A_{Q4})$ has a lower limit of 0.03, and an upper limit of 1.0.

As mentioned above, the $Q^4$ silica component has the structure having a 4 silicon atoms-bonding $SiO_4$ atomic group, and the $Q^3$ silica component has the structure having a 3 silicon atoms-bonding $SiO_4$ atomic group. This $Q^4$ silica component is mainly configured when tetrafunctional hydrolyzable silane compounds cause hydrolysis condensation reaction. Examples of such tetrafunctional hydrolyzable silane compounds include the above-mentioned tetraalkoxy silane and tetraacyloxy silane. Among others, tetramethoxy silane and tetraethoxy silane are preferred.

The $T^3$ silica component has the structure having a 3 silicon atoms-bonding R—$SiO_3$ atomic group (R being an organic group not containing oxygen atom at a position adjacent to silicon atom), and the $T^2$ silica component has the structure having a 2 silicon atoms-bonding R—$SiO_3$ atomic group (R being an organic group not containing oxygen atom at a position adjacent to silicon atom). Specific examples of the R include alkyl groups, such as methyl group, n-propyl group, i-propyl group, n-butyl group, i-butyl group, sec-butyl group, tert-butyl group, n-pentyl group, n-hexyl group, n-heptyl group, and n-octyl group; alkyl fluoride groups, such as 3-fluoropropyl group; mercapto group-containing alkyl groups, such as 2-mercaptopropyl group; amino group-containing alkyl groups, such as 2-aminoethyl group, 2-dimethylaminomethyl group, 3-aminopropyl group, and 3-dimethylaminopropyl group; aryl groups, such as phenyl group, methylphenyl group, ethylphenyl group, methoxyphenyl group, ethoxyphenyl group, and fluorophenyl group; aralkyl groups, such as benzyl; epoxy group-containing organic groups, such as 2-glycidoxyethyl group, 3-glycidoxypropyl group, and 2-(3, 4-epoxycyclohexyl) ethyl group; and unsaturated group-containing organic groups, such as vinyl group and 3-(meta) acryloxypropyl group. Among others, amino group-containing alkyl groups, aryl groups, aralkyl groups, epoxy group-containing organic groups are preferred.

In order to introduce such an organic group R into an inorganic microfine particle, a difunctional and/or trifunctional hydrolyzable silane compound having the organic group R may be subjected to a cohydrolysis condensation with the above-mentioned tetrafunctional hydrolyzable silane compound. Examples of the hydrolyzable silane compounds having the organic group R include trialkoxysilane mentioned above; dialkoxysilane; triacyloxysilane; and diacyloxysilane, and they may be used singly or in combination of two or more of them. Among these, an alkoxysilane compound having an aromatic ring, such as phenyl trimethoxysilane and benzyl triethoxysilane is preferable, since the compound has high affinity with a polyhydric phenol and are effectively used to finely disperse an inorganic microfine particle in a polyhydric phenol. Another preferable example includes alkoxy silane compounds with a functional group having reactivity with a hydroxyl group in a polyhydric phenol, such as 3-aminopropyl trimethoxysilane, 3-glycidoxypropyl trimethoxy silane, 2-(3,4-epoxycyclohexyl) ethyl trimethoxy silane, and the like.

In order to arrange the above-mentioned integrated intensity ratio within the above-mentioned certain range, 50 to 99% by weight of a tetrafunctional hydrolyzable silane compound and 1 to 50% by weight of a hydrolyzable silane compound having the organic group R are preferably subjected to a hydrolysis condensation reaction. The ratio of them [the tetrafunctional hydrolyzable silane compound: hydrolyzable silane compound having the organic group R] is preferably 55 to 98:2 to 45, and more preferably 60 to 95:5 to 40.

The inorganic microfine particle is preferably synthesized by a sol-gel method. For example, mentioned may be a method for performing a hydrolysis reaction and a condensation reaction by dissolving, in a hydrophilic organic solvent, such as methanol, or a dispersing, in a dispersion medium, the tetrafunctional hydrolyzable silane compound and the hydrolyzable silane compound having the organic group R (both compounds are generally defined as a raw material silane compound), and then adding water or a mixed liquid of water and a hydrophilic organic solvent into the solution or the dispersion. Use of a polyhydric phenol as a dispersion medium is preferred, since the above-mentioned flame retardant resin composition in which the inorganic microfine particles are finely dispersed in a polyhydric phenol may be easily obtained. In this case, a dispersion medium of a raw material silane compound or a dilution thereof (hereinafter, referred to as inner liquid), and water are preferably dropped separately into a reaction vessel equipped with an agitating device. By separately providing a raw material silane compound introductory part and a water introductory part, water is finely dispersed or dissolved in inner liquid before the raw material silane compound makes contact with water, and thereby the hydrolysis condensation reaction may be performed under homogeneous system. A proceeding of the reaction may properly delayed and the particle may be prevented from being larger, since it takes some time for the raw material silane compound to make contact with water. Therefore, the inorganic microfine particle finely dispersed in the dispersion medium may be obtained. Preferably, a total supplied amount of the raw material silane compound and water is finally 0.2 to 50% by weight in 100% by weight of the resin composition of the reaction vessel (a total weight of the dispersion medium and the inorganic microfine particles is defined as 100% by weight).

When the hydrolysis condensation reaction is performed in the polyhydric phenol as mentioned above, a hydrophilic organic solvent, such as methanol, is preferably added to a polyhydric phenol. Water is hard to be compatible with a polyhydric phenol, but the hydrophilic organic solvent serves as a dissolution auxiliary agent of water, and promotes fine dispersion or dissolution of water into the inner liquid. When the polyhydric phenol, which is a dispersion medium, has a high viscosity or is in a solid matter at ambient temperature, the hydrophilic organic solvents may be a solvent for dilution. The hydrophilic organic solvent is not particularly limited, and for example, includes alcohols, such as methanol and ethanol; ketones, such as acetone and 2-butanone; tetrahydrofuran; polyols, such as ethylene glycol, propylene glycol, 1,3-propanediol; N,N-dimethylformamide; and pyridine. If necessary, other solvents may be mixed.

The temperature of the above-mentioned hydrolysis condensation reaction is preferably 0 to 60° C., and more preferably 5 to 40° C. The reaction time is generally 30 minutes to 24 hours, and preferably 1 to 12 hours. When the dispersion medium is diluted, the solvent for dilution may be distilled off under reduced pressure of 0.1 to 10 kPa to be removed. When the dispersion medium is diluted using a "solvent (mentioned below)" added to enhance flowability, the solvent may not distill off, but may partly distill off. Used may be a method like a publicly known sol-gel method in which an inorganic microfine particle is synthesized in a hydrophilic solvent, and mixed with a polyhydric phenol separately synthesized. When the inorganic microfine particle is synthesized, metal (except for silicon) chelate compounds may be used with the above-mentioned silane compound. The metal chelate compounds also have a function which accelerates the synthetic reaction of the inorganic microfine particle. Suitable metal chelate compounds are as above-mentioned.

One of the preferable embodiments in the present invention is also a flame retardant resin composition (a curable flame retardant resin composition) comprising the flame retardant resin composition and a compound having at least two glycidyl groups. Such a curable flame retardant resin composition may be obtained by mixing the compound having at least two glycidyl groups and if necessary, other additives with the above-mentioned flame retardant resin composition. The hydroxyl group in the polyhydric phenol reacts with the glycidyl group of the glycidyl group-containing compound, and thereby the curable flame retardant resin composition is cured to produce a cured body. That is, the above-mentioned curable flame retardant resin composition preferably comprises the above-mentioned polyhydric phenol, the above-mentioned inorganic microfine particle, and the compound having at least two glycidyl groups.

In order to obtain the curable flame retardant resin composition, for example, the following methods may be used. (I) A method in which the compound having at least two glycidyl groups is mixed with the above-mentioned flame retardant resin composition produced in advance; (II) a method in which the above-mentioned polyhydric phenol and the above-mentioned inorganic microfine particle are independently and simultaneously mixed with the compound having at least two glycidyl groups; (III) a method in which the above-mentioned polyhydric phenol is dispersed in the above-mentioned inorganic microfine particle dispersed in advance in the compound having at least two glycidyl groups. Among others, the curable flame retardant resin composition is preferably produced by the above-mentioned method (I).

As the above-mentioned compound having at least two glycidyl groups, an epoxy resin having an average of two or more glycidyl groups in 1 molecule is preferable. The epoxy resin is not especially limited and may be used as long as the epoxy resin having an average of two or more glycidyl groups in 1 molecule.

One of the preferred embodiments in the present invention is a material for encapsulating semiconductor and an insulating material for wiring board each comprising the above-mentioned flame retardant resin composition; a cured body obtainable by curing the flame retardant resin composition; a semiconductor component device obtainable by using the above-mentioned material for encapsulating semiconductor; and a substrate for electric wiring obtainable by using the above-mentioned insulating material for wiring board.

The inorganic microfine particle of the present invention may be also in a form of a dispersing element, and preferably in a dispersing element containing the inorganic microfine particle obtained by a hydrolysis condensation reaction of alkoxide and/or metal carboxylate in a dispersion medium, the inorganic microfine particle having a radius of inertia of 50 nm or less, and a weight ratio of the microfine particle with a radius of inertia of less than 10 nm and the microfine particle with a radius of inertia of 10 nm or more and 50 nm or less being 1:99 to 40:60. The microfine particle with a radius of inertia of less than 10 nm effectively increases an interface wettability between the dispersion medium and the microfine particle especially when a resin composition is used as the dispersion medium, but van der Waals force between the inorganic microfine particles functions too much. When only microfine particle with a radius of inertia of less than 10 nm are blended, improvement effect in physical properties derived from nanocomposite may insufficiently exhibited. On the other hand, the microfine particle with a radius of inertia of more than 50 nm may easily absorb moisture in air and cause reduction of hygroscopic property. Accordingly, the inorganic microfine particle (primary particle) preferably has a radius of inertia of 50 nm or less, and the weight ratio of the microfine particle with a radius of inertia of less than 10 nm and the microfine particles with a radius of inertia of 10 nm or more and 50 nm or less is preferably 1:99 to 40:60. The weight ratio of the microfine particle with a radius of inertia of less than 10 nm and the microfine particle with a radius of inertia of 10 nm or more and 50 nm or less is more preferably 20:80 to 50:50.

As a preferable form of the above-mentioned dispersion medium, mentioned may be a form that the dispersion medium contains at least one organic solvent or a form that the dispersion medium is a shapeable resin composition. The above-mentioned resin composition preferably comprises polyhydric phenols, and more preferably further contains an epoxy resin as an essential component.

An epoxy resin may be contained in the above-mentioned resin composition used as the dispersion medium. In a shaped body and a cured body obtained of this case, the inorganic microfine particle is dispersed in the epoxy resin matrix. The epoxy resin may be singly used, but the resin composition containing the polyhydric phenol and the epoxy resin is preferably used as a dispersion medium, since the above-mentioned polyhydric phenol also serves as a curing agent of the epoxy resin. A publicly known epoxy curing agent may be added to the resin composition.

The above-mentioned dispersing element of the inorganic microfine particle may be preferably used for various materials, and a material for encapsulating semiconductor and an insulating material for wiring board each comprising the above-mentioned dispersing element containing the inorganic microfine particle, a cured body obtainable by curing the dispersing element containing the inorganic microfine particle are also one of preferable embodiments in the present invention. The above-mentioned dispersing element of the inorganic microfine particle may be also used preferably as a shaped body (cured body) in which an inorganic microfine particle is dispersed, obtained by shaping (curing) the above-mentioned dispersing element containing the inorganic microfine particle, or as a shaped body in which an inorganic microfine particle is dispersed, obtained by curing the above-mentioned dispersing element containing the inorganic microfine particle containing, as a dispersion medium, a resin composition comprising a polyhydric phenol and further comprising an epoxy resin. A semiconductor component device obtainable by using the above-mentioned material for encapsulating semiconductor and a substrate for electric wiring obtainable by using the above-mentioned insulating material for wiring board are also one of preferred embodiments in the present invention.

A small-angle X-ray scattering analysis may be used for determination of the above-mentioned radius of inertia of the above-mentioned inorganic microfine particle. In the small-angle X-ray scattering analysis, fluctuation of an electron density in a density uneven range changes a scattering movement at the time of X-ray irradiation, and therefore a particle size of 100 nm or less can be measured and in particular, a distribution state of primary particles in a dispersion medium can be comprehended as it is. Conventionally, in order to measure a particle size distribution of inorganic microfine particles, an optical method, in which inorganic microfine particles dispersed in a solvent at low concentration is irradiated with a laser beam, and then the particle size or distribution is measured from the scattering state, has been used, however, when the dispersion medium of the inorganic microfine particles is a resin, for example, the dispersion state is changed by solvent dilution. Therefore, how the inorganic microfine particles were dispersing in the resin cannot be accurately restaged. And a spectroscopic method, in which a specimen after shaping and hardening is used as an observation sample in SEM, TEM, and the like also has been used. The spectroscopy method is useful for comprehension of dispersion state after hardening, but there is a doubt about whether dispersion state of an observation area restages dispersion state of the whole cured body well since only observation of a small area is performed.

On the other hand, the small-angle X-ray scattering analysis has an advantage that dispersion state before hardening can be comprehended even if a resin is used as a dispersion medium. The measurement principle of the small-angle X-ray scattering analysis is briefly described. Generally, density, electronic state, and bonding pattern differ between a dispersion medium, which is an organic compound, and an inorganic microfine particle of nano size, and fluctuation of electron density occurs in an interface between the dispersion medium and the inorganic microfine particle. When monochromatic X-ray passes through a mixture having uneven density, the monochromatic X-ray is diffusely diffracted in an extremely small angular area (2θ=0 to 5°) to an incidence direction. An analysis of this diffraction intensity pattern shows size and shape of the area having uneven density, which can unveil morphology of organic/inorganic nanocomposite. When the particle size (size of the area having uneven density) is uniform, the scattering intensity is represented by the following formula (1) according to Guinier small angle scattering intensity formula.

[formula 1]

$$I(q) = I(0) \cdot \exp\left(\frac{-q^2 \cdot Rg^2}{3}\right) \quad (1)$$

$I(0)$: scattering intensity when $q = 0$ $Rg$: radius of inertia of particle in the formula 1, q represents a value determined by Fourier transform of a space mathematically, and represents a value ($Å^{-1}$) in proportion to an inverse of distance, and is represented by the following formula (2) as a function of a scattering angle.

[formula 2]

$$q = \left(\frac{4\pi}{\lambda}\right)\sin\left(\frac{2\theta}{2}\right) \quad (2)$$

π: Circular constant, λ: Wavelength of X-ray (Cu α rays: 1.54 Å), 2θ: Scattering angle The Guinier plot is a plot having $-q^2$ value of X-ray scattering intensity. A small angle scattering range means a range showing a rapid reduction of scattering strength by increase of scattering angle, and a width of the main peak is inversely proportional to a size of an area having uneven density, that is, a radius of inertia of a primary particle. Accordingly, increase and decrease movements of scattering intensity are applied to Funkuchen method, a tangent is drawn sequentially from a right end of the Guinier plot, and then radius of inertia and scattering intensity thereof are calculated from inclination of each tangent to determine a relative ratio of distribution of the radius of inertia of the primary particle from their intensity ratios.

As mentioned above, the above-mentioned inorganic microfine particle is preferably a hydrolysis condensation product of an alkoxide compound (preferably metal alkoxide) and/or a carboxylate compound (preferably metal carboxylate), and preferably a hydrolysis condensation product produced by sol-gel method. In this case, with respect to use amounts of the compound represented by the above-mentioned formula (1) and the compound represented by the above-mentioned formula (2), 80 parts by weight or more of the compound represented by the formula (1) are preferably used and 90 parts by weight or more are more preferably used to 100 parts by weight of a total amount of the compound represented by the formula (1) and the compound represented by the formula (2), from a viewpoint of improvement in flame retardancy and in affinity with an inorganic microfine particle obtained and other constituents of the above-mentioned resin composition in the case where the resin composition is used as the dispersion medium. When the above-mentioned hydrolysis condensation reaction is performed in presence of a polyhydric phenol, which is a dispersion medium, the inorganic microfine particle is stirred easier when the polyhydric phenol is diluted. Therefore, the above-mentioned hydrolysis condensation reaction is preferably carried out in presence of the above-mentioned solvent, and the inorganic microfine particle may be smoothly manufactured.

In the above-mentioned dispersing element of the inorganic microfine particle, the above-mentioned dispersion state is preferably maintained, but the dispersion medium is not especially limited as long as it is stably dispersed. As the dispersion medium, solid substances (for example, resin composition containing a resin having high molecular weight) may be also used in addition to a liquid substance at ordinary temperature (for example, 20° C.) like an organic solvent. As mentioned above, when the process (hydrolysis condensation), in which the inorganic microfine particle is produced, is performed, for example, in presence of the solid dispersion medium at ordinary temperature, the dispersion medium is appropriately diluted with a solvent, and the producing process of the inorganic microfine particle is performed, and then, if necessary, the solution for dilution may be volatilized.

When an organic solvent is used as the dispersion medium, examples of the organic solvent include fatty alcohols, such as methanol, ethanol, n-propanol, isopropanol, n-butanol, isobutanol, n-hexanol, cyclohexanol, n-octanol, n-decanol, and n-dodecanol; aromatic alcohols, such as phenol and phenyl ethyl alcohol; alcohols having heterocycles, such as n-hydroxyethylpyrolidone; alkyl alcohols having halogen atoms, such as pentafluoroethanol; aryl alcohols having halogen atoms, such as pentafluorophenol; monoethers of (poly)alkyleneglycol, such as (di)ethyleneglycol monomethylether, (di)ethylene glycol monoethylether, (di)ethylene glycol monobutylether, (di) propylene glycol monomethyl ether, polyethylene glycol nonylphenylether; and polyols, such as ethylene glycol, propylene glycol, and 1,3-propanediol. These organic solvents may be used singly or in combination of two or more of them. The dispersing element having the organic solvent as the dispersion medium may be used as a coating material, adhesives by further comprising a resin component dissolved.

On the other hand, a dispersing element having a shapeable resin composition as a dispersion medium is also one of the preferable embodiments in the present invention. By shaping such a dispersing element, a resin-shaped body (nanocomposite) in which an inorganic microfine particle is finely dispersed may be obtained. When the dispersion medium is the resin composition, the inorganic microfine particle is dispersed in the resin with maintaining the above-mentioned distribution state, and also maintains the dispersion state after shaping (or hardening). Therefore, a shaped body (or cured body) obtained has excellent moisture absorption resistance for the reason mentioned above, and furthermore has effect of nanocomposite with the inorganic microfine particle, that is, excellent flame retardancy and kinetic property. The resin composition is not especially limited as long as it is shapeable (capable of forming a solidification object having a shape), and used may be publicly known resin compositions, for example, thermosetting resin compositions, such as phenol, epoxy, and unsaturated polyester, or thermoplastic resin compositions, such as (meth)acryl, ABS, polyolefin, polyamide, and saturated polyester. A "resin composition" used herein means a mixture (composition) containing a resin and various additives, and a mixture containing only resin composition is also described as resin composition for convenience of explanation. The shaped body conceptually contains a cured body, and means an object having an unchanged shape at ordinary temperature. The cured body means an object shaped with a chemical hardening reaction among the shaped bodies. In addition, the shaped body and the cured body are also described generically as a shaped and cured body.

In order to sufficiently utilize the advantage that the above-mentioned shaped and cured body has both high level moisture absorption resistance and flame retardancy, a resin composition prepared for a material for encapsulating semiconductor and an insulating material for wiring board is preferably used as a dispersion medium. Accordingly, a resin composition comprising a resin excellent in electric insulation as a main component is preferably used, and a thermosetting resin, such as phenol, and epoxy, is suitable as such a resin. The above-mentioned resin composition as well as these resin composition may be applied to use other than a material for semiconductor encapsulating materials or an insulating material for wiring board.

As the above-mentioned resin contained in the resin composition, which is a dispersion medium, polyhydric phenols having high molecular weight may be preferably used. This polyhydric phenols include a phenol resin of resol type obtained by subjecting phenol to polycondensation, or a novolak type, and more conceptually means a compound group, and specifically polyhydric phenols having a structure in which two or more aromatic skeletons respectively having at least one phenol hydroxyl group is bonded to each other with an organic group having two or more carbon atoms therebetween.

The above-mentioned polyhydric phenols contain a large amount of $SP^2$ type electron orbits, since an aromatic skeleton is contained as an essential structure, and therefore the above-mentioned polyhydric phenols have a structure in which pyrolysis at the time of high temperature does not easily occur, and excellent flame retardancy. It is preferable that "an organic group having two or more carbon atoms" to bond aromatic skeletons having at least one phenol hydroxyl group contains an aromatic skeleton, such as benzene ring and naphthalene ring or an polycyclic cycloaliphatic skeleton, such as norbornene, since the flame retardancy and the heat resistance further increase.

The above-mentioned polyhydric phenols may be produced using a reaction raw material comprising a compound for forming an aromatic skeleton portion having at least one phenolic hydroxyl group (hereinafter, referred to as "aromatic skeleton-forming compound") and a compound for forming an organic group portion having two or more carbon atoms as an essential component.

With respect to the above-mentioned dispersing element, in the case where a dispersion medium containing polyhydric phenol and an epoxy resin is used, polyhydric phenols/epoxy resin (weight ratio) is preferably 30/70 to 70/30, and more preferably 35/65 to 65/35. When the mixing ratio of polyhydric phenols is less than 30, the flame retardancy may be insufficient, and when the mixing ratio of polyhydric phenols is more than 70, mechanical properties of a shaped and cured body formed may be reduced.

When any dispersion medium is used, an inorganic microfine particle is preferably dispersed so as to be 0.1 to 50% by weight to 100% by weight of a dispersion element (dispersion medium+inorganic microfine particle). More preferably, the lower limit of the inorganic microfine particle is preferably 0.5% by weight, and still more preferably 1.0% by weight. The upper limit of the inorganic microfine particle is preferably 40% by weight, and still more preferably 30% by weight. When the amount of the inorganic microfine particle is too high, the above mentioned good dispersion state may not be maintained, and when the amount of the inorganic microfine particle is low, the flame retardancy and the improvement effect in physical properties derived from nanocomposite may insufficiently exhibited. In the case where the dispersion medium is a resin composition, and the resin composition contains a solvent in producing a shaped and cured body, which is a final product, the solvent may be contained in the above-mentioned dispersion medium.

In the resin composition comprising two components of the present invention, it is preferred that a lower limit of an epoxy equivalent is 100 g/mol and an upper limit of an epoxy equivalent is 450 g/mol. More preferably, the lower limit is 120 g/mol and the upper limit is 420 g/mol, and furthermore preferably, the lower limit is 150 g/mol and the upper limit is 400 g/mol.

In the resin composition comprising three components of the present invention, it is preferred that a lower limit of an epoxy equivalent is 100 g/mol and an upper limit of an epoxy equivalent is 4000 g/mol. When the epoxy equivalent is less than 100 g/mol, a low dielectric characteristic may not be sufficiently exhibited, and when it is more than 4000 g/mol, heat resistance or moldability/formability may not be sufficient. More preferably, the lower limit is 120 g/mol and the upper limit is 3000 g/mol, and furthermore preferably, the lower limit is 150 g/mol and the upper limit is 2500 g/mol.

The viscosity at 25° C. or 60° C. of the above resin composition comprising two components preferably has a lower limit of 1200 mPa·s and an upper limit of 4200 mPa·s. More preferably, the lower limit is 1500 mPa·s and the upper limit is 4000 mPa·s, and furthermore preferably, the lower limit is 1800 mPa·s and the upper limit is 3800 mPa·s.

The viscosity at 25° C. or 60° C. of the above resin composition comprising three components preferably has a lower limit of 100 mPa·s and an upper limit of 1000000 mPa·s. More preferably, the lower limit is 150 mPa·s and the upper limit is 800000 mPa·s, and furthermore preferably, the lower limit is 200 mPa·s and the upper limit is 600000 mPa·s.

The above resin composition may further contain other components if necessary. As such other components, there are given, for example, a stabilizer, a releasing agent, a coupling agent, a coloring agent, a plasticizer, a diluent such as a solvent and a reactive diluent, an agent providing flexibility, various rubber materials, a photosensitive material, filler, a flame retardant and pigment. The use amount of these materials may be appropriately set within the limits in which the operational effect of the present invention is not sacrificed.

The resin composition of the present invention may be a cured formulation by curing it using a curing agent. As a curing agent, there may be used one or two or more of acid anhydrides such as methyltetrahydrophthalic anhydride, hexahydrophthalic anhydride, methylhexahydrophthalic anhydride, pyromellitic anhydride and methyl nadic acid; various phenolic resins such as phenolic novolac resin, cresol novolac resin, bisphenol A novolac resin, dicyclopentadiene phenolic resin, phenol aralkyl resin and terpene phenol resin; various phenolic resins such as polyhydric phenolic resin obtained by a condensation reaction of various phenols and various aldehydes such as hydroxybenzaldehyde, crotonaldehyde and glyoxal; $BF_3$ complex, sulfonium salts and imidazoles.

The use amount of the above curing agent is not particularly limited and it is preferable that, for example, this use amount has a lower limit of 0.05 parts by weight and an upper limit of 10 parts by weight with respect to 100 parts by weight of the resin composition of the present invention. More preferably, the lower limit is 0.01 parts by weight and the upper limit is 5 parts by weight.

In the above curing, a curing accelerator may be used and one or two or more of organic phosphorus compounds such as triphenylphosphine, tributylhexadecylphosphonium bromide, tributylphosphine and tris(dimethoxyphenyl)phosphine are preferable. In addition, the use amount of the curing accelerator may be appropriately set within the limits in which the operational effect of the present invention is not scarified.

Furthermore, as for curing conditions, the curing temperature preferably has a lower limit of 70° C. and an upper limit of 200° C. More preferably, the lower limit is 80° C. and the upper limit is 180° C. And, the curing time preferably has a lower limit of 1 hour and an upper limit of 15 hours. More preferably, the lower limit is 5 hours and the upper limit is 10 hours.

As the cured formulation obtained according to the above, there is given a shaped article such as a profile, and such shaped article formed using the resin composition of the present invention also constitutes the present invention. As the above cured formulation, there are given forms of film, sheet and pellet, and such cured formulation formed using the resin composition of the present invention also constitutes the preferable embodiment of the present invention.

The above resin composition is suitably used as materials for, for example, mechanical components, electric and electronic devices, components of vehicles, shipping and aircrafts, construction/building, molding/forming, and coatings and adhesives. Among others, it is particularly useful as a material for molding/forming and a molding/forming material formed by using the above resin composition also constitutes a preferable embodiment of the present invention.

The above resin composition is suitably used for a material for encapsulating semiconductor, a printed wiring board, a build-up type wiring board, a solder resist, a laminate plate, a material for a light-emitting diode (LED), a sealing material for a liquid crystal display or organic electroluminescence display (organic ELD), a material for semiconductor devices, a material for civil works such as fiber reinforced plastics (FRP), a casting material, an adhesive and a material of an electric insulating coating material, and a semiconductor device or a printed wiring board composed of the cured formulation formed using the resin composition of the present invention also constitutes the present invention.

In the resin composition of the present invention, the publicly known non-halogen, non-antimony fire retardant agents may be concomitantly used. For example, nitrogen-containing compounds such as cyanuric acid derivatives, isocyanuric acid derivatives and the like, phosphorus/nitrogen-containing compounds such as cyclophosphazenes, and metal compounds such as zinc oxide, iron oxide, molybdenum oxide, ferrocene and the like may be mentioned.

For the purpose of improving the moisture resistance and working stability at elevated-temperature of IC and other semiconductor elements, an anion exchanger may also be added. The anion exchanger is not particularly limited but the publicly known substances may be used. For example, hydrotalcites and the hydrous oxide of an element selected from among magnesium, aluminum, titanium, zirconium, and bismuth may be mentioned, and these may be used each independently or in combination of two or more of them. Among these, hydrotalcites of the following formula (3) are preferred:

$$Mg_{1-X}Al_X(OH)_2(CO_3)_{X/2}\cdot yH_2O \quad (3)$$

wherein $0<X\leq0.5$; and y is a positive integer.

In the resin composition of the present invention, there may optionally be incorporated such other additives as a mold release, e.g. higher fatty acids, metal salts of higher fatty acids, ester type waxes, polyolefin type waxes, polyethylene, polyethylene oxide; a colorant, e.g. carbon black; and a stress reliever, e.g. silicone oil, silicone rubber powder.

For use of the resin composition of the present invention as a sealing material, any technique may be used for preparation provided that the various raw materials can be uniformly dispersed and admixed; however, as a common practice, a method comprising thoroughly blending the predetermined formulating amounts of raw materials with a mixer or the like, melt-kneading the blend with a mixing roll, an extruder, or the like, and crushing the kneaded weight after cooling may be mentioned. Tableting size and weight contribute compatible to the molding conditions.

The electronic component obtainable by encapsulating elements with the resin composition of the present invention includes electronic components manufactured by mounting various elements, i.e. active elements such as semiconductor chips, transistors, diodes, thyristers and passive elements such as capacitors, resistors, coils on various supporting members such as lead frames, wired tape carriers, wiring boards, glass sheets, silicon wafers, and sealing the necessary portions with the resin composition according to the present invention As such electronic components, there may be mentioned ordinary resin-sealed ICs, such as DIP (dual inline package), PLCC (plastic leaded chip carrier), QFP (quad flat package), SOP (small outline package), SOJ (small outline J-lead package), TSOP (thin small outline package), TQFP (thin quad flat package), which are obtainable by fixing semiconductor devices on a lead frame, connecting terminal means, such as the bonding pad, of the devices to the leads by wire bonding or by means of a vamp and sealing the assembly with the resin composition of the present invention by transfer molding or the similar technique; the TCP (tape carrier package) obtainable by sealing the semiconductor chips connected to a tape carrier through a vamp with the resin composition of the present invention; the COB (chip on board) module, hybrid IC, or multi-chip module, which is obtainable by connecting active devices, such as semiconductor chips, transistors, diodes, thyristers and/or passive devices such as capacitors, resistors, coils to the conductors formed on a wiring board or glass substrate by wire bonding, flip chip bonding or soldering, and sealing the assembly with the resin composition of the present invention; and BGA (ball grid array), CSP (chip size package) or the like which is obtainable by mounting devices on the surface of an organic substrate formed with terminal means for wiring board connection on the reverse side, connecting the devices to the conductors of the organic substrate through a vamp or by wire bonding, and sealing the assembly with the resin composition of the invention. Referring to the sealing method of devices with the resin composition of the present invention low-pressure transfer molding is the most common method but injection molding or compression molding, for instance, may also be used.

The resin composition of the present invention may be also used as a LED encapsulating material, which is a sealing material of compound semiconductors. The application of the resin composition of the present invention as a LED encapsulating material is described in the followings.

It is preferable to blend an antioxidant into the epoxy resin composition for LED encapsulating material of the present invention and to prevent oxidative deterioration at the time of heating, and to form a curing formulation having few colored. As antioxidants, phenol, sulfur and phosphate antioxidants may be used, and 0.01 to 10 parts by weight of the antioxidant in 100 parts by weight of the epoxy resin composition is mixed with. Examples of the antioxidant which may be used may be mentioned in the following antioxidants.

Monophenols: 2,6-di-tert-butyl-p-cresol, butylated hydroxyanisole, 2,6-di-tert-butyl-p-ethylphenol, stearyl-β-(3,5-di-tert-butyl-4-hydroxyphenyl)propionate; Bisphenols: 2,2'-methylene bis (4-methyl-6-tert-butylphenol), 2,2'-methylene bis(4-ethyl-6-tert-butylphenol), 4,4'-thiobis(3-methyl-6-tert-butylphenol), 4,4'-butylidenebis(3-methyl-6-tert-butylphenol), 3,9-bis[1, 1-dimethyl-2-{β-(3-tert-butyl-4-hydroxy-5-methylphenyl)prop ionyloxy}ethyl]-2,4,8,10-tetraoxaspiro[5,5]undecane;

High molecular weight phenols: 1,1,3-tris(2-methyl-4-hydroxy-5-tert-butylphenyl)butane, 1,3,5-trimethyl-2,4,6-tris(3,5-di-tert-butyl-4-hydroxybenzyl)benzene, tetrakis-[methylene-3-(3',5'-di-tert-butyl-4'-hydroxyphenyl)propionate] methane, bis[3, 3'-bis-(4'-hydroxy-3'-tert-butylphenyl) buthylic acid] glycol ester, 1,3,5-tris(3',5'-di-tert-butyl-4'-hydroxybenzyl)-sec-triazine-2,4,6-(1H, 3H, 5H)trione, tocophenol.

The following compounds are preferably used as sulfur antioxidants.

dilauryl-3,3'-thiodipropionate, dimyristyl-3,3'-thiodipropionate, and distearyl-3,3'-thiodiopropionate.

The following compounds are preferably used as phosphate antioxidants.

Phosphates: triphenyl phosphate, diphenyl isodecyl phosphate, phenyl diisodecyl phosphate, tris(nonylphenyl) phosphate, diisodecyl pentaerythritol phosphate, tris(2,4-di-tert-butylphenyl)phosphate, cyclic neopentane tetraylbis(octadecyl)phosphate, cyclic neopentane tetraylbis(2,4-di-tert-butylphenyl) phosphate, cyclic neopentane tetraylbis(2,4-di-tert-butyl-4-methylphenyl)phosphate, bis[2-tert-butyl-6-methyl-4-{2-(octadecyl oxycarbonyl) ethyl}phenyl]hydrogene phosphate; Oxaphosphaphenanthrene oxides: 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, 10-desiloxy-9,10-dihydro-9-oxa-10-phosphaphenanthrene-10-oxide. These antioxidants may be used each singly, but it is especially preferably that phenol/sulfur antioxidants, or phenol/phosphate antioxidants is used in combination.

The resin composition of the present invention may be used as a mixture of an ultraviolet absorber. Such embodiment of containing the ultraviolet absorber may preferably be used when the resin composition of the present invention is used as a LED encapsulating material.

Into the resin composition 100 parts by weight of the present invention, 0.01 to 10 parts by weight of the ultraviolet absorber is blended, and lightfastness can be further improved. As the ultraviolet absorption agent which may be blended, common ultraviolet absorption for plastic may be used, and the following are mentioned as an example.

Salicylic acids, such as a phenyl salicylate, p-tert-butylphenyl salicylate, and p-octylphenyl salicylate; benzophenones, such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, and 2-hydroxy-4-methoxy-5-sulfobenzophenone; benzotriazols, such as 2-(2'-hydroxy-5'-methylphenyl)benzotriazol, 2-(2'-hydroxy-5'-tert-butylphenyl)benzotriazol, 2-(2'-hydroxy-3',5'-di-tert-butylphenyl)benzotriazol, 2-(2'-hydroxy-3'-tert-butyl-5'-methylphenyl)-5-chlorobenzotriazol, 2-(2'-hydroxy-3',5'-di-tert-butylphenyl)-5-chlorobenzotriazol, 2-(2'-hydroxy-3',5'-di-tert-amylphenyl)benzotriazol, and 2-{(2'-hydroxy-3',3",4",5,",6"-tetrahydrophthalimido methyl)-5'-methyl phenyl}benzotriazol; hindered amines, such as bis(2,2,6,6-tetramethyl-4-piperidyl)sebacate, bis(1,2,2,6,6-pentamethyl-4-piperidyl)sebacate, bis(1,2,2,6,6-pentamethyl- 4-piperidyl) [{3,5-bis(1,1-dimethylethyl)-4-hydroxyphenyl}methyl]butylmalonate.

The following component (optional component) may be additionally blended with the epoxy resin composition of the present invention if needed. These optional components are blended at a ration of 0.01 to 30 parts by weight to the resin composition of the present invention 100 parts by weight.

(1) powdered reinforcing agents and fillers: for example, metal oxides, such as aluminum oxide and magnesium oxide; silicon compounds, such as impalpable powder silica, fused silica, and crystal silica; transparent fillers, such as a glass bead; metal hydroxide, such as aluminum hydroxide; kaolin, mica, ground quartz, graphite, and molybdenum disulfide. Any amount of these substances are blended as long as transparency of the epoxy composition of the present invention is not decreased, and 10 to 100 parts by weight of them to 100 parts by weight of the composition of the present invention is preferably used. These combinations can reduce emission or loss of light receiving of optical semiconductor element caused by light scattering, light shielding and the like of particles.

In the present invention, a fluorescent substance is added to a translucency resin and a dispersing agent may be further contained. As specific dispersing agents, barium titanate, titanium oxide, aluminum oxide, silicon oxidize, calcium carbonate and the like are preferably used. Organic dispersing agents, such as a melamine resin, a CTU guanamine resin, and a benzoguanamine resin, may also be used. A light emitting diode having good directional characteristics may be constituted by containing the above-mentioned agents. The term "dispersing agent" used herein means that having a central particle diameter of 1 nm or more and less than 5 μm. The dispersing agent having a central particle diameter of 1 μm or more and less than 5 μm is preferred, since the dispersing agent effectively can reflect light from an LED chip and a fluorescent substance and suppress color unevenness produced by using a fluorescent substance having a large particle size. And use of the dispersing agent can more narrow a half band width of an emission spectrum, and a light emitting diode with high color purity may be obtained.

On the other hand, a dispersing agent having a central particle diameter of 1 nm or more and less than 1 μm has a low effect of interference of light from a LED chip, but can increase a resin viscosity without reducing a light intensity. Therefore, using this dispersing agent, when a depression part of a package is filled with the resin by potting and the like, it becomes possible to disperse a fluorescent substance in the resin almost uniformly, and to maintain the state in a syringe. And, even if a large particle size of a fluorescent substance is used, which is relatively difficult to handle, production with sufficient yield may be achieved. As mentioned above, the dispersing agent in the present invention exhibits a different effect depending on the particle size range, and the dispersant may be used selectively or in combination depending on use.

In order to obtain a good dresser effect in a dicing process, a filler having a large particle size is preferably contained. When a filler having a central particle size of 15 μm to 50 μm, preferably 20 μm to 50 μm are contained in a translucency resin, a blinding of a dicing blade may be effectively recovered, and an excellent dresser effect may be obtained.

(2) Colorants or pigments, such as titanium dioxide, molybdate orange, Prussian blue, ultramarine blue, cadmium yellow, cadmium red, and organic coloring matter.

In the present invention, a light emitting diode may also be constituted by mixing a fluorescent substance into a resin composition. A high-output light emitting diode may be constituted also by containing a fluorescent substance consisting of a fluorescent substance with a large particle size and a fluorescent substance with a small particle size. A pigment may be contained with the fluorescent substance.

(3) Ion adsorbents (4) Coupling agents (5) polyhydric alcohols or polycondensations thereof.

Polyhydric alcohols or polycondensations thereof 0.1 to 5.0 equivalent may be included to total number of mole of the epoxy group and the glycidyl group. Examples of the polyhydric alcohols used include ethylene glycol, diethylene glycol, trimethylene glycol, triethylene glycol, propylene glycol, 1,4-butanediol, 1,6-hexanediol, glycerol, trimethylolpropane, pentaerythritol, dipentaerythritol. A flexibility of an epoxy resin composition obtained may be further improved by adding these polyhydric alcohols or polycondensations thereof.

(6) Various curable monomers, oligomers, and synthetic resins may be further blended in order to improve properties of an epoxy curing formulation. For example, diluents for epoxy resins, such as aliphatic epoxy, diol or triols, vinyl ethers, an oxetane compound, a fluororesin, an acrylate resin, a silicone resin may be used singly or in combination of two or more of them. The blending ratio of these compounds and resins are preferably 50 parts by weight to 100 parts by weight of the composition of the present invention, so that the original property of the epoxy resin composition of the present invention is not sacrificed, the blending ratio thereof is.

A light emitting element sealed is not particularly limited when the resin composition of the present invention is used as LED encapsulating material. A element which emits light relatively short wavelength having a peak wavelength of 350 to 550 nm is preferably used as a light emitting element sealed, since the resin composition of the present invention is excellent in lightfastness. As such a light emitting element, group III nitride compound semiconductor formed by metal organic chemical vapor deposition method (MOCVD method), molecular beam crystal elongation method (the MBE method), or halide vapor phase elongation method (HVPE method) may be mentioned, and the light emitting element is represented by $Al_XGa_YIn_{1-X-Y}N$ ($0 \leq X \leq 1$, $0 \leq Y \leq 1$, $0 \leq X+Y \leq 1$) as a formula, and includes what is called binary group III nitride compound semiconductor, that is, $Al_XGaN$, and InN, and what is called ternary group III nitride compound semiconductor, that is, $Al_XGa_{1-X}N$, $Al_XIn_{1-X}N$, and $Ga_XIn_{1-X}N$ (in the above, $0 \leq X \leq 1$). As a structure of the semiconductor, homostructure having MIS junction, PIN junction, pn junction or the like, heterostructure, or double heterostructure may be mentioned. Various luminous wavelengths may be chosen depending on a material used for semiconductor layer or mixed crystal degree thereof. A single quantum well structure or a multiple quantum well structure having a semiconductor active layer formed on a thin film in which a quantum effect is produced may be used. The optical semiconductor element according to the present invention is an optical semiconductor element comprising at least one pair of lead electrodes, an optical semiconductor chip electrically connected to the lead electrode, and a mold resin sealing the optical semiconductor chip, the mold resin being formed by curing the epoxy resin composition according to the present invention. Accordingly, an optical semiconductor element in which reduction in emission or efficiency of light receiving caused by yellowing of mold resin, and chip damage or wire breakage by heat cycle is hard to produce may be obtained.

The resin composition of the present invention may be used as a sealing material such as a semiconductor encapsulating material. The application of the resin composition of the present invention as an encapsulating material is described in the following. In the resin composition of the present invention, inorganic filler may be incorporated for reduction of humid absorption and coefficient of thermal expansion, enhancement of heat conductivity, and enhancement of strength. The inorganic filler includes powdery fillers such as fused silica, crystalline silica, alumina, calcium silicate, calcium carbonate, potassium titanate, silicon carbide, silicon nitride, aluminum nitride, boron nitride, beryllia, zirconia, zircon, forsterite, steatite, spinel, mullite, titania, beads as spheriform versions thereof, glass fibers, and so forth. Furthermore, as inorganic fillers having fire retardant effects, aluminum hydroxide, magnesium hydroxide, zinc borate, zinc molybdate and the like may be mentioned. These inorganic fillers may be used each independently or in combination of two or more of them. Among the inorganic fillers mentioned above, fused silica is preferred for reducing a coefficient of thermal expansion and alumina is preferred because of its high heat conductivity. The morphology of the filler is preferably spheriform because of its molding flowability and abrasiveness of a mold. In terms of moldability, hygroscopicity, reduction of a coefficient of thermal expansion and enhancement of strength, the formulating amount of the inorganic filler based on 100 parts by weight of the resin composition of the present invention is preferably 70 parts by weight or more, more preferably 100 to 1000 parts by weight, still more preferably 200 to 950 parts by weight. When it is less than 70 parts by weight, reflow resistance tends to be decreased. When it exceeds 950 parts by weight, fluidity tends to be insufficient.

The electrical wiring board may be obtained by preparing a wiring board insulation material obtained by adding, if needed, diluted solvent, cure accelerator, filler, fire retardant agent, and the like to the resin composition of the present invention, immersing a suitable reinforcement or coating a suitable substrate with it, drying the material to remove the solvent, and curing the resin. Such an electrical wiring board includes one-sided, double-sided, or multi-layered composite laminate board, a glass epoxy type laminate board, an aramid epoxy type laminate board, a metal base wiring board, a built-up type wiring board and the like.

The above-mentioned solvent, cure accelerator, filler, fire retardant agent and reinforcement, which can be preferably used in the sealing method of devices or producing an electrical wiring board with the resin composition of the present invention are described in the following.

The solvent mentioned above is preferably a compound containing at least one structure selected from the group consisting of ether bond, ester bond, and nitrogen atom, and in order that the optimum viscosity may be obtained for immersing or coating, or depending on the drying conditions to be used, such compounds may be used each independently or as a mixture of two or more of them.

As the above compound having an ether bond, the following compounds may be used with advantage: for example, diethyl ether, dipropyl ether, diisopropyl ether, dibutyl ether, dihexyl ether, ethyl vinyl ether, butyl vinyl ether, anisole, phenetol, butyl phenyl ether, pentyl phenyl ether, methoxytoluene, benzyl ethyl ether, diphenyl ether, dibenzyl ether, veratrole, propylene oxide, 1,2-epoxybutane, dioxane, trioxane, furan, 2-methylfuran, tetrahydrofuran, tetrahydropyran, cineole, 1,2-dimethoxyethane, 1,2-diethoxyethane, 1,2-dibutoxyethane, glycerin ethers, crown ethers, methylal, acetal, methyl cellosolve, ethyl cellosolve, butyl cellosolve, ethylene glycol monopropyl ether, ethylene glycol monohexyl ether, ethylene glycol dimethyl ether, diethylene glycol, diethylene glycol methyl ether, diethylene glycol ethyl ether, diethylene glycol butyl ether, diethylene glycol dimethyl ether, diethylene glycol diethyl ether, diethylene glycol dibutyl ether, triethylene glycol, triethylene glycol monomethyl ether, tetraethylene glycol, 1-methoxy-2-propanol, 1-ethoxy-2-propanol, propylene glycol methyl ether, propylene glycol dimethyl ether, propylene glycol propyl ether, propylene glycol butyl ether, dipropylene glycol, dipropylene glycol monomethyl ether, dipropylene glycol monoethyl ether, dipropylene glycol dimethyl ether, dipropylene glycol diethyl ether, dipropylene glycol dibutyl ether, tripropylene glycol, tripropylene glycol monomethyl ether, 2-methoxyethanol, 2-ethoxyethanol, 2-(methoxymethoxy)ethanol, 2-isopropoxyethanol, 2-butoxyethanol, 2-(isopentyloxy)ethanol, 2-(hexyloxy)ethanol, 2-phenoxyethanol, 2-(benzyloxy)ethanol, furfuryl alcohol, tetrahydrofurfuryl alcohol.

As the above-mentioned compound having an ester bond, the following compounds are suitable: for example, methyl formate, ethyl formate, propyl formate, butyl formate, isobutyl formate, pentyl formate, methyl acetate, ethyl acetate, propyl acetate, isopropyl acetate, butyl acetate, isobutyl acetate, sec-butyl acetate, pentyl acetate, isopentyl acetate, 3-methoxybutyl acetate, sec-hexyl acetate, 2-ethylbutyl acetate, 2-ethylhexyl acetate, cyclohexyl acetate, benzyl acetate, methyl propionate, ethyl propionate, butyl propionate, isopentyl propionate, ethylene glycol monoacetate, diethylene glycol monoacetate, monoacetin, diacetin, triacetin, monobutyrin, dimethyl carbonate, diethyl carbonate, dipropyl carbonate, dibutyl carbonate, butyric esters, isobutyric esters, isovaleric esters, stearic esters, benzoic esters, esters cinnamates, abietic esters, adipic esters, γ-butyrolactones, oxalic esters, malonic esters, maleic esters, tartaric esters, citric esters, sebacic esters, phthalic esters, ethylene diacetate.

As the above-mentioned compound containing a nitrogen atom, the following compounds are suitable: for example, nitromethane, nitroethane, 1-nitropropane, 2-nitropropane, nitrobenzene, acetonitrile, propionitrile, succinonitrile, butyronitrile, isobutyronitrile, valeronitrile, benzonitrile, α-tolunitrile, formamide, N-methylformamide, N,N-dimethlformamide, N,N-diethylformamide, acetamide, N-methylacetamide, N,N-dimethylacetamide, N,N-diethylacetamide, 2-pyrrolidone, N-methylpyrrolidone, ε-caprolactam.

As the above-mentioned having a plurality of structures selected from the group consisting of ether bond, ester bond, and nitrogen atom, the following compounds are suitable: for example, N-ethylmorpholine, N-phenylmorpholine, methyl cellosolve acetate, ethyl cellosolve acetate, propyl cellosolve acetate, butyl cellosolve acetate, phenoxyethyl acetate, diethylene glycol monomethyl ether acetate, diethylene glycol monoethyl ether acetate, diethylene glycol monopropyl ether acetate, diethylene glycol monobutyl ether acetate, propylene glycol methyl ether acetate, propylene glycol ethyl ether acetate, propylene glycol propyl ether acetate, propylene glycol butyl ether acetate, dipropylene glycol methyl ether acetate, dipropylene glycol ethyl ether acetate, dipropylene glycol propyl ether acetate, dipropylene glycol butyl ether acetate, tripropylene glycol methyl ether acetate.

The use amount of the above compound having at least one structure selected from the group consisting of ether bond, ester bond, and nitrogen atom is preferably 5 parts by weight or more and 1000 parts by weight or less based on 100 parts by weight of the resin composition. The more preferred range is 10 parts by weight and 300 parts by weight or less.

Suitable examples of the above curing accelerator are imidazole compounds such as 2-methylimidazole, 2-ethyl-4-methylimidazole; amines such as 2,4,6-tris(dimethylaminomethyl)phenol, benzylmethylamine, 1,8-diazabicylo[5.4.0]-7-undecene (DBU), 3-(3,4-dichlorophenyl)-1,1-dimethylurea (DCMU); and organophosphorus compounds such as tributyl phosphine, triphenyl phosphine, and tris(dimethoxyphenyl) phosphine. As to the filler and fire retardant agent mentioned above, the same substances as those described above for the material for encapsulating semiconductor may be employed.

As the above reinforcement, any known reinforcement material may be used; thus inorganic fibrous materials such as woven and nonwoven fabrics of N type, NE type, S type, T type, D type and other glass fibers, quartz, as well as organic materials may be mentioned. These may be such as glass roving, glass cloth, chopped glass strand, hollow glass fiber, glass mat, glass-surfaced mat, nonwoven glass cloth, ceramic webs (woven fabric and the like), and metal fiber webs. In addition, synthetic organic reinforcing fillers (reinforcing organic fiber material) for such as organic polymers capable of forming filaments may also be employed in the practice of the present invention. As representative examples of the reinforcing organic fiber material, there may be mentioned poly (etherketones), polyimidobenzoxazole, poly(phenylene sulfide), polyesters, aromatic polyamides, aromatic polyimides, polyetherimides, acrylic resins, and poly(vinyl alcohol). Fluoropolymers such as polytetrafluoroethylene may also be used in the practice of the present invention. The reinforcement further includes natural organic fibers known to those skilled in the art, such as cotton cloth, linen cloth, felt, carbon cloth, natural cellulose webs such as kraft paper, cotton paper, and glass fiber-reinforced paper. Such reinforcing fillers may be provided in the monofilament or multi-filament mode, and may be used each independently or in combination with other types of fiber, by co-weaving or in the core/shell, side-by-side, orange-type, or matrix-fibril, and other constructions known to those skilled in textile production. Such fillers may be supplied in various modes such as woven fiber-reinforcement, nonwoven fiber reinforcement, or paper. Among them, woven and nonwoven fabrics of glass fiber or polyaramid fiber are particularly suitable. These materials may be used each independently or in combination of two or more of them.

In addition, the above-mentioned dispersing element are effectively used for a wiring board (board for electrical wiring) for one-sided, double-sided, or multi-layered composite laminate boards, such as a built-up type or a composite type laminate board, a glass epoxy type laminate board, an aramid epoxy type laminate board, a metal base wiring board.

The resin composition of the present invention may be preferably used as a raw material for the production of epoxy resins, as a molding material for shaped formulations such as architectural members, various housings, laminate boards, built-up type circuit boards, solder resists, sealing materials (specifically, sealing materials for semiconductor), various castings, machine components, electronic/electric components, road vehicles, ships, aircraft, or as a raw material for the production of adhesives or electrically insulating paints, for instance.

As for a method for producing the resin composition of the present invention, a method of addition of respective components and a method for mixing respective components are not particularly limited as long as the above resin composition comprising two components or three components is obtained. For example, as a method for producing the resin composition comprising two components, there is preferably employed a producing method comprising the step of hydrolyzing/condensing metal alkoxide and/or metal carboxylate by charging water in presence of a compound having at least one of a glycidyl group and/or an epoxy group, wherein an organic metal compound is added in this hydrolyzing/condensing step. Thus, a method for producing a resin composition containing a compound having at least one of a glycidyl group and/or an epoxy group and an inorganic microfine particle, the method for producing comprising a step of hydrolyzing/condensing metal alkoxide and/or metal carboxylate by charging water in presence of the compound having at least one of a glycidyl group and/or an epoxy group, and in the hydrolyzing/condensing step, an organic metal compound containing one or more element selected from the group consisting of Zn, B, Al, Ga, In, Ge, Pb, P, Sb and Bi being added, and a compound being solid at 25° C. being used in the case of containing an aromatic moiety having at least one of a glycidyl group and/or an epoxy group and a compound being solid or liquid at 25° C. being used in the case of not containing an aromatic moiety also constitutes the present invention.

As a method for producing the resin composition comprising three components, a producing method comprising a step of mixing a phenolic compound containing inorganic microfine particles and a compound containing at least one of a glycidyl group and/or an epoxy group, containing inorganic microfine particles, is particularly suitably employed. Since this method leads to mixing two compounds in a state that the inorganic microfine particles are sufficiently dispersed and/or dissolved in two compounds, respectively, the content of the inorganic microfine particle in the whole resin composition can be increased by a large amount and a peculiar property resulting from an inorganic microfine particle can be exhibited more sufficiently. Specifically, the coefficient of thermal expansion is significantly reduced and it become possible to obtain cured formulations having particularly excellent insulating property and thermal shock resistance. Thus, a method for producing a resin composition comprising three components of a phenolic compound, a compound containing at least one of a glycidyl group and/or an epoxy group and an inorganic microfine particle, the method comprising a step of mixing the phenolic compound containing the inorganic microfine particle and a compound containing at least one of the glycidyl group and/or an epoxy group containing the inorganic microfine particle, also constitutes the present invention.

In the above method for producing the resin composition comprising three components, a method for mixing a phenolic compound containing an inorganic microfine particle and a glycidyl group- and/or an epoxy group-containing compound containing an inorganic microfine particle is not particularly limited and an ordinary method may be employed, and the weight ratio between these compounds is not particularly limited. Also, a method for adding these compound is not particularly limited and any of methods such as adding dropwise, charging dividedly, charging by one operation and post-mixing may be employed. In addition, other components described above may have been contained in these compounds in advance or may be added after mixing these compounds.

A preferable embodiment of the resin composition obtained by the above producing method is as described above.

In the above producing method, the phenolic compound containing an inorganic microfine particle preferably takes a form in which inorganic microfine particles are dispersed and/or dissolved in the phenolic compound. As a method for producing this form, there are suitably employed, for example, (1) a method for mixing a phenolic compound and inorganic microfine particles after having produced the phenolic compound and the inorganic microfine particles, respectively, (2) a method for mixing the inorganic microfine particles by producing a phenolic compound and hydrolyzing/condensing an alkoxide compound and/or a carboxylate compound in a solution containing the phenolic compound to obtain inorganic microfine particles in the phenolic compound, and (3) a method for hydrolyzing/condensing an alkoxide compound and/or a carboxylate compound in a solution containing a reaction material for the phenolic compound and then producing a phenolic compound. Among others, the method of (2) or (3) is preferred. By employing such producing methods, a composite of the phenolic compound and the inorganic microfine particle is formed and it becomes possible to obtain a resin composition which is an organic-inorganic hybrid (composite) in a state that the inorganic microfine particles such as silicon oxide microfine particles are dispersed in a fine-grained state in the phenolic compound being a matrix. The organic-inorganic hybrid thus obtained exhibits an excellent flame retardancy.

The phenolic compound containing an inorganic microfine particle may also be produced by adding the phenolic compound and the inorganic microfine particle to a compound obtained by the hydrolysis condensation reaction step in the above producing method (2) or (3) and mixing them.

In the producing method shown in the above (2), as described above, a phenolic compound is first produced and a solution containing the phenolic compound is prepared. Next, into the solution, an alkoxide compound and/or a carboxylate compound, and water or a solvent containing water are charged to perform a hydrolysis condensation reaction. A sol-gel method is preferred.

As the above solution containing the phenolic compound, among various solvents described above, alcohols such as methanol and ethanol; ketones such as acetone and 2-butanone; and substances obtained by dispersing/dissolving a phenolic compound in a hydrophilic organic solvents such as tetrahydrofuran, dimethylformamide and pyridine. And, other solvents may be added, if needed. In addition, the use amount of the solvent preferably has a lower limit of 5 parts by weight and an upper limit of 500 parts by weight with respect to 100 parts by weight of the phenolic compound. More preferably, the lower limit is 20 parts by weight and the upper limit is 200 parts by weight.

Furthermore, as for reaction conditions of hydrolysis condensation in the above method for producing, the reaction temperature preferably has, for example, a lower limit of 0° C. and an upper limit of 120° C. More preferably, the lower limit is 20° C. and the upper limit is 80° C. The reaction time preferably has a lower limit of 30 minutes and an upper limit of 24 hours. More preferably, the lower limit is 1 hour and the upper limit is 12 hours.

In the producing method shown in the above (3), first, a solution, containing a compound to form an aromatic skeleton and/or a compound to form an organic skeleton, described above, which are reaction materials for a phenolic compound, is prepared, and into this solution, an alkoxide compound and/or a carboxylate compound, and water or a solvent containing water are charged to perform a hydrolysis condensation reaction to obtain a reaction material solution for a phenolic compound in which the above inorganic microfine particles are dispersed. A sol-gel method is preferred. Next, a phenolic compound is synthesized according to the reaction conditions described above.

As a solvent and a use amount of a solvent which are used for the above solution containing the reaction material for a phenolic compound, the same one as described in the producing method of the above (2) may be employed and reaction conditions of the hydrolysis and the condensation are the same as shown in above method (2).

In the phenolic compound containing an inorganic microfine particle, the content of the inorganic microfine particle suitably has a lower limit of 3% by weight and an upper limit of 80% by weight with respect to 100% by weight of the total amount of the phenolic compound containing an inorganic microfine particle. When this content is less than 3% by weight, the content of the inorganic microfine particle in the whole resin composition may not be sufficiently increased for a cured formulation to exhibit excellent insulating property and thermal shock resistance, and when it is more than 80% by weight, a handling property could be insufficient to improve the moldability/formability. More preferably, the lower limit is 5% by weight and the upper limit is 50% by weight.

In the above method for producing the resin composition comprising two components or three components of the present invention, the glycidyl group- and/or the epoxy group-containing compound containing inorganic microfine particles preferably takes the form in which the inorganic microfine particles are dispersed and/or dissolved in the glycidyl group- and/or the epoxy group-containing compound. As a method for producing this form, there are suitably employed, for example, (1) a method for mixing a glycidyl group- and/or an epoxy group-containing compound and inorganic microfine particles after having produced the glycidyl group- and/or the epoxy group-containing compound and the inorganic microfine particles, respectively, and (2) a method for mixing the inorganic microfine particle by hydrolyzing/condensing an alkoxide compound and/or a carboxylate compound through charging water in presence of a glycidyl group- and/or an epoxy group-containing compound to obtain inorganic microfine particles. Among others, the method of (2) is preferred, and by employing this method, it becomes possible to homogeneously and finely disperse the inorganic microfine particles in a fine-grained state in the glycidyl group- and/or the epoxy group-containing compound.

The above glycidyl group- and/or the epoxy group-containing compound containing inorganic microfine particles may also be produced by adding the glycidyl group- and/or the epoxy group-containing compound and the inorganic microfine particle to a compound obtained by the hydrolysis condensation reaction step in the above producing method (2) and mixing them.

In the producing method shown in the above (2), water is used and it is preferable to react by adding water in an amount of from 10 parts by weight (lower limit) to 50 parts by weight (upper limit) with respect to 100 parts by weight of the alkoxide compound and/or the carboxylate compound. More preferably, the lower limit is 20 parts by weight and the upper limit is 40 parts by weight.

As water used in the above reaction, any of ion-exchanged water and pH-adjusted water may be used, but water having a pH of about 7 is preferably used. By using such water, it become possible to reduce ionic impurities in the composition and to form a resin composition having low hygroscopicity or high insulating.

A usage pattern of the above water may be a pattern of adding water dropwise to the alkoxide compound and/or the carboxylate compound or a pattern of charging water by one operation.

In the above hydrolysis condensation step in the producing method of the above (2), it is preferable to use an organic metal compound containing one or more element selected from the group consisting of Zn, B, Al, Ga, In, Ge, Pb, P, Sb and Bi as a catalyst. Such an organic metal compound preferably has a hydrolytic property and is more preferably a compound which will be incorporated into a skeleton of the inorganic microfine particle or a crystal lattice after being hydrolyzed. For example, when the inorganic compound is silica, when pH adjustment is carried out by using an acid/alkali compound as a hydrolysis condensation catalyst, the acid/alkali compound remains in the composition as ionic impurities, and thereby intrinsic low hygroscopicity and insulating property of the composition may be sacrificed. On the other hand, when using the above organic metal compound, since ionic impurities are absorbed in a siloxane crosslinking structure during dispersing silica and do not occur the deterioration of the physical properties caused by remaining of ionic impurities after preparing the resin composition, and the resin composition may be used in the application fields equivalent to those of a conventional epoxy resin.

As the above organic metal compound, for example, compounds like the following are suitable.

Organic zinc compounds: zinc acetate dihydrate, zinc (meth)acrylate, zinc octenate, zinc oxalate dihydrate, zinc methoxyethoxide, zinc neodecanoate, undecanoic acid zinc, zinc bis(bis(trimethylsilyl)amid), zinc dibutyldithio carbamate, zinc diethyldithio carbamate, zinc dimethyldithio carbamate, zinc N,N'-dimethylaminoethoxide, zinc 8-hydroxyquinolinate, zinc 2,4-pentanedionate, zinc 2,2,6,6-tetramethyl-3,5-heptanedionate.

Organic boron compounds: boratoleine, boron aryloxide, boron-n-butoxide, boron-tert-butoxide, boron ethoxide, boron isopropoxide, boron methoxide, boron methoxyethoxide, boron-n-propoxide, tris(trimethylsiloxy)boron, boron vinyldimethylsiloxide, and diphenylborane 8-hydroquinolinate.

Organic aluminum compounds: aluminum, di-s-butoxide-ethyl acetate, di-i-propoxyethyl acetoacetate aluminum, di-i-propoxy acetylacetonate aluminum, i-propoxy bis(ethyl acetoacetate)aluminum, i-propoxy bis(acetylacetonate)aluminum, tris(ethyl acetoacetate)aluminum, tris(acetylacetonate)aluminum, tris(etylacetonate)aluminum, and monoacetylacetonate bis(ethyl acetoacetate)aluminum.

Organic gallium compounds: gallium 8-hydroxyquinolinate, gallium(III)2,4-pentanedionate, gallium(III) ethoxide, gallium(III)2,2,6,6-tetramethyl 3,5 heptane dionate, gallium (III)tris(bis(trimethylsilyl)amide), and N tris(dimethylamino)gallium.

Organic indium compounds: indium hexafluoropentanedionate, indium methoxyethoxide, indium 2,4-pentanedionate, indium methyl(trimethyl)acetylacetate, and indium trifluoropentanedionate.

Organic germanium compounds: hydroxy germatrene, methyltriethoxy germanium, tetra-n-butoxy germanium, tetra-n-ethoxy germanium, tetraisopropoxy germanium, tetramethoxy germanium, tetrakis(trimethylsiloxy)germanium, tri-n-butylacetoxy germanium, and triethylmethoxy germanium.

Organic lead compounds: lead acetate (II) trihydrate, lead acetate (IV), lead tetrafluoroacetate (II), lead (meth)acrylate (II), lead propionate (IV), lead octenate (II), lead neodecanoate (II), lead(II)2,4-pentane dionate, lead(II)6,6,7,7,8,8,8-heptafluoro-2,2-dimethyl-3,5-octane dionate, lead(II) hexafluoropentane dionate, and lead(II)2,2,6,6-tetramethyl-3,5-heptane dionate.

Organic phosphorus compounds: diethyl phosphite, trimethyl phosphine, triethyl phosphine, tris(trimethylsilyl)phosphite, triethyl phosphate, tris(trimethylsilyl)phosphate, diethylethyltriethoxysilane, dimethyl(trimethylsilyl)phosphate, 2-(diphenylphosphino)ethyldimethylethoxysilane, 2-(diphenylphosphino)ethyltriethoxysilane, diphenylphosphine.

Organic antimony compounds: antimony acetate, antimony (III) n-botoxide, antimony (III) n-ethoxide, triphenylantimon, tris(dimethylamino)antimon Organic bismuth compounds: bismuth acetate, bismuth octenate, bismuth salicylate, bismuth hexafluoropentane dionate, bismuth(III)t-pentoxide, and bismuth 2,2,6,6-tetramethyl 3,5-heptane dionate.

In the above hydrolysis condensation reaction, catalysts other than the catalyst described above may be used, and one or two or more of inorganic acids such as hydrochloric acid, sulfuric acid and nitric acid; organic acid such as various sulfonic acids and sulfonic acid type ion-exchange resin; titanate esters such as tetrabutyl titanate and tetrapropyl titanate; tin carboxylates such as dibutyltin laurate, dibutyltin maleate, dibutyltin acetate, tin octylate and tin naphthenate; zirconium chelate compound such as tri-n-butoxy ethyl acetoacetate zirconium, di-n-butoxy bis(ethyl acetoacetate) zirconium, n-butoxy tris(ethyl acetoacetate) zirconium, tetrakis (n-propylacetoacetate)zirconium, tetrakis(acetoacetonate)zirconium, and tetrakis(ethyl acetoacetate) zirconium; titanium chelate compound such as di-i-propoxy bis(ethyl acetoacetate)titanium, di-i-propoxy bis(acetylacetate)titanium, di-i-propoxy bis(acetylacetonate)titanium, and tetrakis (acetylacetonate)titanium; amine compounds such as ammonia, butylamine, octylamine, dibutylamine, monoethanolamine, diethanolamine, triethanolamine, diethylenetriamine, triethylenetetramine, oleylamine, benzylamine, benzyldimethylamine, 2-ethyl-4-methylimidazole, 2,4,6-trisdimethylaminophenol, morpholine and DBU (1,8-diazabicyclo[5.4.0]-7-undecene); and salts of these compounds and carboxylic acid.

The use amount of the above hydrolysis condensation catalyst preferably has a lower limit of 0.1 parts by weight and an upper limit of 20 parts by weight with respect to 100 parts by weight of the alkoxide compound and/or the carboxylate compound. More preferably, the lower limit is 0.5 parts by weight and the upper limit is 10 parts by weight.

In the above hydrolysis condensation reaction, an organic solvent may also be used, and one or two or more of ethers such as tetrahydrofuran (THF), N-methylpyrrolidone (NMP), diglyme (diethylene glycol dimethyl ether), methyl ethyl cellosolve, butyl cellosolve (ethylene glycol monobutyl ether) and propylene glycol methyl ether acetate; amides such as dimethylformamide (DMF) and dimethylacetamide (DMA); ketones such as acetone and 2-butanone (MEK); alcohols such as methanol, ethanol, 2-propanol, butanol, and 1-methoxy-2 propanol; reaction diluents such as glycidyl methacrylate; hydrocarbons such as hexane and cyclohexane; aromatics such as toluene, xylene, m-cresol, benzene and nitrobenzene; halogens such as chloroform and dichloroethane; silicones such as such as dimethylpolysiloxane and cyclomethicone; and acetonitrile, dioxane and pyridine.

The use amount of the above organic solvent preferably has a lower limit of 20% by weight and an upper limit of 120% by weight with respect to 100% by weight of the glycidyl group- and/or the epoxy group-containing compound. More preferably, the lower limit is 25% by weight and the upper limit is 110% by weight, and furthermore preferably, the lower limit is 30% by weight and the upper limit is 100% by weight.

As for reaction conditions of hydrolysis condensation in the above method for producing, the reaction temperature preferably has a lower limit of 0° C. and an upper limit of 200° C. More preferably, the lower limit is 10° C. and the upper limit is 150° C., and furthermore preferably, the lower limit is 20° C. and the upper limit is 100° C. And, the reaction time preferably has a lower limit of 30 minutes and an upper limit of 24 hours. More preferably, the lower limit is 1 hour and the upper limit is 18 hours, and furthermore preferably, the lower limit is 2 hour and the upper limit is 12 hours.

In the glycidyl group- and/or the epoxy group-containing compound containing a inorganic microfine particle, the content of the inorganic microfine particle suitably has a lower limit of 3% by weight and an upper limit of 80% by weight with respect to 100% by weight of the total amount of the glycidyl group- and/or the epoxy group-containing compound containing an inorganic microfine particles. When the content is less than 3% by weight, the content of the inorganic microfine particle in the whole resin composition may not be sufficiently increased for a cured formulation to have excellent insulating property and thermal shock resistance may not be obtained, and when it is higher than 80% by weight, a handling property may not be sufficient to improve the moldability/formability. More preferably, the lower limit is 5% by weight and the upper limit is 50% by weight.

Then, described is a method for producing a dispersing element containing the inorganic microfine particle, among the inorganic microfine particle of the present invention, in which the inorganic microfine particle having a radius of inertia of less than 10 nm and the inorganic microfine particle having a radius of inertia of 10 to 50 nm is dispersed with a specific ratio. As a method for producing the dispersing element having such a dispersion state, preferred is a method for producing the dispersing element containing an inorganic microfine particle, the method comprising a step, in which alkoxide and/or metal carboxylate are supplied from a solution level neighborhood of a reaction vessel containing a dispersion medium having a viscosity of 100 Pa second (1000 poise) or less at 20° C. or dilution thereof, and at the same time, water is supplied into the dispersion medium or dilution thereof from a reaction vessel bottom neighborhood, and a hydrolysis condensation reaction is carried out under stirring, and the inorganic microfine particle, which is the hydrolysis condensation product of alkoxide and/or metal carboxylate, is produced. In the above-mentioned producing method, it is preferable that the total supply amount of alkoxide and/or metal carboxylate and water is 0.2 to 50% by weight in the dispersing element 100% by weight in the reaction vessel.

In the above-mentioned producing method, first, the dispersion medium is put into the reaction vessel. In the case where the dispersion medium is a solid resin composition at ordinary temperature, the dispersion medium is preliminarily diluted with the above-mentioned organic solvent which can be used as a dispersion medium. The dispersion medium is diluted so as to be 100 Pa second or less, more preferably 50 Pa second, and still more preferably 10 pa second or less, at ordinary temperature (20° C.). This viscosity is the value measured with B type rotational viscometer. As the reaction vessel, a reaction vessel with an agitating device may be used. A reaction vessel with a pivotable mixing blade having a shape such as a propeller, a paddle, and a ribbon, is mentioned as a representative example, but is not especially limited. A reaction vessel equipped with other agitating devices, a mixing roll and extruder and the like also may be used.

Alkoxide and/or metal carboxylate are supplied from a liquid neighborhood of the dispersion medium or dilution thereof (hereinafter, referred to as inner liquid), and water is supplied into inner liquid from a reaction vessel bottom neighborhood. Specifically, an alkoxide and/or metal carboxylate introducing pipe is disposed so that the exit may be a solution level neighborhood of inner liquid, and a water introducing pipe is disposed so that the exit may be at a bottom neighborhood of the reaction vessel. The term "solution level neighborhood" means a space from the mixing blade in inner liquid (in case of a plurality of mixing blades, a mixing blade nearest to the surface is meant) to the solution level, and an upper space of the solution level. The reason why the water introducing part whose exit is disposed in a reaction vessel bottom neighborhood, and the introductory part of alkoxide and/or metal carboxylate are disposed with a distance from each other is that the exit of the alkoxide and/or metal carboxylate introducing pipe is disposed in the above-mentioned space (a space from the mixing blade in inner liquid to the solution level, and an upper space of the solution level). As mentioned above, water is finely dissolved or solved in inner liquid until water makes contact with alkoxide and/or metal carboxylate by disposing the alkoxide and/or metal carboxylate introducing part, and a water introducing part with a distance from each other, and therefore a hydrolysis condensation reaction is carried out under homogeneous system. A proceeding of the reaction may properly delayed, and the particle may be prevented from being larger, since it takes some time for alkoxide and/or metal carboxylate to make contact with water. Therefore, a minute inorganic microfine particle having the above-mentioned particle size distribution (inertial radius) is thought to be produced. Accordingly, alkoxide and/or metal carboxylate, or water is preferably supplied at a rate of dropping level.

It is preferable that a total supply amount of alkoxide and/or metal carboxylate and water is 0.2 to 50% by weight in the dispersing element 100% by weight in the reaction vessel (a total amount of the dispersion medium and the inorganic microfine particle is defined as 100% by weight). In this range, the particle size distribution is easy to control in the above-mentioned defined range.

In the hydrolysis condensation reaction, a hydrophilic organic solvent, such as methanol is preferably added in advance. When water is not compatible with the dispersion medium, especially with the resin composition, the hydrophilic organic solvent functions as a dissolution auxiliary agent, and helps water finely disperse and solve in inner liquid. When a substance having high viscosity or solid shape at ordinary temperature is used as the dispersion medium, the hydrophilic organic solvent may also function as a solvent for dilution. The hydrophilic organic solvent is not especially limited, and used may be alcohols, such as methanol and ethanol; ketones, such as acetone and 2-butanone; tetrahydrofuran; polyols, such as ethylene glycol, propylene glycol, 1,3-propanediol; N,N dimethylformamide; pyridine, and other solvents may be mixed if necessary.

Also when a resin composition is used as the dispersion medium, the above-mentioned hydrolysis condensation reaction is carried out in the resin composition, which is the dispersion medium. When a resin composition is synthesized, for example, when the above mentioned polyhydric phenols are obtained by synthesis, this synthetic reaction is carried out and then the hydrolysis condensation reaction of alkoxide and/or metal carboxylate may be carried out in the same reaction vessel (under existence of polyhydric phenols), since the above-mentioned dispersing element is easily obtained. When the resin composition contains an epoxy resin, the resin composition may be a dispersing element either by mixing with polyhydric phenols before synthesis of the inorganic microfine particle or by adding an epoxy resin to the dispersing element in which the inorganic microfine particle is synthesized and mixing the dispersing element.

The temperature of the above-mentioned hydrolysis condensation reaction is preferably 0 to 60° C., and more preferably 5 to 40° C. The reaction time is generally 30 minutes to 24 hours, and preferably 1 to 12 hours. When the dispersion medium is diluted, the solvent for dilution may distill off to remove under reduced pressure of 0.1 to 10 kPa at the same reaction temperature as in the polyhydric phenols synthesis. When the dispersion medium is diluted using a "solvent (mentioned below)" added in order to improve flowability, the solution need not to be removed, but may be partly removed.

As mentioned above, in the above-mentioned dispersing element of the inorganic microfine particle, the inorganic microfine particle formed by the hydrolysis condensation of alkoxide and/or metal carboxylate is dispersed in the dispersion medium, such as the organic solvent and the resin composition.

When the dispersion medium is a resin composition, publicly known additives, such as hardening accelerator, filler, coupling agent, flame retardant, plasticizer, reactive diluent, and pigment may be further added.

A solvent, a plasticizer, and a lubricant may be blended with the resin composition, which is the dispersion medium, in order to improve flowability. As such a solvent, a plasticizer, and lubricant, for example, a below-mentioned compound having at least one structure selected from the group consisting of ether bond, ester bond, and nitrogen atom is preferred.

When the above-mentioned dispersing element is used for an insulating material for wiring board, the insulating material for wiring board may be formed, for example, by mixing the above-mentioned compound having at least one structure selected from the group consisting of ether bond, ester bond, and nitrogen atom with the dispersing element to secure good flowability, and by using the resulting mixture as an ink, a coating material, or a varnish, and then by drying the compound under reduced pressure and/or with heat to remove the compound. The dryness conditions of the ink or the coating material is properly adjusted depending on a vapor pressure, a boiling point or the like of the used compound having at least one structure selected from the group consisting of ether bond, ester bond, and nitrogen atom.

The various additives illustrated as suitable additives in the case where the above-mentioned dispersing element is used as a material for encapsulating semiconductor or an insulating material for wiring board may be properly used in the case where the dispersing element is used for other uses. When a shaped and cured body is manufactured using the above-mentioned dispersing element, the shaped and cured body obtained preferably has a flame retardancy of V-2 or more, more preferable V-1 or more measured by UL-94 standard flame retardant examination. When the flame retardancy measured by UL-94 standard flame, flame retardant examination is V-2 or more, for example, the flame retardancy demanded in the electronic industry material field can fully be satisfied. The above-mentioned shaped and cured body can achieve the above-mentioned flame retardancy.

The resin composition of the present invention has various excellent properties such as an insulating property, thermal shock resistance, moldability/formability and strength, and excellent flame retardancy even in a form of thin film, in addition, can form a cured body having an excellent mechanical properties and heat resistance, and a cured formulation exhibiting an excellent appearance. And a dispersing element containing an inorganic microfine particles can greatly reduce a hygroscopic of a resin shaped body, and therefore the resin is suitably used as materials for, for example, mechanical components, electric and electronic devices, components of vehicles, shipping and aircrafts, construction/building, molding/forming, and coatings and adhesives.

BEST MODE FOR CARRING OUT THE INVENTION

Hereinafter, the present invention will be described in more detail with reference to Examples, but the present invention is not limited to these Examples. In addition, "part(s)" refers to "part(s) by weight" and "%" refers to "% by weight" as particular notice is not given.

SYNTHETIC EXAMPLE 1

Into a 500 mL four necked flask equipped with a gas inlet, a cooling tube and a stirrer, 165.65 g of alicyclic epoxy resin (trade name "CEL 2021P" produced by DAICEL CHEMICAL IND., LTD.) and 165.65 g of propylene glycol methyl ether acetate were charged, and when the resulting mixture was stirred well at room temperature to obtain a homogeneous solution, 82.01 g of tetramethoxysilane and 54.57 g of 3-glycidoxypropyltrimethoxysilane were charged and the mixture was stirred at room temperature to obtain a homogeneous solution. To this mixed solution, 51.31 g of ion-exchanged water of pH 6.8 was added dropwise over 2 hours at room temperature while being stirred and subsequently the mixture was heated to 80° C. and kept at this temperature for 4 hours. Next, into this, 3.20 g of triethyl phosphate was charged, and the mixture was maintained in this state for 2 hours, and then methanol and propylene glycol methyl ether acetate, which were volatile components, were distilled off under reduced pressure and the remaining mixture was cooled to obtain a resin composition A which was non-colored transparent and viscous liquid. The yield of the resin was 260 g, and the resin had an epoxy equivalent of 171 g/mol, an inorganic microfine particle content of 29.5% by weight and viscosity of 3520 mPa·s at 25° C.

SYNTHETIC EXAMPLE 2

Into a 500 mL four necked flask equipped with a gas inlet, a cooling tube and a stirrer, 123.25 g of alicyclic epoxy resin (trade name "ST3000" produced by Tohto Kasei Co., Ltd.) and 123.25 g of 1-methoxy-2 propanol were charged, and when the resulting mixture was stirred well at room temperature to obtain a homogeneous solution, 79.03 g of tetramethoxysilane and 127.91 g of 2-(3,4-epoxycyclohexyl) ethyltrimethoxysilane were charged and the mixture was stirred at room temperature to obtain a homogeneous solution. To this mixed solution, 65.49 g of ion-exchanged water of pH 6.8 was added by one operation at room temperature while being stirred, and subsequently the mixture was heated to 100° C. and kept at this temperature for 4 hours. Next, into this, 1.63 g of antimony (III) ethoxide was charged, and the mixture was maintained in this state for 2 hours, and then methanol and 1-methoxy-2 propanol, which were volatile components, were distilled off under reduced pressure and the remaining mixture was cooled to obtain a resin composition B which was non-colored transparent and viscous liquid. The yield of the resin was 275 g, and the resin had an epoxy equivalent of 231 g/mol, an inorganic microfine particle content of 51.5% by weight and viscosity of 1810 mPa·s at 25° C.

SYNTHETIC EXAMPLE 3

Into a 1 L autoclave equipped with a gas inlet, a cooling tube and a stirrer, 100 g of bisphenol A epoxy resin being solid at 25° C. (trade name "Epicoat 1001" produced by Japan Epoxy Resins Co., Ltd.), 300 g of tetrahydrofuran and 5.0 g of graphite carrying 5% palladium were charged and the mixture was heated to 85° C. and the internal space of the autoclave was replaced with nitrogen once. Next, the internal space of the autoclave was replaced with hydrogen of 5 MPa in pressure and the mixture was maintained for 24 hours while being stirred, and then the internal space was replaced with nitrogen and the graphite carrying 5% palladium was filtered to obtain an alicyclic epoxy resin solution.

Then, 792.39 g of the alicyclic epoxy resin solution obtained was charged into a 1000 mL four necked flask equipped with a gas inlet, a cooling tube and a stirrer, and 75.31 g of tetramethoxysilane and 77.95 g of 3-glycidoxypropyltrimethoxysilane were charged and the mixture was stirred at room temperature to obtain a homogeneous solution. To this mixed solution, 53.49 g of ion-exchanged water of pH 6.8 was added dropwise over 2 hours at room temperature while being stirred, and subsequently the mixture was heated to 60° C. and kept at this temperature for 4 hours. Next, into this, 3.90 g of aluminum di-s-butoxide-ethylacetate was charged, and the mixture was maintained in this state for 2 hours, and then methanol and tetrahydrofuran, which were volatile components, were distilled off under reduced pressure and the remaining mixture was cooled to obtain a resin composition C which was non-colored transparent and semi-solid. The yield of the resin was 310 g, and the resin had an epoxy equivalent of 290 g/mol, an inorganic microfine particle content of 31.0% by weight and viscosity of 2320 mPa·s at 60° C.

SYNTHETIC EXAMPLE 4

Into a 500 mL four necked flask equipped with a gas inlet, a cooling tube and a stirrer, 168.62 g of aromatic crystalline epoxy resin (trade name "YX4000H" produced by Japan Epoxy Resins Co., Ltd.) and 166.85 g of diglyme were charged, and when the resulting mixture was stirred well at room temperature to obtain a homogeneous solution, 58.11 g of tetramethoxysilane and 75.70 g of phenyltrimethoxysilane were charged and the mixture was stirred at room temperature to obtain a homogeneous solution. To this mixed solution, 48.15 g of ion-exchanged water of pH 6.8 was added dropwise over 2 hours at room temperature while being stirred, and subsequently the mixture was heated to 100° C. and kept at this temperature for 4 hours. Next, into this, 0.78 g of trimethoxyborane was charged, and the mixture was maintained in this state for 2 hours, and then methanol and diglyme, which were volatile components, were distilled off under reduced pressure and the remaining mixture was cooled to obtain a resin composition D which was non-colored transparent and viscous liquid. The yield of the resin was 260 g, and the resin had an epoxy equivalent of 307 g/mol, an inorganic microfine particle content of 29.8% by weight and a melting point of 104° C.

SYNTHETIC EXAMPLE 5

Into a 1 L kneader of heating type equipped with a gas inlet, a cooling tube and a heating medium circulator, 361.33 g of high molecular weight epoxy resin (trade name "ESCN220" produced by Sumitomo Chemical Co., Ltd.) and 154.86 g of butyl cellosolve were charged, and after the resulting mixture was stirred well at 40° C. to obtain a homogeneous solution, the solution was cooled to room temperature, and into this, 255.11 g of tetramethoxysilane and 83.08 g of phenyltrimethoxysilane were charged by one operation and the mixture was kneaded at room temperature to obtain a homogeneous solution. To this mixed solution, 143.45 g of ion-exchanged water of pH 6.8 was added by one operation at room temperature while being kneaded, and subsequently the internal temperature of the kneader was raised to 100° C. and kept at this temperature for 4 hours. Next, into this, 3.18 g of zinc acetate dihydrate was charged, and the mixture was maintained in this state for 2 hours, and then methanol and butyl cellosolve, which were volatile components, were distilled off under reduced pressure and the remaining mixture was cooled by taking out it from the kneader onto a metal vat to obtain a resin composition E which was translucent solid matter. The yield of the resin was 580 g, and the resin had an epoxy equivalent of 360 g/mol, an inorganic microfine particle content of 30.6% by weight and a thermally softening temperature of 118° C.

SYNTHETIC EXAMPLE 6

Into a 500 mL four necked flask equipped with a gas inlet, a cooling tube and a stirrer, 120.96 g of alicyclic epoxy resin (trade name "YX8034" produced by Japan Epoxy Resins Co., Ltd.), 51.84 g of triglycidyl cyanurate, 86.40 g of 1-methoxy-2 propanol were charged and 86.40 g of propylene carbonate were charged, and when the resulting mixture was stirred well at 60° C. to obtain a homogeneous solution, 73.87 g of tetramethoxysilane and 119.56 g of 3-(3,4-epoxycyclohexyl) ethyltrimethoxysilane were charged and the mixture was stirred at 60° C. to obtain a homogeneous solution. To this mixed solution, 61.21 g of ion-exchanged water of pH 6.8 was added dropwise at room temperature over 2 hours while being stirred, and subsequently the mixture was heated to 80° C. and kept at this temperature for 4 hours. Next, into this, 1.61 g of trimethyl phosphite was charged, and the mixture was maintained in this state for 2 hours, and then methanol, 1-methoxy-2 propanol and propylene carbonate, which were volatile components, were distilled off under reduced pressure and the remaining mixture was cooled to obtain a resin composition M which was non-colored transparent and viscous liquid. The yield of the resin was 285 g, and the resin had an epoxy equivalent of 201 g/mol, an inorganic microfine particle content of 40.3% by weight and viscosity of 6810 mPa·s at 25° C.

Examples 1 to 4 and Comparative Examples 1 and 2

Into a flask equipped with a gas inlet, a pressure reducing device and a stirrer, each of three resin compositions described in Synthetic Examples 1 to 3 and two alicyclic epoxy resins (trade name "CEL 2021P" produced by Daicel Chemical Ind., Ltd., and trade name "ST3000" produced by Tohto Kasei Co., Ltd.), methylhexahydrophthalic anhydride (trade name "MH700G" produced by New Japan Chemical Co., Ltd.) as a curing agent, tributylhexadecylphosphonium bromide as a curing accelerator and phenolic antioxidant (trade name "Antage W-400" produced by Kawaguchi Chemical Industry Co., Ltd.) as a stabilizer were charged in the compositions shown in Table 1, and were mixed at 80° C. and defoamed under reduced pressure, and thereby a homogeneous epoxy resin composition was obtained. To the compositions of Comparative Examples, fused silica (trade name "SO-E2" produced by ADMATECHS Co., Ltd.) was added as a metal oxide (metal component composing of an inorganic microfine particle). Subsequently, each of the above compositions was poured into a mold and cured at 100° C. for three hours and further at 140° C. for three hours in an oven to obtain a cured resin plate of 1 mm in thickness. With respect to the appearance of the resulting cured resin plates, they were non-colored transparent in Examples 1 to 4 but they were white and opaque in Comparative Examples 1 and 2.

For ultra violet discoloration resistance test of the cured resin plate, a xenon weathering tester (Model: Ci4000 manufactured by Atlas Material Testing Technology BV) was used and xenon arc light was irradiated for 1000 hours under the conditions of 50° C. in cell internal temperature and 45% in cell internal humidity. Color before and after the test was measured by a colorimeter and a degree of yellowing was evaluated in terms of ΔY1.

In order to investigate a particle size distribution of metal oxide microfine particles (inorganic microfine particles) in the resin composition, the cured resin plates obtained in the above were each subjected to a small-angle X-ray scattering analysis. A small-angle X-ray scattering spectrum was measured using the X-ray diffractometer "RINT-2400", manufactured by Rigaku Corp. Incident X-ray was converted to monochrome through a multilayer mirror monochrometer and further passed through 3 slits, and then it was irradiated to the cured resin plate and scattered X-rays were detected with a scintillation counter installed at a camera length of 250 mm through a vacuum path. Detailed conditions during measuring are as follows.

X-ray used: CuKα
Tube voltage, tube current: 40 kV, 200 mA
Operation method: Fixed time method
Measuring method: Transmission method (2θ separate operation)
Scanning angle covered: 2θ
Increment of a step: 0.1 to 5.0 degree, 0.01 degree
Measuring time: 30 minutes A Guinier plot was prepared from a scattering profile obtained by this measurement by a Fankuchen method to derive the radius of inertia and a particle size distribution was determined assuming that a geometry of a particle is a sphere. In order to investigate the ratio of constituent metal elementary component of metal oxide microfine particles (inorganic microfine particles) in the resin composition, the cured resin plates obtained were each subjected to a X-ray photoelectron spectroscopy (XPS) analysis.

Table 1 will be described below.
CEL 2021P: alicyclic epoxy resin (produced by Daicel Chemical Ind., Ltd.)
ST3000: alicyclic epoxy resin (produced by Tohto Kasei Co., Ltd.)
MH700G: methylhexahydrophthalic anhydride (produced by New Japan Chemical Co., Ltd.)
Antage W-400: phenolic antioxidant (produced by Kawaguchi Chemical Industry Co., Ltd.)
SO-E2: fused silica (produced by ADMATECHS Co., Ltd.)

The cured plates of the resin compositions of Examples had higher transparency of the cured plate itself than that of the resin compositions of Comparative Examples and therefore it was assumed that microfine particles were dispersed in shorter particle diameter than the wavelength of visible light and it was found that it could be suitably used for the uses requiring the transparency. And, the cured plates of the resin compositions of Examples has small ΔY1 and is considered to have high resistance to discoloration by irradiation of active energy rays such as ultraviolet rays.

Examples 5 and 6 and Comparative Examples 3 and 4

Into a flask equipped with a gas inlet, a pressure reducing device and a stirrer, each of two rein compositions described in Synthetic Examples 4 and 5 and two epoxy resins (trade name "YX4000H" produced by Japan Epoxy Resins Co., Ltd., and trade name "ESCN220HH" produced by Sumitomo Chemical Co., Ltd.), phenol aralkyl resin (trade name "XLC-3L" produced by Mitsui Chemicals, Inc.) as a curing agent and triphenylphosphine as a curing accelerator were each charged in the compositions shown in Table 2, and were mixed at 110° C. and defoamed under reduced pressure, and thereby a homogeneous epoxy resin composition was each obtained. Subsequently, each of the above compositions was poured into a mold and cured at 120° C. for five hours and further at 150° C. for three hours in an oven to obtain a cured resin plate of 3 mm in thickness. Thermal properties and mechanical physical properties (flexural strength and flexural

TABLE 1

| | | Example 1 | Example 2 | Example 3 | Example 4 | Comparative Example 1 | Comparative Example 2 |
|---|---|---|---|---|---|---|---|
| Mixing composition (parts by weight) | Resin composition A | 50.4 | — | — | — | — | — |
| | Resin composition B | — | 57.9 | — | — | — | — |
| | Resin composition C | — | — | 63.3 | — | — | — |
| | Resin composition M | — | — | — | 54.3 | — | — |
| | CEL2021P | — | — | — | — | 38.0 | — |
| | ST3000 | — | — | — | — | — | 44.4 |
| | MH700G | 49.6 | 42.1 | 36.7 | 45.7 | 50.6 | 42.3 |
| | Curing accelerator | 0.5 | 0.5 | 0.5 | 0.5 | 0.5 | 0.5 |
| | Antage W-400 | 0.03 | 0.03 | 0.03 | 0.03 | 0.03 | 0.03 |
| | SO-E2 | — | — | — | — | 11.4 | 13.3 |
| Particle size distribution of inorganic microfine particles in cured plate (% by volume) | 0.5 nm to 10 nm | 55.3 | 75.2 | 63.1 | 59.6 | — | — |
| | 10 nm to 100 nm | 44.7 | 24.8 | 36.9 | 40.4 | — | — |
| | 100 nm or more | — | — | — | — | 100 | 100 |
| Ratio of the constituent metal component (mol %) | Si | 98.1 | 99.3 | 98.6 | 99.0 | 100 | 100 |
| | P | 1.9 | — | — | 1.0 | — | — |
| | Sb | — | 0.7 | — | — | — | — |
| | Al | — | — | 1.4 | — | — | — |
| Appearance of cured plate before test | | Non-colored transparent | Non-colored transparent | Non-colored transparent | Non-colored transparent | White opaque | White opaque |
| Ultraviolet discoloration resistance ΔYI | | 3.8 | 1.7 | 2.5 | 2.3 | 8.3 | 11.5 | modulus) of the cured plates were each measured according to JIS K7121 and JIS K6911 and fracture toughness was measured according to ASTM D5045. Dielectric characteristics were measured according to an application note 1369-1 prepared by Agilent Technologies Japan, Ltd. and the characteristic was evaluated using measurements at 1 MHz. The particle size and the ratio of the constituent metal component of the metal oxide (metal component) were measure by the same manner as mentioned above.

TABLE 2

| | | Example 5 | Example 6 | Comparative Example 3 | Comparative Example 4 |
|---|---|---|---|---|---|
| Mixing composition (parts by weight) | Resin composition D | 64.1 | — | — | — |
| | Resin composition E | — | 67.7 | — | — |
| | YX4000H | — | — | 53.1 | — |
| | ESCN220HH | — | — | — | 56.1 |
| | XLC3L | 35.9 | 32.3 | 46.9 | 43.9 |
| | Curing accelerator | 0.5 | 0.5 | 0.5 | 0.5 |
| Particle size distribution of metal oxide in cured plate (% by volume) | 0.5 nm~10 nm | 71.9 | 61.8 | No inorganic component | No inorganic component |
| | 10 nm~100 nm | 28.1 | 38.2 | | |
| | 100 nm or moer | — | — | | |
| Ratio of the constituent metal component (mol %) | Si | 98.9 | 98.4 | | |
| | B | 1.1 | — | | |
| | Zn | — | 1.6 | | |
| Thermal property | Tg(TMA measurement, °C.) | 115 | 144 | 116 | 146 |
| | α1 (ppm) | 55 | 72 | 60 | 81 |
| | α2 (ppm) | 180 | 185 | 183 | 192 |
| Mechanical property | Flexural strength (MPa) | 116 | 183 | 108 | 150 |
| | Flexural modulus (GPa) | 3.94 | 3.92 | 2.96 | 3.43 |
| | Fracture toughness (MPa·m$^{1/2}$) | 1.91 | 1.12 | 1.88 | 1.05 |
| Dielectric characteristic (1 MHz) | ε | 3.52 | 4.06 | 3.98 | 4.21 |
| | tanδ | $1.4 \times 10^{-2}$ | $7.9 \times 10^{-3}$ | $1.7 \times 10^{-2}$ | $2.3 \times 10^{-2}$ |

Table 2 will be described below.

YX4000H: epoxy resin (produced by Japan Epoxy Resins Co., Ltd.)

ESCN220HH: epoxy resin (produced by Sumitomo Chemical Co., Ltd.)

XLC3L: phenol aralkyl resin (produced by Mitsui Chemicals, Inc.)

With respect to the resin compositions of Examples, they exhibited handling properties equivalent to those of the resin compositions of Comparative Examples, in despite of containing the inorganic microfine particles and their cured plates could be prepared without any problems as with Comparative Examples. And, it was proved that while the cured plates of the resin compositions of Examples exhibited thermal properties equivalent to those of the resin compositions of Comparative Examples, they had enhanced strength and elasticity in mechanical properties and delivered a low dielectric characteristic.

Production Example 1

Epoxy Resin A

Cresol novolac type epoxy resin (trade name "ESCN220HH", epoxy equivalent 220 g/mol, produced by Sumitomo Chemical Co., Ltd.) was used as is.

Production Example 2

Synthesis of Epoxy Resin Composition B

Into a 1 L kneader of heating type equipped with a gas inlet, a cooling tube and a heating medium circulator, 361.3 g of epoxy resin (trade name "ESCN220" produced by Sumitomo Chemical Co., Ltd.) and 154.9 g of butyl cellosolve were charged, and after the resulting mixture was stirred well at 40° C. to obtain a homogeneous solution, the solution was cooled to room temperature, and into this, 255.1 g of tetramethoxysilane and 83.1 g of phenyltrimethoxysilane were charged by one operation, and subsequently the internal temperature of the kneader was raised to 100° C. and kept at this temperature for 4 hours. Next, into this, 3.18 g of zinc acetate dihydrate was charged, and the mixture was maintained in this state for 2 hours, and then methanol and butyl cellosolve, which were volatile components, were distilled off under reduced pressure to obtain an epoxy resin composition B which was translucent solid matter. The yield of the resin was 580 g, and the resin had an epoxy equivalent of 360 g/mol, an inorganic microfine particle content of 30.6% by weight and a thermally softening temperature of 118° C.

Production Example 1

Synthesis of Epoxy Resin Composition C

Into a 500 mL four necked flask equipped with a gas inlet, a cooling tube and a stirrer, 168.6 g of epoxy resin (trade name "YX4000H" produced by Japan Epoxy Resins Co., Ltd.) and 166.9 g of diglyme were charged, and when the resulting mixture was stirred well at room temperature to obtain a homogeneous solution, 58.1 g of tetramethoxysilane and 75.7 g of phenyltrimethoxysilane were charged and the mixture was stirred at room temperature to obtain a homogeneous solution. To this mixed solution, 48.2 g of ion-exchanged water was added dropwise over 2 hours at room temperature while being stirred, and subsequently the mixture was heated to 100° C. and kept at this temperature for 4 hours. Next, into this, 0.78 g of trimethoxyborane was charged, and the mixture was maintained in this state for 2 hours, and then methanol and diglyme, which were volatile components, were distilled off under reduced pressure and the remaining mixture was cooled to obtain a epoxy resin composition C which was viscous liquid. The yield of the resin was 260 g, and the resin had an epoxy equivalent of 307 g/mol and an inorganic microfine particle content of 29.8% by weight.

Production Example 4

Synthesis of Polyhydric Phenolic Resin Composition A

Into a 500 mL four necked flask equipped with a gas inlet, a Dean-Stark trap and a stirrer, 310.7 g of phenol, 21.6 g of benzoguanamine, 43.7 g of melamine and 113.5 g of a 37% formalin solution were charged and to this, 5 mL of aqueous ammonia was added dropwise while stirring a whitish solution at 60° C. in a nitrogen stream. When the stirred solution became clear, it was heated to 80° C. and kept at this temperature for 4 hours while stirring and then heated to 160° C. Then, remaining phenol was distilled off under reduced pressure and the remaining solution was cooled to obtain brown solid polyhydric phenol (1).

Into a 500 mL four necked flask equipped with a gas inlet, a Dean-Stark trap and a stirrer, 346.8 g of phenol, 74.8 g of a 37% formalin solution and 3.7 g of triethylamine were charged and temperature was raised in a nitrogen stream. A condensation reaction was initiated at about 100° C., and the solution was held in a state of refluxing for 1 hour, and 74.8 g of a 37% formalin solution was further added and the resulting mixture was held for three hours. Subsequently, the mixture was heated to 180° C. to distill off water/methanol produced, and then remaining phenol was distilled off at 160° C. under vacuum and reduced pressure and the remaining solution was cooled to obtain brown and transparent solid polyhydric phenol (2).

Then, 73.4 g of the polyhydric phenol (1) and 73.4 g of polyhydric phenol (2) were dissolved in 146.8 g of methanol in a flask, and two PTFE tubes were prepared and one tube was inserted into the flask to the bottom level and the other tube was held above the solution level. The solution was stirred while keeping an internal temperature of the flask at 20° C., and 159.3 g of tetramethoxysilane was injected from the upper tube of the flask and 47.2 g of ion-exchanged water was injected from the bottom tube of the flask into the flask, respectively, over four hours. Furthermore, the resulting solution was heated to 60° C. and kept at this temperature for 4 hours, and then the solution temperature was raised and heated to 160° C. while distilling off methanol and water. Then, volatile matter was completely distilled off under reduced pressure and the remaining solution was cooled to obtain a milky solid polyhydric phenolic resin composition A. The yield of the composition A was 208.5 g, and the composition had a thermally softening temperature of 125° C., a hydroxyl group equivalent of 162 g/mol and an inorganic microfine particle content of 29.6% by weight.

PRODUCTION EXAMPLE 5

Synthesis of Polyhydric Phenolic Resin Composition B

Into a 2000 mL four necked flask equipped with a gas inlet, a Dean-Stark trap and a stirrer, 513.9 g of p-xylylene glycol dimethyl ether, 831.3 g of phenol and 8.41 g of p-toluene-sulfonic acid were charged and temperature was raised in a nitrogen stream. The mixture was heated to 150° C. and kept at this temperature for 6 hours while collecting methanol with a trap because the production of methanol began at about 115° C. Since the production of methanol was completed at the point where 192 g of methanol was collected, remaining phenol was then distilled off under reduced pressure and the remaining solution was cooled to obtain brown and transparent solid polyhydric phenol (3).

73.4 g of the polyhydric phenol (1) and 73.4 g of polyhydric phenol (3) were dissolved in 146.8 g of methanol in a flask, and two PTFE tubes were prepared and one tube was inserted into the flask to the bottom level and the other tube was held above the solution level. The solution was stirred while keeping an internal temperature of the flask at 20° C., and 159.3 g of tetramethoxysilane was injected from the upper tube of the flask and 47.1 g of ion-exchanged water was injected from the bottom tube of the flask into the flask, respectively, over four hours.

Furthermore, the resulting solution was heated to 60° C. and kept at this temperature for 4 hours, and then the solution was heated to 160° C., and heated to 180° C. while distilling off water/methanol produced. Then, volatile matter was completely distilled off at 160° C. under reduced pressure and the remaining solution was cooled to obtain a milky solid polyhydric phenolic resin composition B. The yield of the composition B was 209.5 g, and the composition had a thermally softening temperature of 105° C., a hydroxyl group equivalent of 197 g/mol and an inorganic microfine particle content of 29.2% by weight.

PRODUCTION EXAMPLE 6

Synthesis of Polyhydric Phenolic Resin Composition C

Into a 1 L four necked flask equipped with a gas inlet, a Dean-Stark trap and a stirrer, 235.3 g of phenol was charged and it was kept at 40° C. in a nitrogen stream and held in a state of being melted.

Two PTFE tubes were prepared and one tube was inserted into the flask to the bottom level and the other tube was held above the solution level. Then, 173.6 g of tetramethoxysilane was injected from the upper tube of the flask and 60.5 g of 15% aqueous ammonia was injected from the bottom tube of the flask into the flask, respectively, over four hours, and then the mixture was kept at 60° C. for four hours. Subsequently, into this, 50.7 g of a 37% formalin solution was charged, and temperature was raised, and consequently the solution became a state of refluxing at about 100° C. After holding the solution in such a state for 1 hour, 50.7 g of a 37% formalin solution was added and the resulting mixture was held for three hours. Then, the solution was heated to 180° C. to distill off water/methanol produced, and then remaining phenol was then distilled off at 160° C. under a reduced pressure and the remaining solution was cooled to obtain a milky solid polyhydric phenolic resin composition C. The yield of the composition C was 228.5 g, and the composition had a thermally softening temperature of 92° C. and a hydroxyl group equivalent of 147 g/mol.

PRODUCTION EXAMPLE 7

Synthesis of Polyhydric Phenolic Resin Composition D 146.5 g of the polyhydric phenol (2) was dissolved to 146.5 g of methanol in a flask, and two PTFE tubes were prepared and one tube was inserted into the flask to the bottom level and the other tube was held above the solution level. The solution was stirred while keeping an internal temperature of the flask at 20° C., and 158.9 g of tetramethoxysilane was injected from the upper tube of the flask and 47.0 g of ion-exchanged water was injected from the bottom tube of the flask into the flask, respectively, over four hours. Furthermore, the resulting solution was heated to 60° C. and kept at this temperature for 4 hours, and then the solution was heated to 160° C. while distilling off methanol and water. Then, volatile matter was completely distilled off at 160° C. under reduced pressure to obtain a milky solid polyhydric phenolic resin composition D. The yield of the composition D was 209 g, and the composition had a thermally softening temperature of 94° C., a hydroxyl group equivalent of 148 g/mol and an inorganic microfine particle content of 29.5% by weight.

"COMPARATIVE EXAMPLES 7A AND 8A; EXAMPLES 9-10 AND COMPARATIVE EXAMPLES 5 to 8"

Preparation Method of Resin Composition for Molding/Forming

Into a 300 mL kneading vessel of heating type equipped with a pressure reducing device, resins of from the epoxy resin A to the polyhydric phenolic resin composition D were charged in the proportions shown in Table 3, and 150 g of the resulting mixture was dissolved at 110° C. and mixed for 30 minutes under reduced pressure. Then, triphenylphosphine as a curing accelerator was charged in the proportion of Table 1 and the resulting mixture was kneaded for 30 minutes under reduced pressure. Immediately, the kneaded one was poured into a mold of 1 mm in thickness and cured at 110° C. for three hours and further at 150° C. for three hours in an oven to obtain a resin plate of 1 mm in thickness.

Using the resulting resin plate, the glass transition temperature (Tg), the coefficient of thermal expansion ($\alpha_1$, $\alpha_2$) and the radius of inertia of inorganic microfine particle were determined according to the following procedure, and the appearance of the resin plate was evaluated by a temperature cycling test.

<Glass Transition Temperature (Tg), Coefficient of Thermal Expansion ($\alpha_1$, $\alpha_2$)>

Using the obtained resin plates, Tg and coefficients of thermal expansion ($\alpha_1$, $\alpha_2$) were determined according to "Measuring method of coefficient of thermal expansion" described above. Specifically, a square piece was cut off in a size of 5 mm×5 mm from the resin plate obtained and measured by TMA, and in a temperature-deformation curve obtained, a tangent line was drawn at a linear portion straddling the glass transition temperature and a point of intersection of the tangent line was taken as a glass transition temperature. And, an average coefficient of thermal expansion in the range of from Tg−80° C. to Tg−30° C. was taken as $\alpha_1$ and an average coefficient of thermal expansion in the range of from Tg+30° C. to Tg+80° C. was taken as $\alpha_2$. A measuring apparatus and measuring conditions are as is described above.

Radius of Inertia of Inorganic Microfine Particle.

Using the obtained resin plates, the particle size distribution of inorganic microfine particles was determined according to the procedure of "Measurement of radius of inertia of inorganic microfine particle" described above. Furthermore, in Table 1, the particle size distributions in particle size range of from 0.1 to 10.0 nm, from 10.0 to 100 nm, and 100 nm or more are shown in % by volume.

<Temperature Cycling Test>

A test piece was cut off in a size of 5 cm square from each of the resin plates obtained and subjected to 1000 cycles of temperature cycling from −60° C. (holding time 10 minutes) to 150° C. (holding time 10 minutes), and then the appearance of the resin rest piece was observed with an optical microscope and evaluated as follows.

poor: Blister(s), peeling(s) and crack(s) are present
good: Blister(s) are present
excellent: Blister(s), peeling(s) and crack(s) are not present at all

TABLE 3

| | N(%) | Si(%) | Comparative Example 7A | Comparative Example 8A | Example 9 | Example 10 | Comparative Example 5 | Comparative Example 6 | Comparative Example 7 | Comparative Example 8 |
|---|---|---|---|---|---|---|---|---|---|---|
| Epoxy resin A(ESCN-220HH) | 0 | 0 | 57.59 | 52.76 | — | — | 59.95 | 59.78 | — | — |
| Epoxy resin composition B | 0 | 30.6 | — | — | 64.63 | — | — | — | 70.87 | 100 |
| Epoxy resin composition C | 0 | 29.8 | — | — | — | 60.91 | — | — | — | — |
| Polyhydric phenol resin composition A | 5.98 | 29.6 | 42.41 | — | — | — | — | — | — | — |
| Polyhydric phenol resin composition B | 6.02 | 29.2 | — | 47.24 | 35.37 | 39.09 | — | — | — | — |
| Polyhydric phenol resin composition C | 0 | 29.2 | — | — | — | — | 40.05 | — | — | — |
| Polyhydric phenol resin composition D | 0 | 29.5 | — | — | — | — | — | 40.22 | 29.13 | — |
| Triphenyl phosphine | | | 1.0 | 1.0 | 1.0 | 1.0 | 1.0 | 1.0 | 1.0 | 2.0 |
| Cured Formulation | Inorganic microfine particle content (%) | | 12.55 | 13.79 | 30.1 | 29.57 | 11.69 | 11.86 | 30.28 | 30.6 |
| | Nitrogen content | | 2.54 | 2.84 | 2.13 | 2.35 | 0 | 0 | 0 | 0 |

TABLE 3-continued

|  |  | N(%) | Si(%) | Comparative Example 7A | Comparative Example 8A | Example 9 | Example 10 | Comparative Example 5 | Comparative Example 6 | Comparative Example 7 | Comparative Example 8 |
|---|---|---|---|---|---|---|---|---|---|---|---|
| Physical properties of cured formulation | | Tg(° C.) | | 149 | 145 | 136 | 133 | 151 | 147 | 135 | 155 |
| | Coefficient of thermal expansion | $\alpha_1$(ppm/° C.) | | 54 | 49 | 51 | 50 | 60 | 53 | 62 | 75 |
| | | $\alpha_2$(ppm/° C.) | | 105 | 94 | 86 | 83 | 135 | 147 | 137 | 167 |
| | Coefficient of thermal expansion ratio ($\alpha_2/\alpha_1$) | | | 1.94 | 1.92 | 1.69 | 1.66 | 2.25 | 2.77 | 2.21 | 2.23 |
| | Temperature cycling test | (−60° C. ⇔ 150° C.) 100 cycles | | Excellent | Excellent | Excellent | Excellent | Poor | Poor | Good | Poor |
| | Particle size distribution (nm) | 0.1-10.0 | | 30 | 44 | 55 | 59 | 0 | 22 | 66 | 68 |
| | | 10.0-100 | | 70 | 56 | 45 | 41 | 8 | 78 | 34 | 32 |
| | | 100- | | — | — | — | — | 92 | 0 | 0 | 0 |

EXAMPLES 11 AND 12 AND COMPARATIVE EXAMPLE 9

As an epoxy curing agent, 3.5 parts by weight of a thermal initiator for cationic polymerization (trade name "San-Aid SI-60L", content 32%, produced by SANSHIN CHEMICAL INDUSTRY Co., Ltd.) was added to 100 parts by weight of each of three resin composition A, the resin composition M, and a resin composition formed by mixing alicyclic epoxy resin (trade name "CEL 2021P" produced by DAICEL CHEMICAL IND., LTD.) and fused silica (trade name "SO-E2" produced by ADMATECHS Co., Ltd.) in a weight ratio of 70:30, and the mixture was mixed well and bubbles were eliminated through centrifuging. The defoamed resin composition was poured into a mold for casting and then this mold was placed in an inert oven under nitrogen atmosphere and treated at 120° C. for 1 hour and 180° C. for 7 hours, and then a shaped article was taken out from the mold, and a square piece was cut off in a size of 12 mm×12 mm with a diamond cutter to obtain a test piece. The following tests were conducted.

Solder Heat Resistance

Moisture treatment was applied to each test piece in the conditions of 130° C., 90% RH and 100 hours using a HAST chamber, and then the test piece was immersed in a solder bath of 260° C. for 30 seconds. 10 samples for each test piece were tested. After the sample was taken out of the solder bath, the presence or absence of crack was observed and the occurrence of crack was judged as being defective and defective fraction was checked.

Heat Cycle Test

Moisture treatment was applied to each test piece in the conditions of 130° C., 90% RH and 100 hours using a HAST chamber, and then 100 cycles of temperature cycling from 80° C. (holding time 5 hours) to −40° C. (holding time 5 hours) was performed. 10 samples for each test piece were tested. After the sample was taken out of a testing apparatus, the presence or absence of crack was observed and the occurrence of crack was judged as being defective and defective fraction was checked.

TABLE 4

|  |  | Example 11 | Example 12 | Comparative Example 9 |
|---|---|---|---|---|
| Mixing composition (parts by weight) | Resin composition A | 100 | — | — |
| | Resin composition M | — | 100 | — |
| | CEL2021P | — | — | 70 |
| | SO-E2 | — | — | 30 |
| | SI-606 | 3.5 | 3.5 | 3.5 |
| Solder heat resistance | Defective fraction | 1/10 | 0 | 5/10 |
| Heat cycle test | Defective fraction | 1/10 | 0 | 4/10 |
| Appearance of composition | | Uniform | Uniform | Precipitation of Inorganic component |

It becomes possible to reduce occurrence of a defective in absorbing moisture by large amounts by employing the resin composition as shown in Table 4. It is thought that comparing with the resin composition of Comparative Example 9, in the resin composition, the precipitation of inorganic components was not observed even after centrifugal treatment and in addition to this an effect of stress relaxation by the charge of inorganic components became more remarkable by reducing particle sizes of inorganic components more.

A flame retardant resin composition and a curable flame retardant resin composition were prepared, and physical properties thereof were evaluated by the following evaluation method.

[Thermally Softening Temperature]

Thermally softening temperature was measured according to JIS K 6910.

[Phenol Hydroxyl Group Equivalent]

Phenol hydroxyl group equivalent was measured according to JIS K 0070.

[Inorganic Microfine Particle Content]

A flame retardant resin composition measured was put into a crucible and burned in a furnace under air circulation at 800° C. for 1 hour, and an obtained residue was measured for weight as inorganic microfine particles.

[Integrated Intensity Ratio of Inorganic Microfine Particle]

A flame retardant resin composition was put into a container containing tetrahydrofuran, and stirred with a shaker for 2 hours. An obtained milky solution was subjected to centrifugal separation, and then kept standing for 1 day. Then, a supernatant liquid was removed, and tetrahydrofuran was again put into the slurry remained and stirred for 2 hours. A slurry obtained by repeating the operation 3 times was filtered with a membrane filter having a pore size of 0.025 μm to isolate inorganic microfine particles. The inorganic microfine particles were measured for $^{29}$Si-DD/MAS-NMR spectrum under the following conditions.

Condition example of $^{29}$Si-DD/MAS-NMR measurement

Nuclear magnetic resonance apparatus: "AVANCE 400" manufactured by BRUKER Corp.

Probe used: 4 mm MAS probe

Measurement nucleus: $^{29}$Si (observation nucleus resonance frequency: 79.487 MHz)

Measurement mode: The DD-MAS (dipole decoupling/magic angle spinning) method

Irradiation pulse angle: 10-60 degree pulse

Pulse repeat time: 60 seconds or more

Number of scans: 200-10000 times

Spinning rate: 3-15 kHz

Observation temperature: 300 K

External reference material: sodium 3-(trimethylsilyl) propane-1-sodium sulfonate: chemical shift value of 1.534 ppm Based on a spectrum obtained, peak resolution of the peak appearing in −140 to −40 ppm was performed. Then, the above-mentioned $Q^4$ silica component, $Q^3$ silica component, $T^3$ silica component, and $T^2$ silica component were each extracted, and each peak area of $A_{Q3}$, $A_{Q4}$, $A_{T3}$, and $A_{T2}$ was determined and $A_{Q3}/A_{Q4}$, $A_{T2}/A_{T3}$, $(A_{T2}+A_{T3})/(A_{Q3}+A_{Q4})$ were calculated.

[Dispersibility of Inorganic Microfine Particle: Existence of Flocculated Substance]

A curable flame retardant resin composition was applied to copper foil so as to have a thickness of 20 μm and cured, and existence of flocculated substance and transparent degree were observed with a substance microscope and a scanning electron microscope (SEM).

[Tg and Coefficient of Thermal Expansion]

Tg, coefficient of thermal expansion (α 1) in a glass range, and coefficient of thermal expansion (α 2) in a rubber range were measured by the TMA method. The measurement by the TMA method was carried out with "TMA 50" by Shimadzu Corp. at compress mode. Measurement conditions were load: 0.1 g, heating rate: 5° C./min, and measurement temperature: 20 to 200° C.

[Flame Retardancy]

Flame retardancy was evaluated according to the UL-94 examining method.

EXAMPLE 13

Into a four-necked flask equipped with a gas inlet, a Dean-Stark trap, and a stirrer, 513.9 parts of p-xylylene glycol dimethyl ether, 831.3 parts of phenol, and 8.41 parts of p-toluenesulfonic acid were charged and temperature was raised in a nitrogen stream. The mixture was heated to 150° C. and kept at this temperature for 6 hours while collecting methanol with a trap because the production of methanol began at about 115° C. Since the production of methanol was completed at the point where 192 g of methanol was collected, the remaining solution was cooled to 20° C., and 340 parts of methanol was added.

Then, two polytetrafluoroethylene (PTFE) tubes were installed in the upper part of this flask, and a mixed solution of 326.8 parts of tetramethoxy silane and 42.8 parts of 3-aminopropyl trimethoxy silane, and 104.8 parts of water were injected from the separate tubes into the flask, while keeping an inertial temperature of the flask at 20° C. The addition was carried out over 4 hours using a roller pump, and then the remaining solution was kept for 4 hours at 60° C. Then, the solution temperature was again raised in a nitrogen stream, and while collecting unreacted water and methanol, which began to distil off at about 80° C., by a trap, the stirring was continued to 180° C. On completion of the reaction, unreacted phenol was distilled off under reduced pressure, and then the remaining solution was cooled to obtain a flame retardant resin composition F having a translucent white solid matter. The yield of the flame retardant resin composition F was 853 parts, and the composition F obtained had a thermally softening temperature of 69° C., a phenol hydroxyl group equivalent of 192 g/mol, and an inorganic microfine particle content of 22.3%. The composition of silica particles in this flame retardant resin composition F is shown in Table 5.

EXAMPLE 14

Into a four-necked flask equipped with a gas inlet, a Dean-Stark trap, and a stirrer, 172.2 parts of benzoguanamine and 164.3 parts of a 37% formaldehyde aqueous solution (formalin) were charged and the solution was stirred at 70° C. in a nitrogen stream. The solution was a milky solution, but after 14.5 parts of diethanolamines was added and the stirring was continued for 4 hours, the reaction solution became transparent, and therefore 432.9 parts of phenol was added and the solution temperature was again raised. The mixture was heated to 180° C. and kept at this temperature for 4 hours while collecting water with a trap because the production of water began at about 100° C. Since the production of water was completed at the point where 160 parts of water was collected, remaining solution was cooled to 10° C., and 103 parts of methanol was added to obtain triazine ring-containing polyhydric phenol.

Then, two PTFE tubes were installed in the flask as performed in Example 13, a mixed solution of 147.1 parts of tetramethoxy silane and 82.1 parts of phenyl trimethoxy silane, and 48.2 parts of water were injected from the separate tubes into the flask, while keeping an inertial temperature of the flask at 10° C. The addition was carried out over 4 hours using a roller pump, and the resulting solution was kept for 4 hours at 60° C. Then, temperature was again raised in a nitrogen stream, and while collecting unreacted water and methanol, which began to distil off at about 80° C., by a trap, the stirring was continued to 180° C. On completion of the reaction, unreacted phenol was distilled off under reduced pressure and then the remaining solution was cooled to obtain a flame retardant resin composition G having a translucent white solid matter. The yield of the flame retardant resin composition G was 481 parts. The composition G obtained had a thermally softening temperature of 125° C., a phenol hydroxy group equivalent of 237 g/mol, and an inorganic microfine particle content of 23.9%. The composition of silica particles in this flame retardant resin composition G is shown in Table 5.

EXAMPLE 15

Into a four-necked flask equipped with a gas inlet, a Dean-Stark trap, and a stirrer, 77.5 parts of melamine, 344.86 parts of benzoguanamine, and 336.4 parts of a 37% formaldehyde aqueous solution (formalin) were charged, and the solution was stirred at 70° C. in a nitrogen stream. The solution was a milky solution, but after 21.3 parts of diethanolamines was added and the stirring was continued for 4 hours, the reaction solution became transparent. Therefore, 500 parts of ethyleneglycol was added and the reaction solution was heated to 150° C. and the stirring was continued to collect 216 parts of water. After confirming that the production of water had stopped, 389.9 parts of phenol was added in a state of melting solution, and uniformly mixed, and the stirring was continued while raising the temperature to 180° C. Since the production of water was completed at the point where 81 parts of water was collected, the remaining solution was cooled to 40° C., and 140 parts of methanol was added.

Then, two PTFE tubes were installed in the flask as performed in Example 13, a mixed solution of 269.8 parts of tetramethoxy silane and 60.29 parts of methyl trimethoxysilane, and 94.8 parts of water were injected from the separate tubes into the flask, while keeping an inertial temperature of the flask at 20° C. The addition was carried out over 4 hours using a roller pump, and the mixture was kept for 4 hours at 60° C. Then, the temperature was again raised in a nitrogen stream, and while collecting unreacted water and methanol, which began to distil off at about 80° C., by a trap, the stirring was continued to 180° C. On completion of the reaction, unreacted phenol was distilled off under reduced pressure, and then the remaining solution was cooled to obtain a flame retardant resin composition F having a translucent white solid matter. The yield of the flame retardant resin composition H was 918 parts. The composition H obtained had a thermally softening temperature of 132° C., a phenol hydroxy group equivalent of 181 g/mol, and an inorganic microfine particle content of 22.1%. The composition of silica particles in this flame retardant resin composition H is shown in Table 5.

COMPARATIVE EXAMPLE 10

Into a four-necked flask equipped with a gas inlet, a Dean-Stark trap, and a stirrer, 302.6 parts of p-xylylene glycol, 687.0 parts of phenol, and 12.6 parts of p-toluenesulfonic acid were charged, and temperature was raised in a nitrogen stream. The mixture was heated to 150° C. and kept at this temperature for 6 hours while collecting water with a trap because the production of water began at about 115° C. Since the production of water was completed at the point where 79 parts of water was collected, 176 parts of methanol was added.

Then, two PTFE tubes were installed in the upper part of the flask, and 333.4 parts of tetramethoxysilane and 157.8 parts of water were injected from the separate tubes into the flask, while keeping an inertial temperature of the flask at 60° C. The addition was carried out over 4 hours using a roller pump, and then the mixture was kept for 4 hours at 60° C. Then, temperature was again raised in a nitrogen stream, and while collecting unreacted water and methanol, which began to distil off at about 80° C., by a trap, the stirring was continued to 180° C. On completion of the reaction, unreacted phenol was distilled off, and then the remaining solution was cooled to obtain a flame retardant resin composition I having a translucent white solid matter. The yield of the flame retardant resin composition I was 619 parts. The composition I obtained had a thermally softening temperature of 58° C., a phenol hydroxy group equivalent of 193 g/mol, and an inorganic microfine particle content of 20.7%. The composition of silica particles in this flame retardant resin composition I is shown in Table 5.

TABLE 5

| | Example 13 | Example 14 | Example 15 | Comparative Example 10 |
|---|---|---|---|---|
| Flame retardant resin composition No. | F | G | H | I |
| $A_{Q3}/A_{Q4}$ | 0.70 | 0.62 | 0.69 | 0.41 |
| $A_{T2}/A_{T3}$ | 0.14 | 0.42 | 0.28 | 0 |
| $(A_{T2}+A_{T3})/(A_{Q3}+A_{Q4})$ | 0.11 | 0.32 | 0.24 | 0 |

As shown in Table 5, the inorganic microfine particle contained in the flame retardant resin compositions F to H each has an integrated intensity ratio satisfying the requirement of the present invention, but the inorganic microfine particle of the flame retardant resin composition I has neither $T^3$ silica component nor $T^2$ silica component, and does not satisfy the requirement of the present invention.

Figure 2:
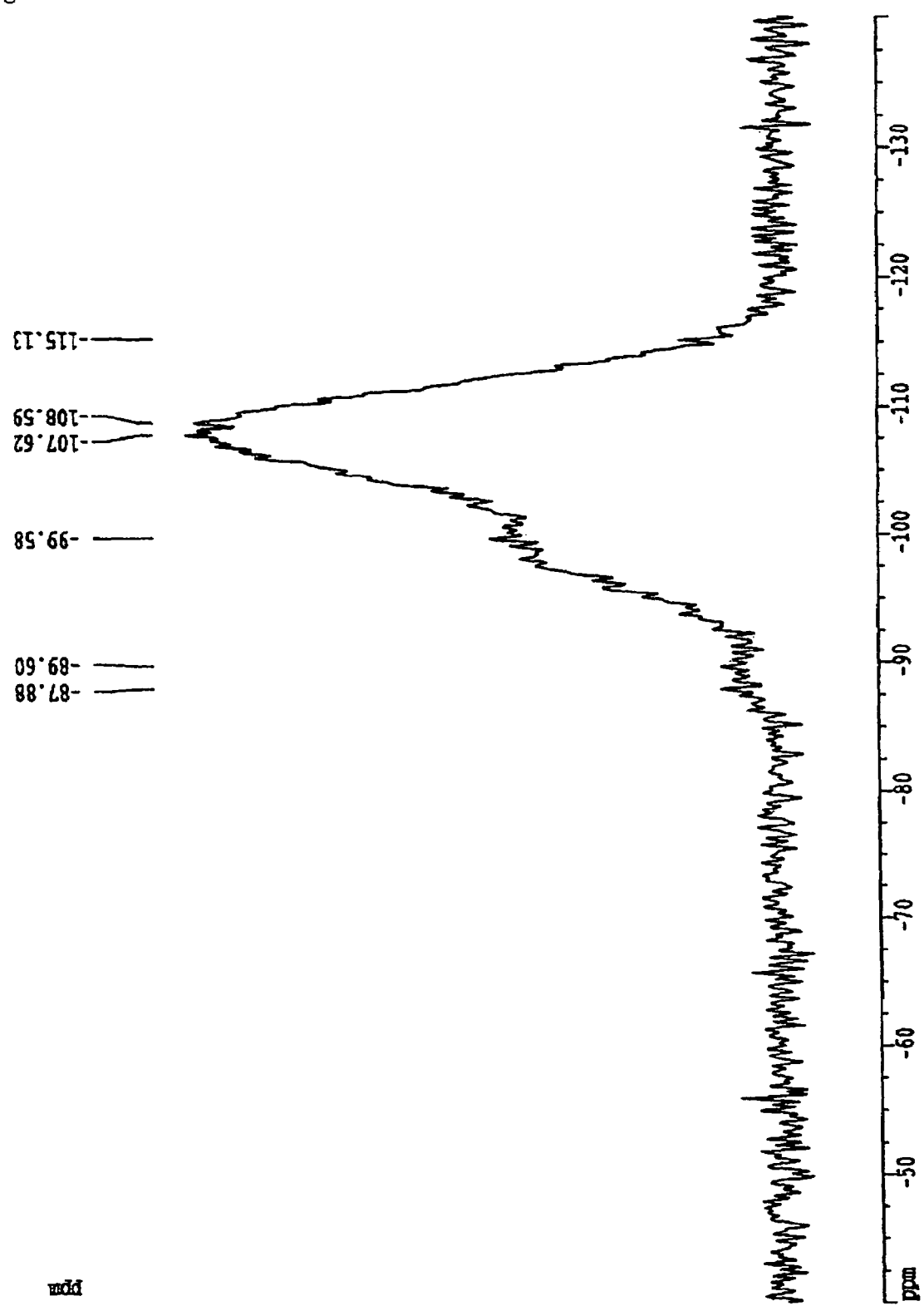
FIG. 2 shows a $^{29}$Si-DD/MAS-NMR spectrum of an inorganic microfine particle contained in a flame retardant resin composition I.

In addition, $^{29}$Si-DD/MAS-NMR spectrum of the inorganic microfine particle contained in the flame retardant resin composition F is shown in FIG. 1, and $^{29}$Si-DD/MAS-NMR spectrum of the inorganic microfine particle contained in the flame retardant resin composition I was shown in FIG. 2. In FIG. 1, the peak near −110 ppm represents existence of the $Q^4$ silica component, the peak near −102 ppm represents existence of the $Q^3$ silica component, the peak near −77 ppm represents existence of the $T^3$ silica component, and the peak near −70 ppm represents existence of the $T^2$ silica component. In FIG. 2, only the peak near −108 ppm is observed, but this peak represents existence of the $Q^4$ silica component, and no peak of other components is observed.

EXAMPLES 16 TO 18 AND COMPARATIVE EXAMPLE 11

(Manufacture and Evaluation of Curable Flame Retardant Resin Composition)

Flame retardant resin compositions F to I, orthocresol novolak type epoxy resin (tradename "YDCN-704": epoxy equivalent 205 g/mol: manufactured by Tohto Kasei Co., Ltd.), hardening accelerator triphenyl phosphine, and propylene glycol methyl ether acetate (trade name "PGM-AC"; manufactured by DAICEL CHEMICAL IND., LTD.) were subjected to a batch mixing at blending ratio shown in Table 6 at 110° C., and then mixed using 3-roll kneading machine (manufactured by INOUE MANUFACTURING CO., LTD.) at 25° C. to produce curable flame retardant resin compositions No. 1 to 4. Using these curable flame retardant resin compositions No. 1 to 4, dispersibilities of the inorganic microfine particle were evaluated by the above-mentioned method. The above-mentioned curable flame retardant resin compositions No. 1 to 4 were applied to copper foils so as to have a thickness of 40 μm expressed in terms of solid content after dryness, and heated in an oven at 80° C. for 30 minutes, and further at 100° C. for 30 minutes to prepare copper foils with resin. The copper foils with resin were laminated to be 8 layer, and the 8 layer copper foils with resins were cured for 2 hours under pressurization of 1×10$^{-4}$ Pa (10 kgf/cm$^2$) at 180° C. to obtain cured body samples. Tg and coefficient of thermal expansion of each sample were evaluated by the above-mentioned method. Each evaluation result is also shown in Table 6.

TABLE 6

| | Example 16 | Example 17 | Example 18 | Comparative Example 11 |
|---|---|---|---|---|
| Curable flame retardant resin composition No. | 1 | 2 | 3 | 4 |
| Epoxy resin (YDCN-704) | 36.1 | 32.4 | 37.2 | 36.1 |
| Flame retardant resin composition No. F | 33.9 | — | — | — |
| Flame retardant resin composition No. G | — | 37.6 | — | — |
| Flame retardant resin composition No. H | — | — | 32.8 | — |
| Flame retardant resin composition No. I | — | — | — | 33.9 |
| Triphenylphosphine | 0.7 | 0.7 | 0.7 | 0.7 |
| PGM-AC | 30.0 | 30.0 | 30.0 | 30.0 |
| Existence of flocculated substance | None | None | None | Existence |
| Appearance | Transparence | Transparence | Transparence | Milky |
| Physical properties of cured body | | | | |
| Tg (° C.) | 151 | 165 | 170 | 140 |
| α 1 (Tg or less) | 48 | 40 | 43 | 75 |
| α 2 (Tg or more) | 148 | 145 | 150 | 176 |

Table 6 shows that the cured bodies obtained from curable flame retardant resin compositions No. 1 to 3 of the present invention each has excellent dispersibility of the inorganic microfine particle, improved Tg, and lowered coefficient of thermal expansion. In the Comparative Example, in which the curable flame retardant resin composition No. 4 containing the inorganic microfine particle containing only the $Q^4$ silica component was used, the dispersibility is inferior, and the Tg and the coefficient of thermal expansion were also at lower level than that in Examples.

EXAMPLES 19 TO 21 AND COMPARATIVE EXAMPLE 12

Flame retardant resin compositions F to I, orthocresol novolak type epoxy resin (trade name "ESCN-195XL": epoxy equivalent 195 g/mol: manufactured by Sumitomo Chemical Co., Ltd), hardening accelerator triphenyl phosphine, high purity fused silica (trade name "PLR-6": manufactured by Tatsumori Co., Ltd.), carnauba wax (manufactured by CERARICA NODA Co., Ltd), and carbon black were subjected to melt mixing at blending ratio shown in Table 7 at 90° C. with 3-roll kneading machine (manufactured by INOUE MANUFACTURING CO., LTD.) to produce uniform mixtures (curable flame retardant resin compositions No. 5 to 8). These uniform mixtures (curable flame retardant resin compositions No. 5 to 8) were cured for 2 hours under the pressure of $1 \times 10^{-4}$ Pa (10 kgf/cm²) at 180° C. to obtain plate-shape cured body samples. The Tg, the coefficient of thermal expansion, and the flame retardancy of each sample were evaluated by the above-mentioned method. Each evaluation result is also shown in Table 7.

TABLE 7

| | Example 19 | Example 20 | Example 21 | Comparative Example 12 |
|---|---|---|---|---|
| Curable flame retardant resin composition No. | 5 | 6 | 7 | 8 |
| Epoxy resin (ESCN-195XL) | 15.1 | 13.5 | 15.6 | 15.1 |
| Flame retardant resin composition No. F | 14.9 | — | — | — |
| Flame retardant resin composition No. G | — | 16.5 | — | — |
| Flame retardant resin composition No. H | — | — | 14.4 | — |
| Flame retardant resin composition No. I | — | — | — | 14.9 |
| Triphenylphosphine | 0.3 | 0.3 | 0.3 | 0.3 |
| PLR-6 | 70.0 | 70.0 | 70.0 | 70.0 |
| Carnauba wax | 0.3 | 0.3 | 0.3 | 0.3 |
| Carbon black | 0.2 | 0.2 | 0.2 | 0.2 |
| Physical properties of cured body | | | | |
| Tg (° C.) | 148 | 162 | 167 | 137 |
| α 1 (Tg or less) | 13 | 12 | 14 | 20 |
| α 2 (Tg or more) | 53 | 52 | 55 | 65 |
| Flame retardance | V-0 | V-0 | V-0 | V-1 |

Table 7 shows that the cured bodies obtained from the curable flame retardant resin compositions No. 5 to 7 of the present invention each has improved Tg and lowered coefficient of thermal expansion, but in Comparative Example, in which the curable flame retardant resin composition No. 8 was used, the Tg and the coefficient of thermal expansion were also at inferior level than those in Examples.

Dispersing elements and cured bodies were prepared, and physical properties thereof were evaluated by the following evaluation method.

[Inertial Radius and Distribution State of Inorganic Microfine Particle in Dispersing Element]

The dispersing elements obtained in each example were pulverized using a mortar. The pulverized dispersing element passed through a screen of 300 mesh were charged into a capillary tube made of silica glass of 1 mmφ while giving vibration to produce measurement samples. A small-angle X-ray scattering measurement was performed using the X-ray diffractometer "RINT-2400", manufactured by Rigaku Corp. Incident X-ray was converted to monochrome through a multilayer mirror monochrometer and further passed through 3 slits, and then the ray was irradiated to the sample (the above-mentioned capillary) and scattered X-rays were detected with a scintillation counter installed at a camera length of 250 mm through a vacuum path. Detailed conditions were the same as those mentioned above, except that counting time was 5.0 seconds, and the particle size distributions (inertial radius) were also determined in the same manner as mentioned above. The thermally softening temperatures, the phenol hydroxyl group equivalents, and the inorganic microfine particle contents were also determined in the same manner as mentioned above.

EXAMPLE 22

Into a four-necked flask equipped with a gas inlet, a Dean-Stark trap, and a stirrer, 302.6 parts of p-xylylene glycol, 687.0 parts of phenol, and 12.6 parts of p-toluenesulfonic acid were charged and temperature was raised in a nitrogen air stream. The mixture was heated to 150° C. and kept at this temperature for 6 hours while collecting water with a trap because the production of water began at about 115° C. Since the production of water was completed at the point where 79 parts of water was collected, the remaining mixture was cooled to 20° C., and 176 parts of methanol was added. Polyhydric phenol consisting of p-xylylene glycol and phenol was obtained.

Then, two polytetrafluoroethylene (PTFE) tubes were prepared and one tube was inserted into the flask to the bottom level and the other tube was installed so that the exit of the tube was above the solution level. While keeping an inertial temperature of the flask at 20° C., 333.4 parts of tetramethoxy silane was injected from the upper tube of the flask, and 98.6 parts of water was injected from the bottom tube of the flask into the flask. The addition was carried out over 4 hours using a roller pump, and then the mixture was kept for 4 hours at 60° C. Then, temperature was again raised in a nitrogen stream, and while collecting unreacted water and methanol, which began to distill off at about 80° C., by a trap, the stirring was continued to 180° C. On completion of the reaction, unreacted phenol was distilled off under reduced pressure, and then the remaining mixture was cooled to obtain a dispersing element A having a translucent white solid matter. The yield of the dispersing element A was 662 parts. Physical properties of the obtained dispersing element A were evaluated and results are shown in Table 8.

EXAMPLE 23

Into a four-necked flask equipped with a gas inlet, a Dean-Stark trap, and a stirrer, 432.9 parts of phenol, 172.2 parts of benzoguanamine, and 164.3 parts of a 37% formaldehyde aqueous solution (formalin) were charged, and the solution was stirred in a nitrogen stream at 70° C. The solution was a milky solution, but after 14.5 parts of diethanolamines was added and the stirring was continued for 4 hours, the reaction solution became transparent, and therefore temperature of the reaction solution was again raised. The mixture was heated to 180° C. and kept at this temperature for 4 hours while collecting water which began to distill off at about 100° C. by a trap. Since the production of water was completed at the point where 160 parts of water was collected, the remaining mixture was cooled to 10° C., and 103 parts of methanol was added. Triazine ring-containing polyhydric phenol was obtained.

Then, two PTFE tubes were installed in the flask as performed in Example 22, so that the exit of one tube was above the solution level and the exit of the other tube was at the bottom level. While keeping an inertial temperature of the flask at 10° C., 210.1 parts of tetramethoxy silane was injected from the upper tube of the flask and 64.4 parts of water was injected from the bottom tube of the flask into the flask. The addition was carried out over 4 hours using a roller pump, and then the mixture was kept for 4 hours at 60° C. Then, temperature was again raised in a nitrogen stream, and while collecting unreacted water and methanol, which began to distill off at about 80° C., by a trap, the stirring was continued to 180° C. On completion of the reaction, unreacted phenol was distilled off under reduced pressure, and then the remaining mixture was cooled to obtain a dispersing element B having a translucent white solid matter. The yield of the dispersing element B was 493 parts. Physical properties of the dispersing element B obtained were evaluated as performed in Example 22. Results are shown in Table.

EXAMPLE 24

Triazine ring-containing polyhydric phenol was obtained in the completely same manner as in Example 23. Then, two PTFE tubes were installed in the flask as performed in Examples 22 and 23, so that the exit of one tube was above the solution level and the exit of the other tube was at the bottom level. While keeping an inertial temperature of the flask at 10° C., a mixture of 208.0 parts of tetramethoxy silane and 4.17 parts of di-s-butoxide ethylacetoacetate aluminum was injected from the upper tube of the flask and 64.4 parts of water was injected from the bottom tube of the flask into the flask. After this step, the same manner as in Example 23 was repeated to obtain a dispersing element C having a translucent white solid matter. The yield of the dispersing element C was 498 parts. Physical properties of the dispersing element C obtained were evaluated. Results are shown in Table 8.

EXAMPLE 25

Triazine ring-containing polyhydric phenol was obtained in the completely same manner as in Example 23. Then, two PTFE tubes were installed in the flask as performed in Examples 22 and 23, so that the exit of one tube was above the solution level and the exit of the other tube was at the bottom level. While keeping an inertial temperature of the flask at 10° C., a mixture of 208.0 parts of tetramethoxy silane and 3.03 parts of zinc acetate dihydrate was injected form the upper tube of the flask and 64.4 parts of water was injected from the bottom tube of the flask into the flask. After this step, the completely same manner as in Example 23 was repeated to obtain a dispersing element D having a translucent white solid matter. The yield of the dispersing element D was 490 parts. Physical properties of the dispersing element D obtained were evaluated as performed in Example 22. Results are shown in Table 8.

COMPARATIVE EXAMPLE 13

Into a four-necked flask equipped with a gas inlet, a Dean-Stark trap, and a stirrer, 302.6 parts of p-xylylene glycol, 687.0 parts of phenol, and 12.6 parts of p-toluenesulfonic acid were charged and temperature was raised in a nitrogen stream. The mixture was heated to 150° C. and kept at this temperature for 6 hours while collecting water with a trap because the production of water began at about 115° C. Since the production of water was completed at the point where 79 parts of water was collected, the remaining mixture was cooled to 60° C., and 176 parts of methanol was added. Polyhydric phenol consisting of p-xylylene glycol and phenol was obtained.

Then, two PTFE tubes were installed so that the exits of both tubes were above the solution level. While keeping an inertial temperature of the flask at 60° C., 333.4 parts of tetramethoxy silane and 157.8 parts of water were injected from the separate tubes of the upper tubes of the flask into the upper part of the solution level. The addition was carried out over 4 hours using a roller pump, and then the mixture was further kept for 4 hours at 60° C. Then, temperature was again raised in a nitrogen stream, and while collecting unreacted water and methanol, which began to distill off at about 80° C. by a trap, the stirring was continued to 180° C. On completion of the reaction, unreacted phenol was distilled off under reduced pressure, and then the remaining mixture was cooled to obtain a dispersing element E for comparison having a translucent white solid matter. The yield of the dispersing element E was 619 parts. Physical properties of the dispersing element E obtained were evaluated as performed in Example 22. Results are shown in Table 8.

COMPARATIVE EXAMPLE 14

Into a four-necked flask equipped with a gas inlet, a Dean-Stark trap, and a stirrer, 216.5 parts of phenol, 86.1 parts of benzoguanamine, and 82.2 parts of a 37% formaldehyde aqueous solution (formalin) were charged, and the solution was stirred at 70° C. in a nitrogen stream. The solution was a milky solution, but after 7.3 parts of diethanolamines was added and the stirring was continued for 4 hours, the reaction solution became transparent, and temperature of the reaction solution was again raised. The mixture was heated to 180° C. and kept at this temperature for 4 hours while collecting water which began to distill off at about 100° C. Since the production of water was completed at the point where 80 parts of water was collected, unreacted phenol was distilled off under reduced pressure to obtain 312 parts of nonvolatile component.

Then, another four-necked flask was prepared, and one PTFE tube was installed so that the exit of the tube was at the upper part of the four-necked flask. Into this flask were charged 188.9 parts of the above-mentioned nonvolatile component and 66 parts of methanol, and a mixed solution of 129.5 parts of tetramethoxy silane and 60 parts of methanol, and 55.7 parts of water from the above-mentioned tube into the flask while keeping an inertial temperature at 10° C. The addition was carried out over 4 hours using a roller pump. Immediately after the addition, the dispersing element obtained was applied to a normal glass plate, and the mixture solution applied was dried at 25° C. for 7 hours, and temperature was raised to 170° C. at 2° C./minute and maintained at 170° C. for 30 minute. Then, the mixture solution was cooled to obtain a dispersing element F having a translucent white solid matter. The yield of the dispersing element F was 230 parts. Physical properties of the dispersing element F obtained were evaluated as performed in Example 22. Results are shown in Table 8.

COMPARATIVE EXAMPLE 15

Metal silicon coarse grains roughly pulverized and having a grain size of 1 mm or less and polyethylene glycol as a binder were mixed at a weight ratio of 7:3, and the mixture was subjected to compression molding to have a shape of round bar having 50 mmΦ. This round bar was attached to a high frequency induction furnace as a consumptive anode electrode, and pressure was reduced to 1 pa or less using an oil sealed rotary vacuum pump turbo-molecular pump, and then an internal pressure was adjusted to 10 Pa, while supplying argon gas in the furnace (chamber). The electrodes were electrically connected by a direct current power source to generate plasma arc. By generating plasma arc, the silicon of the consumptive anode electrode was made into plasma and made to be oxidized with remaining oxygen in the furnace, and after that, the oxide was cooled. The above-mentioned cycle was properly repeated to obtain 60 parts of inorganic microfine particle.

Then, into a four-necked flask with a stirrer, 150 parts of triazine ring-containing polyhydric phenol obtained in Example 23 was charged, and melted by raising temperature to 180° C. Thereto added was 60 parts of the above-mentioned inorganic microfine particle, and the mixture was stirred for 2 hours under reduced pressure of 0.15 Pa or less (20 mmHg or less), and cooled to obtain a dispersing element G having a translucent white solid matter. The yield of the dispersing element G was 230 parts. Physical properties of the dispersing element G obtained were evaluated as performed in Example 22. Results are shown in Table 8.

TABLE 8

| | | Example 22 | Example 23 | Example 24 | Example 25 | Comparative Example 13 | Comparative Example 14 | Comparative Example 15 |
|---|---|---|---|---|---|---|---|---|
| Dispersing element No. | | A | B | C | D | E | F | G |
| Inorganic microfine particle content(%) | | 21.8 | 23.7 | 23.1 | 23.9 | 20.7 | 21.3 | 25.0 |
| Thermally softening point(° C.) | | 67 | 120 | 120 | 123 | 58 | 106 | 118 |
| Hydroxyl group equivalent (g/mol) | | 190 | 230 | 228 | 224 | 193 | 215 | 228 |
| Particle size distribution | Less than 10 nm of radius of inertia(%) | 31.9 | 46.4 | 44.3 | 31.9 | 2.0 | 81.7 | 28.4 |
| | 10 to 50 nm of radius of inertia(%) | 68.1 | 53.6 | 55.7 | 68.1 | 17.0 | 18.3 | 59.8 |
| | More than 50 nm of radius of inertia(%) | 0 | 0 | 0 | 0 | 81.0 | 0 | 11.8 |

In the dispersing elements A to D, the inorganic microfine particles having a radius of inertia of 50 nm or less disperse so as to satisfy the requirement of the present invention as shown in Table 8. On the other hand, in the dispersing elements E and G, particles having a radius of inertia of exceeding 50 nm existed, and in the dispersing element F, a great amount of superfine particles having a radius of inertia of 10 nm or less existed.

EXAMPLES 26 TO 29 AND COMPARATIVE EXAMPLES 16 to 18

(Manufacture and Evaluation of Dispersing Element for Manufacturing a Cured Body)

Dispersing elements A to F, liquid bisphenol type epoxy resin (trade name "YD-127": epoxy equivalent 185 g/mol: manufactured by Tohto Kasei Co., Ltd.), and hardening accelerator triphenyl phosphine were subjected to a batch mixing at blending ratio shown in Table 9 at 110° C. to obtain uniform mixtures (dispersing elements for manufacturing a cured body.) These mixtures were applied on copper foils so as to have a thickness of 20 μm and cured to produce samples for evaluation of dispersion state of the inorganic microfine particle with an electron microscope (SEM). Each of the above-mentioned dispersing element for manufacturing a cured body was charged into a mold for a plate, and cured for 2 hours under the pressure of $1\times10^{-4}$ Pa (10 kgf/cm$^2$) at 180° C. to obtain a plate-shaped cured body. Each valuation method is as follows. Each evaluation result is also shown in Table 9.

[Dispersibility of Inorganic Microfine Particle]

The above-mentioned samples for evaluating dispersion state were observed with the electron microscope, and when existence of flocculated substance or morphology having an island shape caused by localization of the inorganic microfine particles was observed, "poor" was given, and when neither flocculated substance nor morphology was obtained and the inorganic microfine particles were uniformly dispersed all over the observed face, "excellent" was given.

[Moisture Resistance]

The plate-shaped cured body samples were pressurized at 0.2 MPa and 121° C. under saturated steam with a pressure cooker for 100 hours, and the increase rates of weight (%) of the samples were determined.

[Glass Transition Temperature (Tg)]

The plate-shaped cured body samples were pressurized at 0.2 MPa and 121° C. under saturated steam for 100 hours in the same manner as in the above-mentioned evaluation for moisture resistance. Each sample was measured for Tg, coefficient of thermal expansion ($\alpha 1$) in a glass range, and coefficient of thermal expansion ($\alpha 2$) in a rubber range by the TMA (thermomechanical analysis) method. The measurement by the TMA method was carried out with "TMA 50" by Shimadzu Corp. at compress mode. Measurement conditions were load: 0.1 g, heating rate: 5° C./min, and measurement temperature: 20 to 200° C.

[Flame Retardancy]

The plate-shaped cured body samples were measured for UL-94 flame retardancy by the UL method.

the coefficient of expansion were also inferior to that in Examples. In Comparative Example 17, in which the dispersing element containing a great amount of superfine particles were used, the particles were too fine and therefore composite effect was not exhibited.

The present application claims priority under 35 U.S.C. §119 to Japanese Patent Application No. 2004-231254 filed Aug. 6, 2004, entitled "METHOD FOR PRODUCING RESIN COMPOSITION AND RESIN COMPOSITION" and Japanese Patent Application No. 2005-077734 filed Mar. 17, 2005, entitled "RESIN COMPOSITION, METHOD FOR PRODUCING THE SAME AND SHAPED BODY." The contents of these applications are incorporated herein by reference in their entirely.

The invention claimed is:

1. A resin composition comprising a compound having at least one of a glycidyl group and/or an epoxy group and an inorganic microfine particle,
   the inorganic microfine particle containing 50 to 99.9 mol % of Si and 50 to 0.1 mol % of one or more element selected from the group consisting of Zn, B, Al, Ga, In, Ge, Pb, P, Sb and Bi, as constituent metal components, and as a particle size distribution, the inorganic microfine particle containing 50 to 80% by volume of particles having a particle size of 0.5 nm or more and less than 10 nm and 50 to 20% by volume of particles having a particle size of 10 nm or more and less than 100 nm,
   a solid compound at 25° C. being used as the compound having at least one of a glycidyl group and/or an epoxy group in the case where the compound having at least

TABLE 9

|  |  | Example 26 | Example 27 | Example 28 | Example 29 | Comparative Example 16 | Comparative Example 17 | Comparative Example 18 |
|---|---|---|---|---|---|---|---|---|
| Dispersing element for producing cured body | Epoxy resin(YD-127) | 49.3 | 44.6 | 44.8 | 45.2 | 48.9 | 48.9 | 44.8 |
| | Dispersing element No. A | 50.7 | — | — | — | — | — | — |
| | Dispersing element No. B | — | 56.4 | — | — | — | — | — |
| | Dispersing element No. C | — | — | 55.2 | — | — | — | — |
| | Dispersing element No. D | — | — | — | 54.8 | — | — | — |
| | Dispersing element No. E | — | — | — | — | 51.1 | — | — |
| | Dispersing element No. F | — | — | — | — | — | 53.7 | — |
| | Dispersing element No. G | — | — | — | — | — | — | 55.2 |
| | Triphenyl phoasphine | 1.0 | 1.0 | 1.0 | 1.0 | 1.0 | 1.0 | 1.0 |
| Physical properties of cured body | Dispersibility of inorganic microfine particle | Excellent | Excellent | Excellent | Excellent | Poor | Poor | Poor |
| | Hygroscopicity (Increase rate of weight; %) | 0.91 | 0.72 | 0.95 | 0.87 | 1.35 | 1.21 | 1.88 |
| | Tg(° C.) | 112 | 115 | 117 | 117 | 110 | 90~120 | 113 |
| | Coefficient of linear expansion in a glass range (ppm) | 45 | 38 | 40 | 37 | 67 | 95 | 64 |
| | Coefficient of linear expansion in a rubber range (ppm) | 181 | 172 | 175 | 178 | 195 | 163 | 202 |
| | Flame retardance | V-0 | V-0 | V-0 | V-0 | V-1 | V-1 | V-1 |

Table 9 shows that each hygroscopic property is low in Examples 26 to 29, in which the dispersing element of the present invention was used, and confirms that the Tg is each improved, the coefficient of thermal expansion is each lowered, and the flame retardancy is each excellent. By controlling primary particle diameter of the inorganic microfine particle to 50 nm or less, and limiting a ratio of the superfine particle having a particle diameter of less than 10 nm, the thermal property and the moisture resistance have been improved. However, in Comparative Examples 16 and 18, in which the dispersing element containing the inorganic microfine particle with a large particle size was used, the moisture absorption resistance was inferior, and the Tg and one of a glycidyl group and/or an epoxy group contains an aromatic moiety, and a solid or liquid compound at 25° C. being used as the compound having at least one of a glycidyl group and/or an epoxy group in the case where the compound having at least one of a glycidyl group and/or an epoxy group does not contain an aromatic moiety.

2. A cured formulation obtainable by using the resin composition according to claim 1.

3. A semiconductor device or a printed wiring board composed of the cured formulation according to claim 2.

4. A material for encapsulating semiconductor comprising the resin composition according to claim 1.

5. A semiconductor component device obtainable by using the material for encapsulating semiconductor according to claim 4.

6. A method for producing a resin composition according to claim 1,
the method for producing comprising a step of hydrolyzing/condensing metal alkoxide and/or metal carboxylate by charging water in presence of the compound having at least one of a glycidyl group and/or an epoxy group,
and in the hydrolyzing/condensing step, an organic metal compound containing one or more element selected from the group consisting of Zn, B, Al, Ga, In, Ge, Pb, P, Sb and Bi being added,
and a compound being solid at 25° C. being used in the case of containing an aromatic moiety having at least one of a glycidyl group and/or an epoxy group and a compound being solid or liquid at 25° C. being used in the case of not containing an aromatic moiety.

7. A resin composition comprising three components, said three components being a phenolic compound, a compound having at least one of a glycidyl group and/or an epoxy group and an inorganic microfine particle,
the resin composition being a resin composition in which a ratio of an average coefficient of thermal expansion, $\alpha_2$, in a range of from Tg+30° C. to Tg+80° C. to an average coefficient of thermal expansion, $\alpha_1$ in a temperature range of from Tg−80° C. to Tg−30° C. ($\alpha_2/\alpha_1$) in a cured formulation of the resin composition is 1.9 or less; and wherein the inorganic microfine particle is a silicon oxide microfine particle and contains 50 to 100 mol % of Si and 50 to 0 mol % of at least one element selected from the group consisting of Zn, B, Al, Ga, In, Ge, Pb, P, Sb and Bi, as a constituent metal component, and as a particle size distribution, the inorganic microfine particle contains 25 to 65% by volume of particles having a particle size of 0.5 nm or more and less than 10 nm and 35 to 75% by volume of particles having a particle size of 10 nm or more and less than 100 nm.

8. The resin composition according to claim 7,
wherein the phenolic compound has a structure in which two or more aromatic skeletons respectively having at least one phenolic hydroxyl group, are bonded to each other with an organic skeleton having two or more carbon atoms there between.

9. The resin composition according to claim 8, wherein the organic skeleton has a triazine ring and/or an aromatic ring.

10. A method for producing a resin composition according to claim 7, the method comprising a step of mixing the phenolic compound containing the inorganic microfine particle and a compound containing at least one of the glycidyl group and/or an epoxy group containing the inorganic microfine particle.

11. A flame retardant resin composition comprising a polyhydric phenol and an inorganic microfine particle,
the inorganic microfine particle having a structure that satisfies $A_{Q3}/A_{Q4}$ of 0.01 to 1.0, $A_{T2}/A_{T3}$ of 0.01 to 1.0, and $(A_{T2}+A_{T3})/(_{Q3}+A_{Q4})$ of 0.01 to 2.0, when the inorganic microfine particle being measured for a peak appearing in the range of −120 to −40 ppm by $^{29}$Si-DD/MAS-NMR measurement, and a peak area derived from a structure having a 4 silicon atoms-bonding $SiO_4$ atomic group being defined as $A_{Q4}$, a peak area derived from a structure having a 3 silicon atoms-bonding $SiO_4$ atomic group as $A_{Q3}$, a peak area derived from a structure having a 3 silicon atoms-bonding R-SiO3 atomic group, R being an organic group not containing oxygen atom at a position adjacent to silicon atom as $A_{T3}$, a peak area derived from a structure having a 2 silicon atoms-bonding R–SiO$_3$ atomic group, R being an organic group not containing oxygen atom at a position adjacent to silicon atom as $A_{T2}$, and the peak area is calculated by subtracting an area below a base line from an area below a peak curve, and
wherein the inorganic microfine particle is obtained by carrying out a hydrolysis condensation reaction of 50 to 99% by weight of tetraalkoxysilane and 1 to 50% by weight of trialkoxysilane and/or dialkoxysilane, and
wherein the composition further comprises a compound having at least two glycidyl groups.

12. The flame retardant resin composition according to claim 11,
wherein the polyhydric phenol has a structure in which two or more aromatic skeletons respectively having at least one phenol hydroxyl group are bonded to each other with an organic group having two or more carbon atoms there between.

13. A material for encapsulating semiconductor comprising the flame retardant resin composition according to claim 11.

14. A semiconductor component device obtainable by using the material for encapsulating semiconductor according to claim 13.

15. An insulating material for wiring board comprising the flame retardant resin composition according to claim 11.

16. A substrate for electrical wiring obtainable by using the insulating material for wiring board according to claim 15.

17. A cured body obtainable by curing the flame retardant resin composition according to claim 11.

* * * * *

UNITED STATES PATENT AND TRADEMARK OFFICE
CERTIFICATE OF CORRECTION

PATENT NO.       : 7,723,407 B2
APPLICATION NO.  : 11/197587
DATED            : May 25, 2010
INVENTOR(S)      : Takuo Sugioka et al.

It is certified that error appears in the above-identified patent and that said Letters Patent is hereby corrected as shown below:

In the Claims:

Claim 11, column 74:
line 8, the "$(A_{T2}+A_{T3})/(_{Q3}+A_{Q4})$" should be "$(A_{T2}+A_{T3})/(A_{Q3}+A_{Q4})$";

Claim 11, column 74:
line 17, the "R being an organic group not containing oxygen atom at a position adjacent to silicon atom as $A_{T3}$," should be "(-R being an organic group not containing oxygen atom at a position adjacent to silicon atom-) as $A_{T3}$,";

Claim 11, column 74:
line 20, the "R being an organic group not containing oxygen atom at a position adjacent to silicon atom as $A_{T2}$," should be "(-R being an organic group not containing oxygen atom at a position adjacent to silicon atom-) as $A_{T2}$,".

Signed and Sealed this

Twelfth Day of October, 2010

David J. Kappos
*Director of the United States Patent and Trademark Office*